(12) United States Patent
Kimura et al.

(10) Patent No.: US 8,384,085 B2
(45) Date of Patent: Feb. 26, 2013

(54) SEMICONDUCTOR DEVICE AND METHOD FOR MANUFACTURING THE SAME

(75) Inventors: Hajime Kimura, Kanagawa (JP); Junichiro Sakata, Kanagawa (JP); Kohei Toyotaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 286 days.

(21) Appl. No.: 12/851,097

(22) Filed: Aug. 5, 2010

(65) Prior Publication Data

US 2011/0031499 A1 Feb. 10, 2011

(30) Foreign Application Priority Data

Aug. 7, 2009 (JP) ................................. 2009-184343

(51) Int. Cl.
  *H01L 29/04* (2006.01)
(52) U.S. Cl. .............. 257/59; 257/72; 257/43; 257/350; 257/E27.132; 257/E29.276
(58) Field of Classification Search .................... 257/59, 257/72, 43, 350, E27.132, E29.276
See application file for complete search history.

(56) References Cited

U.S. PATENT DOCUMENTS

| 5,162,901 | A | 11/1992 | Shimada et al. |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |

(Continued)

FOREIGN PATENT DOCUMENTS

| EP | 0 399 846 B1 | 3/1995 |
|---|---|---|
| EP | 1 443 130 A1 | 8/2004 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Tu-Tu Ho
(74) *Attorney, Agent, or Firm* — Fish & Richardson P.C.

(57) ABSTRACT

An object is to provide a semiconductor device in which characteristics of a driver circuit portion are improved while the aperture ratio of a pixel portion is increased. Alternatively, it is an object to provide a semiconductor device with low power consumption or to provide a semiconductor device in which the threshold voltage of a transistor can be controlled. The semiconductor device includes a substrate having an insulating surface, a pixel portion provided over the substrate, and at least some of driver circuits for driving the pixel portion. A transistor included in the pixel portion and a transistor included in the driver circuit are top-gate bottom-contact transistors. Electrodes and a semiconductor layer of the transistor in the pixel portion have light-transmitting properties. The resistance of electrodes in the driver circuit is lower than the electrodes included in the transistor in the pixel portion.

12 Claims, 31 Drawing Sheets

U.S. PATENT DOCUMENTS

| | | |
|---|---|---|
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,188,474 B2 * | 5/2012 | Hatano et al. .................. 257/59 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0146592 A1 | 6/2007 | Kimura |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0104723 A1 | 4/2009 | Hosoya et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0148970 A1 | 6/2009 | Hosoya et al. |
| 2009/0152506 A1 | 6/2009 | Umeda et al. |
| 2009/0152541 A1 | 6/2009 | Maekawa et al. |
| 2009/0227076 A1 | 9/2009 | Miyairi |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0102315 A1 | 4/2010 | Suzawa et al. |
| 2010/0109002 A1 | 5/2010 | Itagaki et al. |
| 2010/0155717 A1 | 6/2010 | Yano et al. |
| 2011/0031498 A1 | 2/2011 | Kimura et al. |

FOREIGN PATENT DOCUMENTS

| | | |
|---|---|---|
| EP | 1 737 044 A1 | 12/2006 |
| EP | 1 764 839 A2 | 3/2007 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-082221 A | 3/1990 |
| JP | 02-310536 A | 12/1990 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-081362 A | 3/2007 |
| JP | 2007-109918 A | 4/2007 |
| JP | 2007-115807 A | 5/2007 |
| JP | 2007-123700 A | 5/2007 |
| JP | 2008-243928 A | 10/2008 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09: SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08: SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Ikeda., T et al., "Full-Functional System Liquid Crystal Display Using CG-Silicon Technology," SID Digest '04: SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Jin, D et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel, YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu, or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4 and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06: Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTIA Flexible Microelectronics on Their Way to Business," SID Digest '07: SID International Symposium Digest of Technical Papers, 2007, vol. 38, pp. 1673-1676.

Mo, Y et al., "Amorphous Oxide TFT Backplanes for Large Size AMOLED Displays," IDW '08: Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09: SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS With a Novel Passivation Layer," SID Digest '09: SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4): a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED." AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09: Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3-In2O3-ZnO) TFT," SID Digest '08: SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K et al., "Ultra Low Power Consumption Technologies for Mobile TFT-LCDs," IEW '02: Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

"Acrylite GP (Acrylic Sheet), Acrylite FF (Acrylic Sheet) Light Transmission and Reflectance," Technical Data, pp. 1-8, Cyro Industries (2001).

* cited by examiner

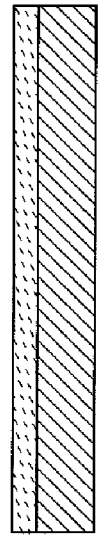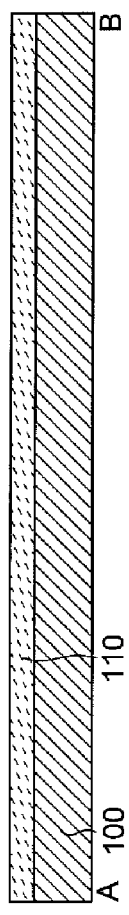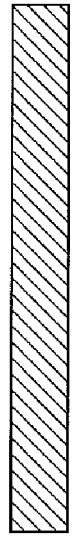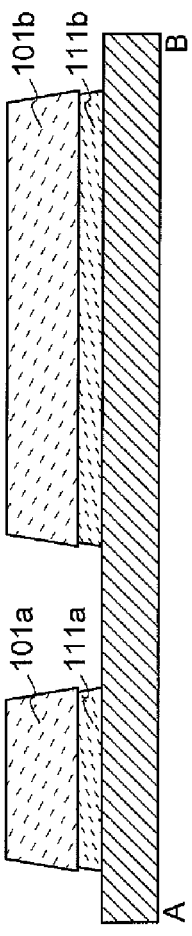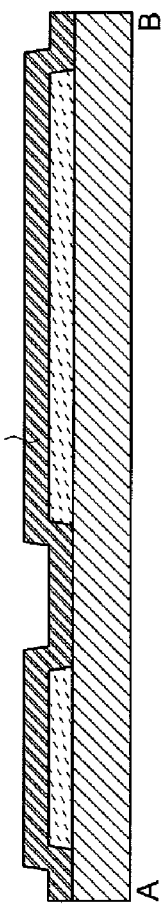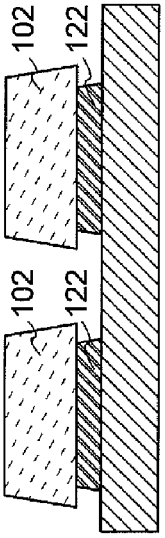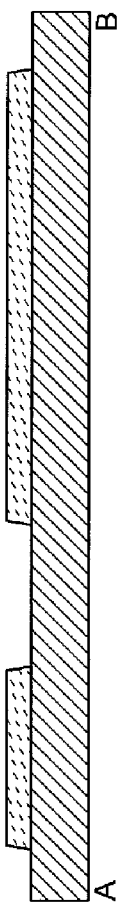

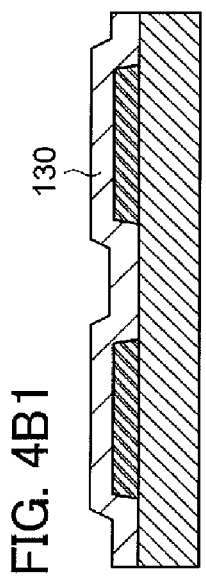
FIG. 4B1
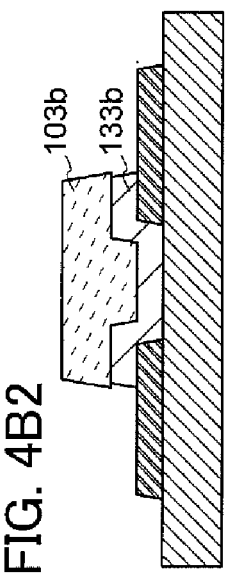
FIG. 4B2
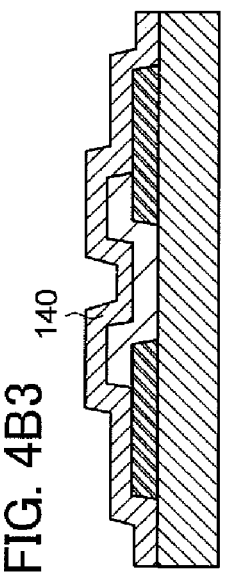
FIG. 4B3
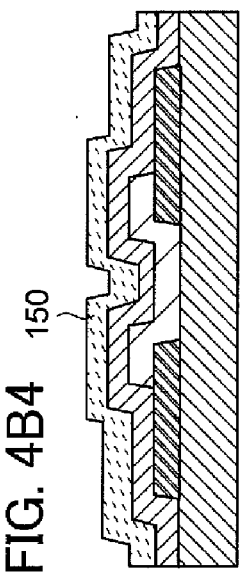
FIG. 4B4
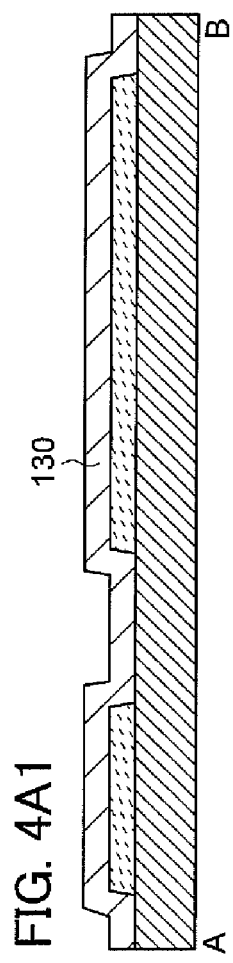
FIG. 4A1
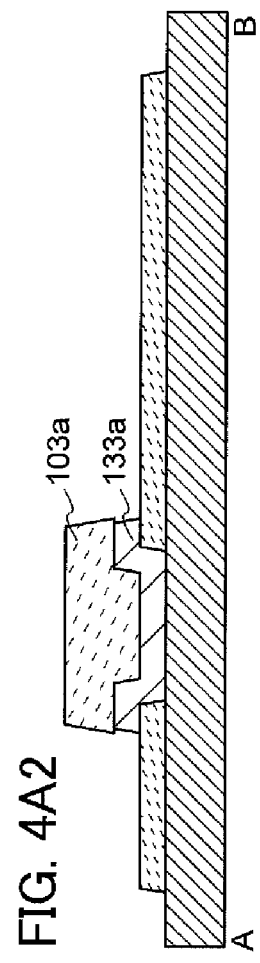
FIG. 4A2
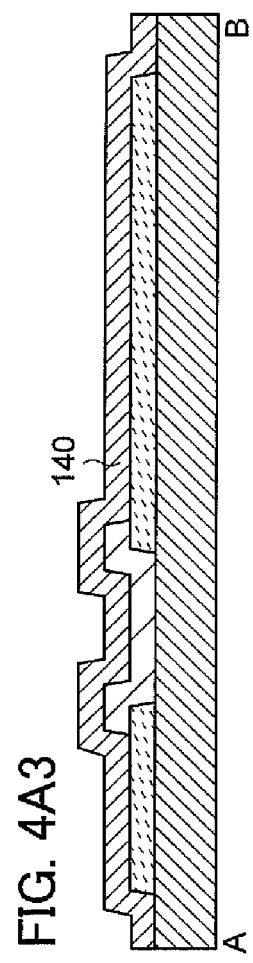
FIG. 4A3
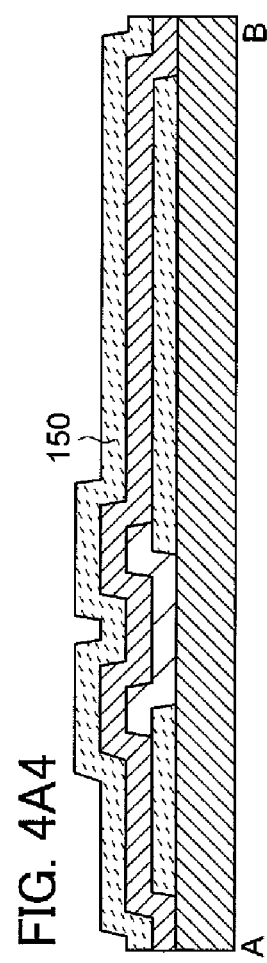
FIG. 4A4

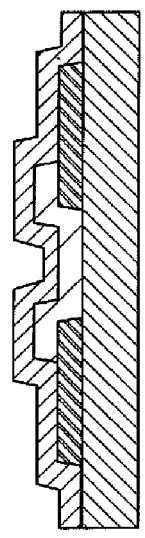
FIG. 5B1
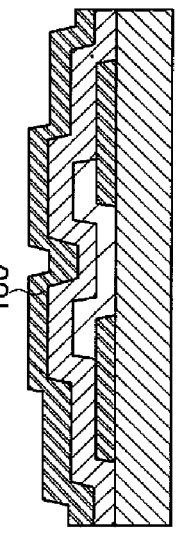
FIG. 5B2  160
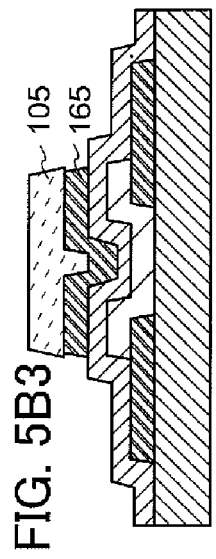
FIG. 5B3  105
165
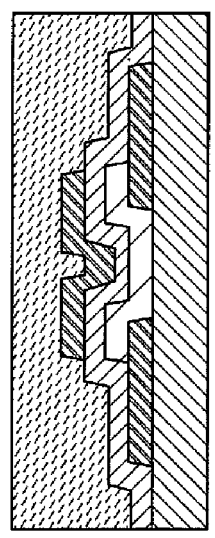
FIG. 5B4
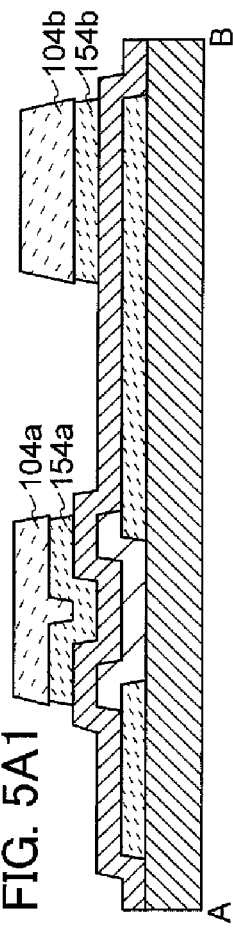
FIG. 5A1  104a  104b
154a  154b
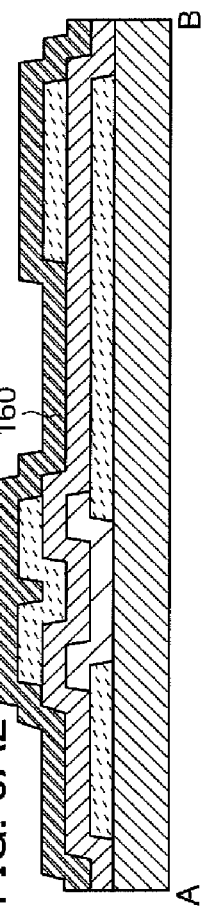
FIG. 5A2  160
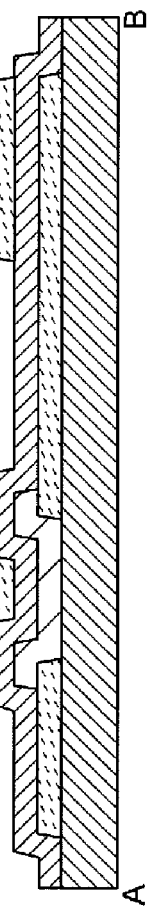
FIG. 5A3
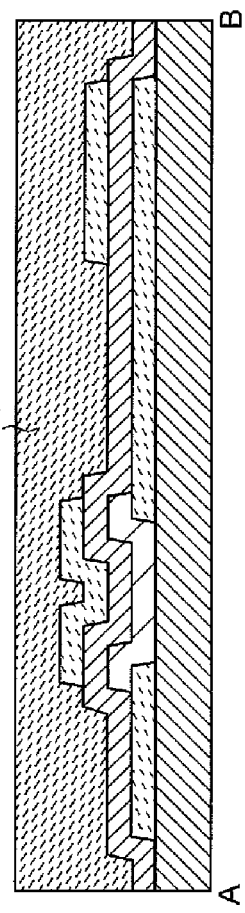
FIG. 5A4  170

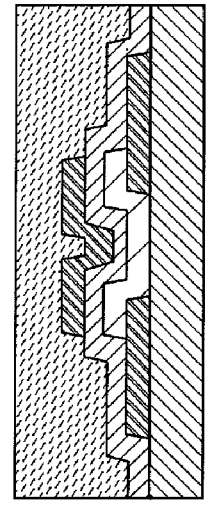
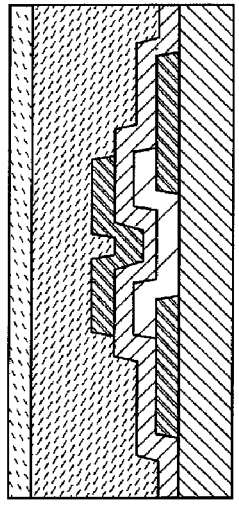
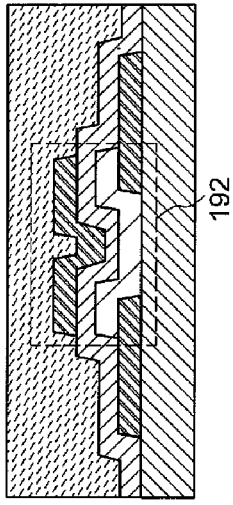
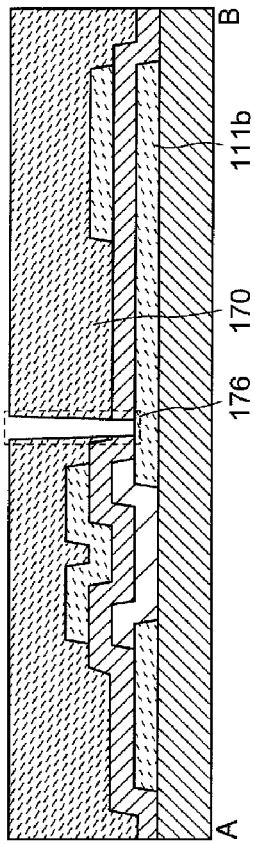
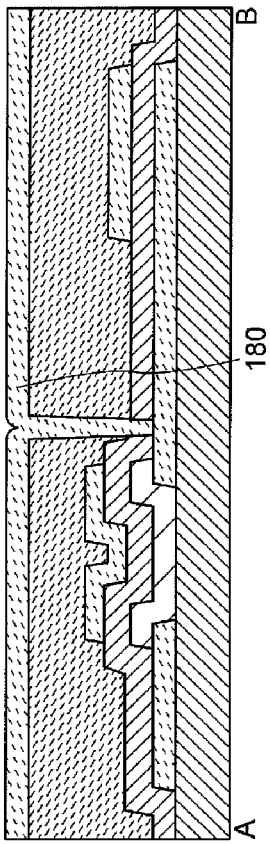
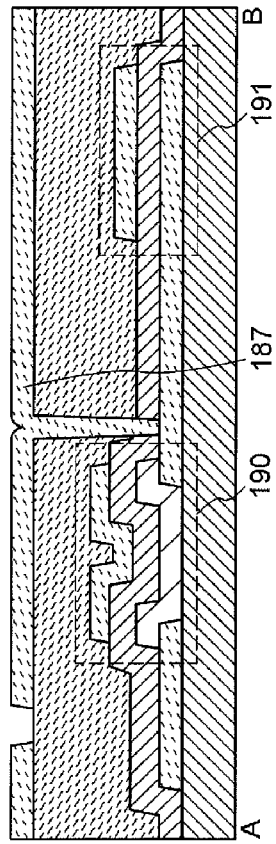

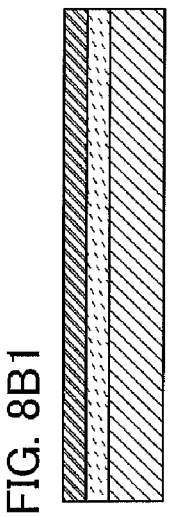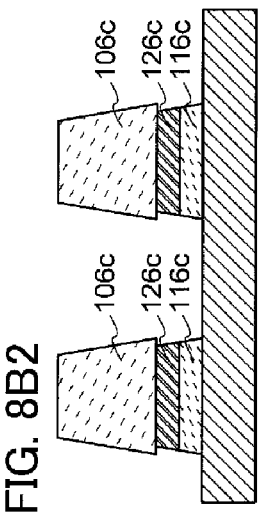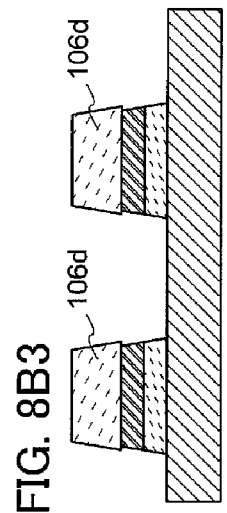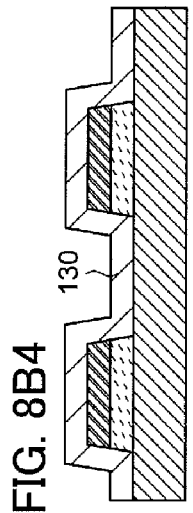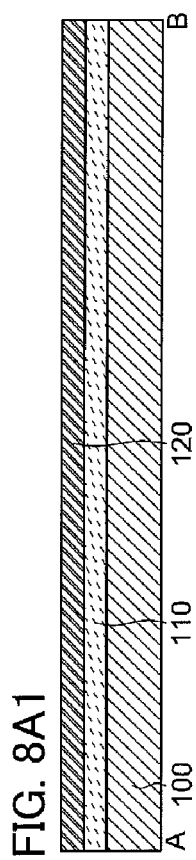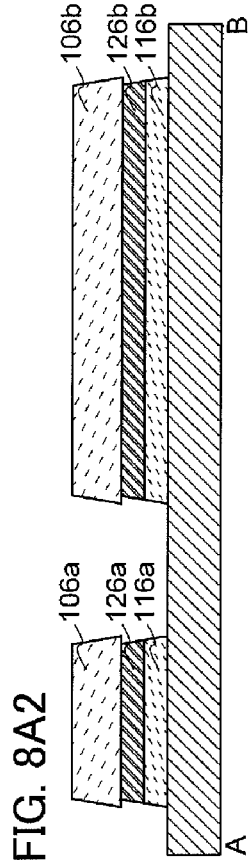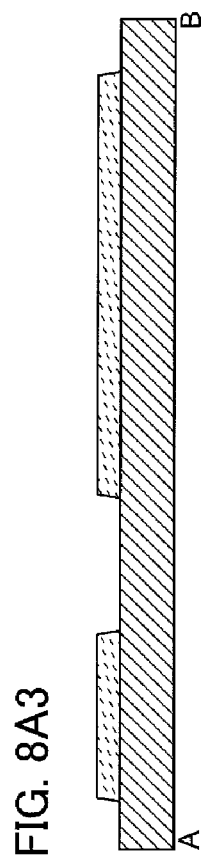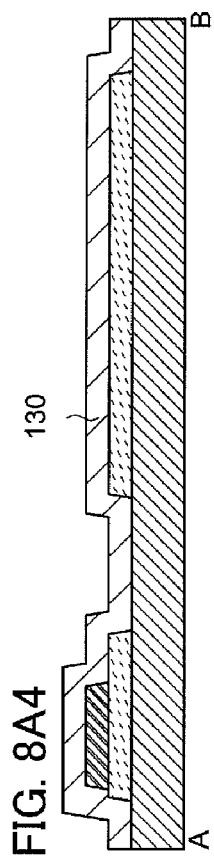

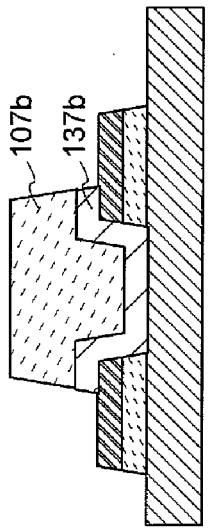
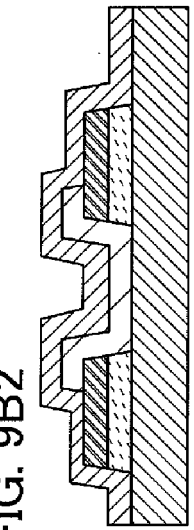
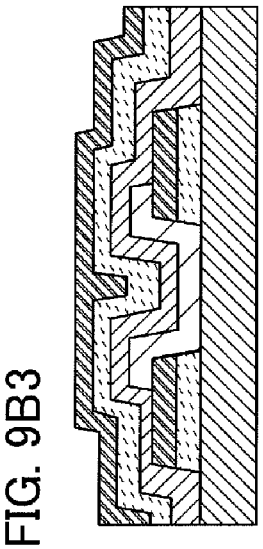
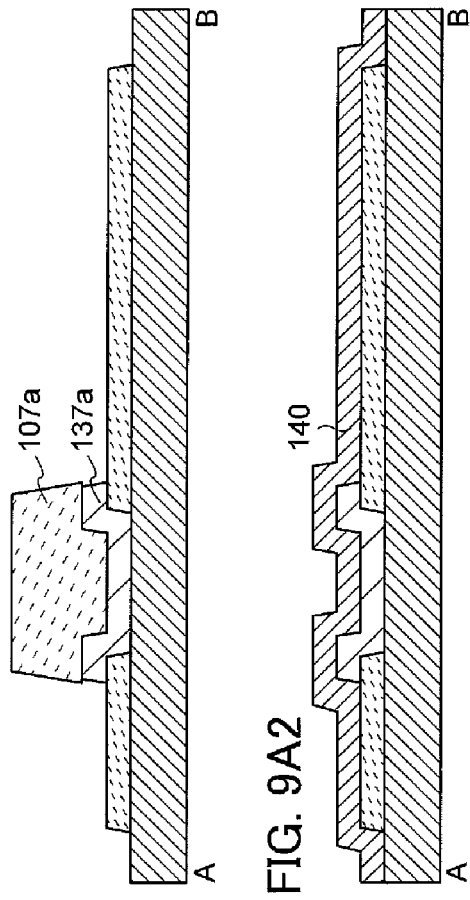
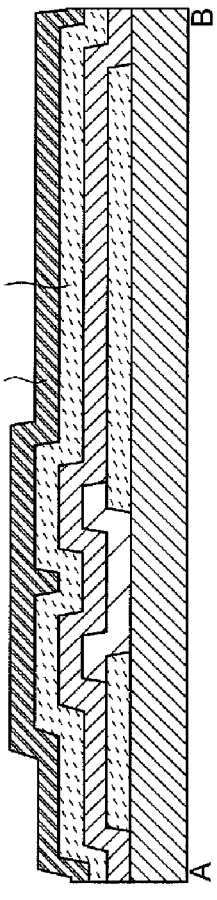

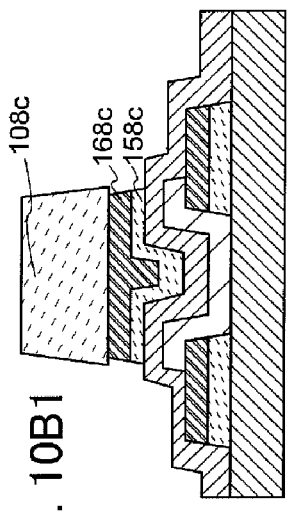
FIG. 10A1
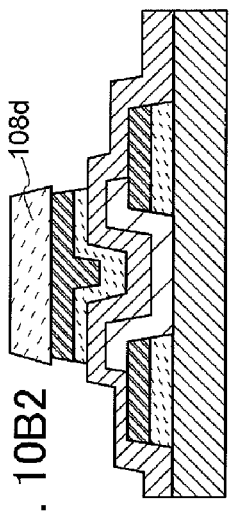
FIG. 10A2
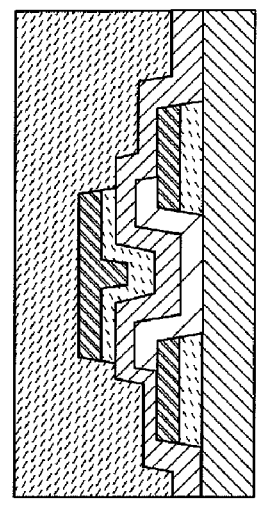
FIG. 10A3
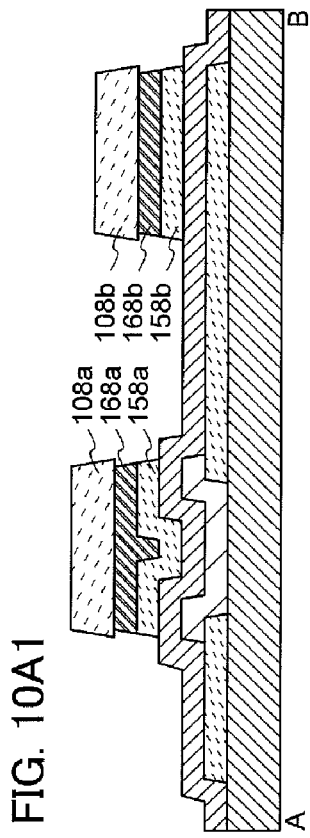
FIG. 10B1
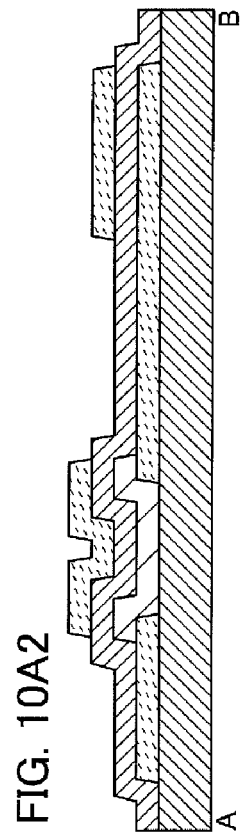
FIG. 10B2
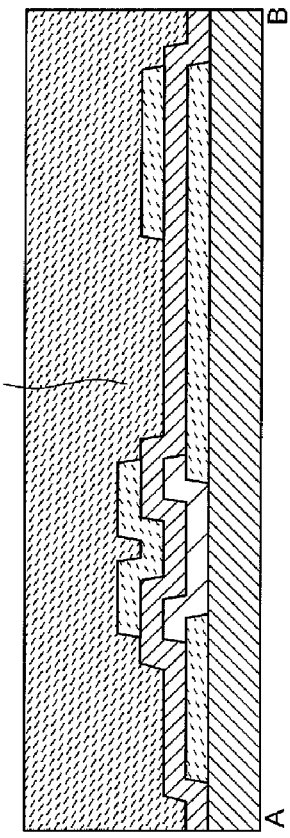
FIG. 10B3

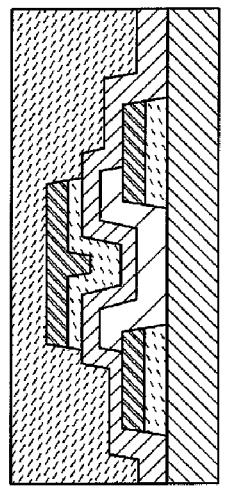
FIG. 11B1
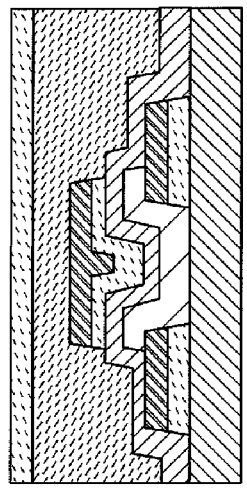
FIG. 11B2
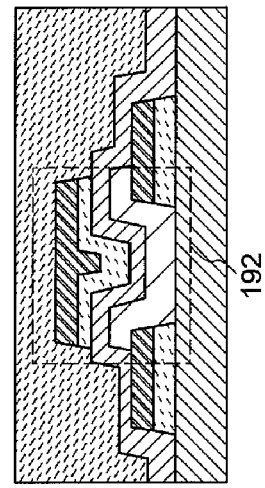
FIG. 11B3
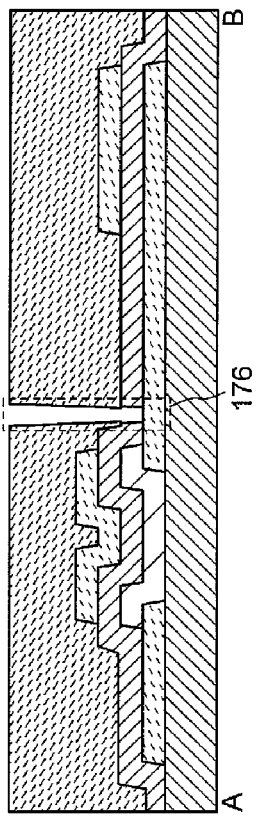
FIG. 11A1
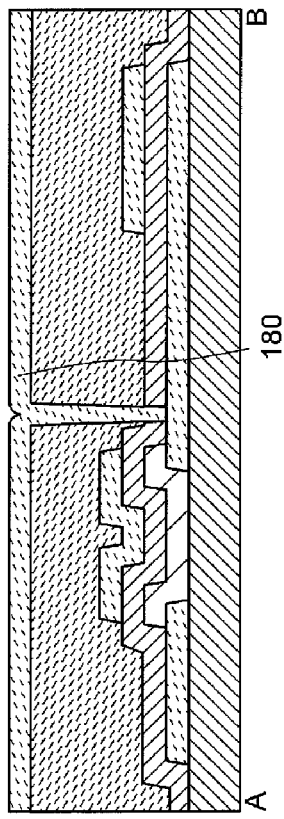
FIG. 11A2
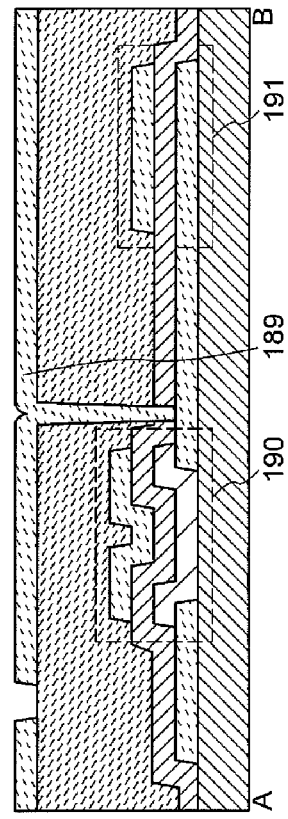
FIG. 11A3

FIG. 12A1
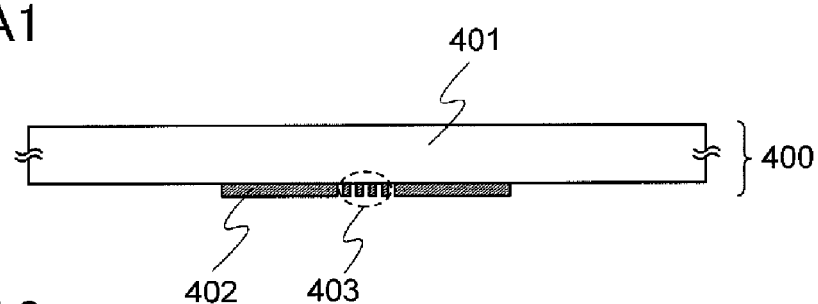
FIG. 12A2
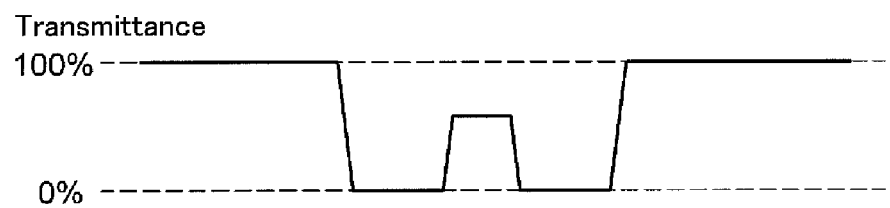
FIG. 12B1
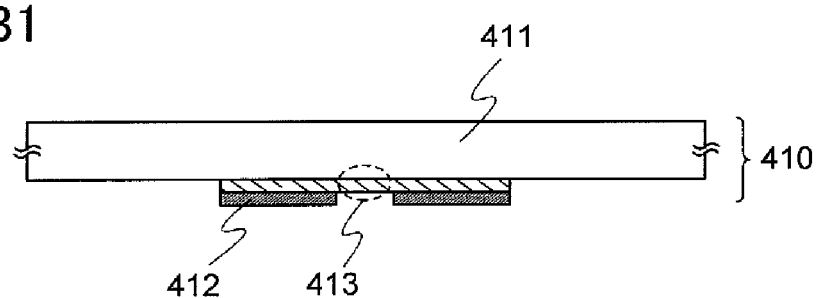
FIG. 12B2

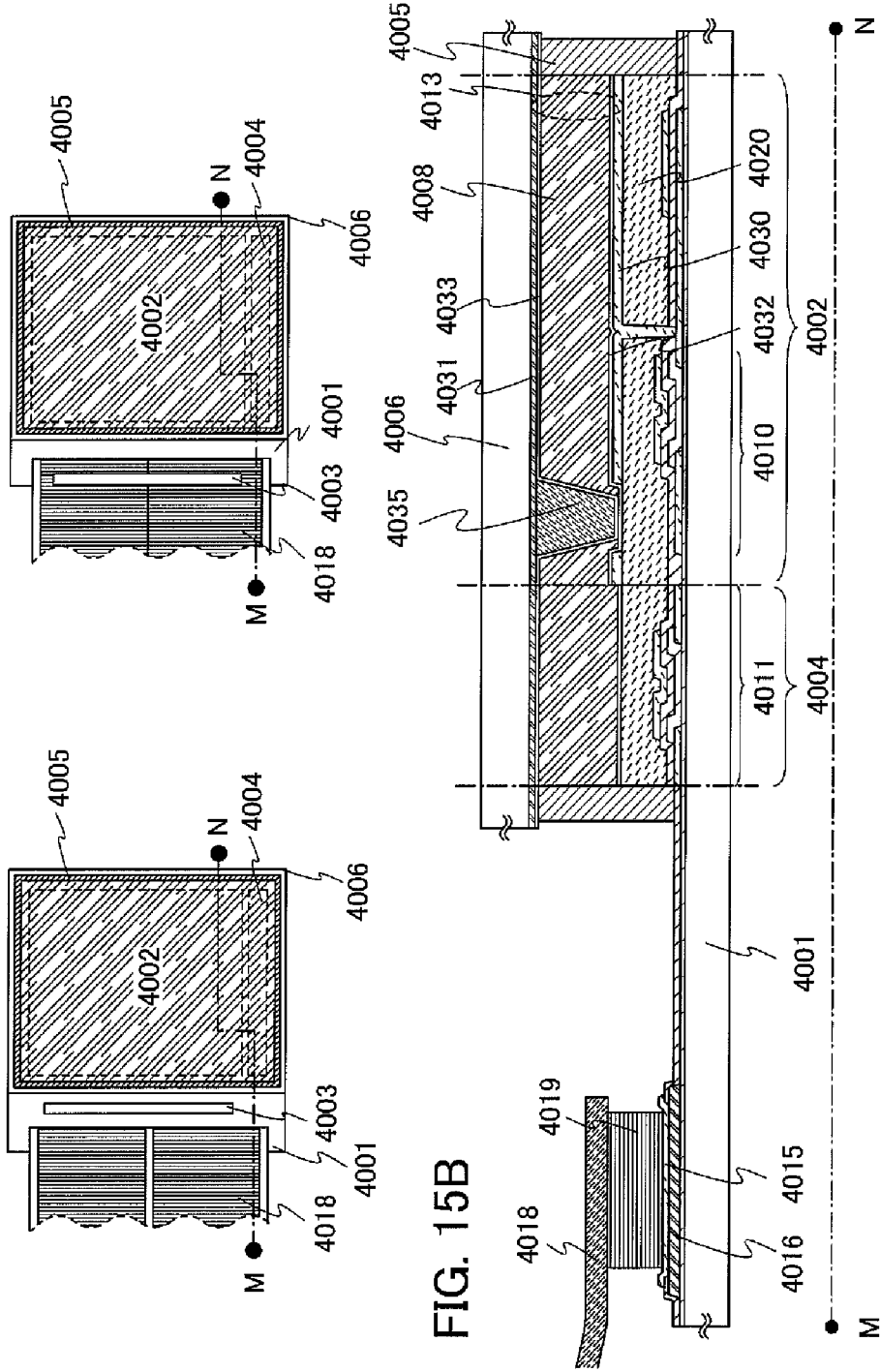

SEMICONDUCTOR DEVICE AND METHOD FOR MANUFACTURING THE SAME

BACKGROUND OF THE INVENTION

1. Field of the Invention

The technical field relates to a semiconductor device, a display device, a light-emitting device, and a method for manufacturing these devices. The technical field particularly relates to a semiconductor device including a thin film transistor (hereinafter also referred to as a TFT) using an oxide semiconductor.

2. Description of the Related Art

Thin film transistors (TFTs) in which a silicon layer of amorphous silicon or the like is used as a channel layer have been widely used as switching elements in display devices typified by liquid crystal display devices. Although thin film transistors using amorphous silicon have low field-effect mobility, they have an advantage that larger glass substrates can be used. In addition, there has been known a technique for forming a pixel portion and some of driver circuits on one substrate in an integrated manner in order to reduce manufacturing costs.

Moreover, attention has been recently drawn to a technique by which a thin film transistor is manufactured using a metal oxide with semiconductor properties and such a transistor is applied to an electronic device or an optical device. For example, it is known that some metal oxides such as tungsten oxide, tin oxide, indium oxide, and zinc oxide have semiconductor properties. A thin film transistor in which a light-transmitting semiconductor layer formed using such a metal oxide is used as a channel formation region is disclosed (e.g., see Patent Document 1).

Furthermore, a technique has been considered to increase the aperture ratio in such a manner that a channel layer of a transistor is formed using a light-transmitting oxide semiconductor layer and a gate electrode, a source electrode, and a drain electrode are formed using a light-transmitting conductive film (e.g., see Patent Document 2).

The increase in aperture ratio increases the light use efficiency, the reduction in power and size of display devices can be achieved. On the other hand, in terms of the increase in size of display devices and application of display devices to portable devices, a further reduction in power consumption as well as the increase in aperture ratio is required.

As a method for placing a metal auxiliary wiring for a light-transmitting electrode of an electro-optic element, there is known a method by which a metal auxiliary wiring and a light-transmitting electrode are placed to overlap with each other so that the auxiliary wiring is brought into conduction with the light-transmitting electrode above or below the light-transmitting electrode (e.g., see Patent Document 3).

A structure is known in which an additional capacitor electrode provided on an active matrix substrate is formed using a light-transmitting conductive film of ITO, $SnO_2$, or the like and an auxiliary wiring formed using a metal film is provided in contact with the additional capacitor electrode in order to reduce the electrical resistance of the additional capacitor electrode (e.g., see Patent Document 4).

It is known that in an electric-field transistor including an amorphous oxide semiconductor film, a light-transmitting electrode formed from indium tin oxide (ITO), indium zinc oxide, ZnO, $SnO_2$, or the like; a metal electrode formed from Al, Ag, Cr, Ni, Mo, Au, Ti, Ta, or the like; a metal electrode formed from an alloy containing any of the above elements; or the like can be used for a gate electrode, a source electrode, and a drain electrode, and two or more of such materials may be stacked to reduce the contact resistance or to increase the interface intensity (e.g., see Patent Document 5).

It is known that a metal such as indium (In), aluminum (Al), gold (Au), or silver (Ag); or an oxide material such as indium oxide ($In_2O_3$), tin oxide ($SnO_2$), zinc oxide (ZnO), cadmium oxide (CdO), indium cadmium oxide ($CdIn_2O_4$), cadmium tin oxide ($Cd_2SnO_4$), or zinc tin oxide ($Zn_2SnO_4$) can be used for a source electrode, a drain electrode, and a gate electrode of a transistor including an amorphous oxide semiconductor and an auxiliary capacitance electrode, and the materials for the gate electrode, the source electrode, and the drain electrode may be the same or different from each other (e.g., see Patent Documents 6 and 7).

REFERENCE

Patent Document 1: Japanese Published Patent Application No. 2004-103957
Patent Document 2: Japanese Published Patent Application No. 2007-081362
Patent Document 3: Japanese Published Patent Application No. H2-082221
Patent Document 4: Japanese Published Patent Application No. H2-310536
Patent Document 5: Japanese Published Patent Application No. 2008-243928
Patent Document 6: Japanese Published Patent Application No. 2007-109918
Patent Document 7: Japanese Published Patent Application No. 2007-115807

SUMMARY OF THE INVENTION

In view of the above, an object of one embodiment of the invention disclosed in this specification and the like is to provide a semiconductor device with high aperture ratio. Alternatively, an object of one embodiment of the invention disclosed is to provide a semiconductor device with low power consumption. An object of one embodiment of the invention disclosed is to provide a semiconductor device with low wiring resistance. An object of one embodiment of the invention disclosed is to provide a semiconductor device with high transmittance. Further alternatively, an object of one embodiment of the invention disclosed is to provide a semiconductor device with high layout flexibility. An object of one embodiment of the invention disclosed is to provide a semiconductor device with a low S value (subthreshold swing value). Alternatively, an object of one embodiment of the invention disclosed is to provide a semiconductor device in which the threshold voltage of a transistor can be controlled.

In one embodiment of the invention disclosed in this specification and the like, at least a transistor in a pixel portion is formed using a light-transmitting material. Further details are as follows.

One embodiment of the invention disclosed in this specification and the like is a semiconductor device including, over one substrate, a pixel portion including a first thin film transistor and a driver circuit portion including a second thin film transistor. The first thin film transistor includes, over the substrate, a first source electrode layer; a first drain electrode layer; an oxide semiconductor layer provided so as to be electrically connected to the first source electrode layer and the first drain electrode layer; a gate insulating layer provided so as to cover the oxide semiconductor layer; a first gate electrode layer provided over a region of the gate insulating layer, which overlaps with the oxide semiconductor layer; a protective insulating layer provided so as to cover the first gate electrode layer; and a pixel electrode layer over the protective insulating layer. The first source electrode layer, the first drain electrode layer, the oxide semiconductor layer, the gate insulating layer, the first gate electrode layer, the protective insulating layer, and the pixel electrode layer of the first thin film transistor have light-transmitting properties. A second gate electrode layer of the second thin film transistor is covered with the protective insulating layer. A material of a second source electrode layer, a second drain electrode layer, and the second gate electrode layer of the second thin film transistor is different from a material of the first source electrode layer, the first drain electrode layer, and the first gate electrode layer of the first thin film transistor, and is a conductive material with lower resistance than the first source electrode layer, the first drain electrode layer, and the first gate electrode layer of the first thin film transistor.

In the above, the second source electrode layer, the second drain electrode layer, and the second gate electrode layer of the second thin film transistor can be formed using a film containing an element selected from Al, Cr, Cu, Ta, Ti, Mo, and W as a main component or a stack including an alloy film containing any of these elements.

One embodiment of the invention disclosed in this specification and the like is a semiconductor device including, over one substrate, a pixel portion including a first thin film transistor and a driver circuit portion including a second thin film transistor. The first thin film transistor includes, over the substrate, a first source electrode layer; a first drain electrode layer; an oxide semiconductor layer provided so as to be electrically connected to the first source electrode layer and the first drain electrode layer; a gate insulating layer provided so as to cover the oxide semiconductor layer; a first gate electrode layer provided over a region of the gate insulating layer, which overlaps with the oxide semiconductor layer; a protective insulating layer provided so as to cover the first gate electrode layer; and a pixel electrode layer over the protective insulating layer. The first source electrode layer, the first drain electrode layer, the oxide semiconductor layer, the gate insulating layer, the first gate electrode layer, the protective insulating layer, and the pixel electrode layer of the first thin film transistor have light-transmitting properties. A second gate electrode layer of the second thin film transistor is covered with the protective insulating layer. A second source electrode layer, a second drain electrode layer, and the second gate electrode layer of the second thin film transistor are formed using a stack of a film containing the same material as the first source electrode layer, the first drain electrode layer, and the first gate electrode layer of the first thin film transistor; and a film containing a conductive material with lower resistance than the first source electrode layer, the first drain electrode layer, and the first gate electrode layer of the first thin film transistor.

In the above, the film containing the conductive material with lower resistance than the first source electrode layer, the first drain electrode layer, and the first gate electrode layer of the first thin film transistor can be formed using a film containing an element selected from Al, Cr, Cu, Ta, Ti, Mo, and W as a main component or a stack including an alloy film containing any of these elements.

In the above, the second thin film transistor can include, over the substrate, the second source electrode layer; the second drain electrode layer; the oxide semiconductor layer provided so as to be electrically connected to the second source electrode layer and the second drain electrode layer; the gate insulating layer provided so as to cover the oxide semiconductor layer; and the second gate electrode layer provided over a region of the gate insulating layer, which overlaps with the oxide semiconductor layer.

In the above, each of the first source electrode layer, the first drain electrode layer, the first gate electrode layer, and the pixel electrode layer of the first thin film transistor can be formed using a film formed using any of indium oxide, an alloy of indium oxide and tin oxide, an alloy of indium oxide and zinc oxide, and zinc oxide; or a stack including any of the films in combination.

In the above, a capacitor portion can be provided over the substrate, the capacitor portion can include a capacitor wiring and a capacitor electrode overlapping with the capacitor wiring, and the capacitor wiring and the capacitor electrode can have light-transmitting properties.

When a wiring, a transistor, a phototransistor, a photodiode, or the like is formed using a light-transmitting material, the aperture ratio can be increased. Moreover, a transistor in a driver circuit portion is preferably provided with a back gate. With the provision of the back gate, the threshold voltage can be controlled, so that the transistor can be a normally-off type. In that case, either of two gate electrode layers that sandwich a semiconductor layer may be used as the back gate. Note that the transistor in the driver circuit portion may be formed using a material without light-transmitting properties. In addition, a wiring in a pixel may be formed using a material without light-transmitting properties.

In the above, the semiconductor layer is preferably formed using an oxide semiconductor containing indium, gallium, and zinc. Further, each of the first source electrode, the first drain electrode, and the first gate electrode of the transistor in the pixel portion is preferably formed using any of indium tin oxide, indium tin oxide containing silicon oxide, organoindium, organotin, zinc oxide, titanium nitride, indium zinc oxide containing zinc oxide, a material obtained by adding gallium to zinc oxide, tin oxide, indium oxide containing tungsten oxide, indium zinc oxide containing tungsten oxide, indium oxide containing titanium oxide, and indium tin oxide containing titanium oxide.

Moreover, a layer formed by using the same layer as the semiconductor layer is preferably provided at an intersection of a gate wiring and a source wiring. Consequently, the capacitance generated because the gate wiring and the source wiring intersect each other can be reduced, so that distortion of signal waveforms can be suppressed. This is particularly effective in large semiconductor devices.

Note that an example of an oxide semiconductor that can be used in the invention disclosed in this specification and the like is an oxide semiconductor represented by $InMO_3(ZnO)_m$ (m>0). Here, M denotes one or more of metal elements selected from gallium (Ga), iron (Fe), nickel (Ni), manganese (Mn), and cobalt (Co). For example, the case where Ga is selected as M includes the case where the above-described metal element other than Ga is selected, such as a combination of Ga and Ni or a combination of Ga and Fe, as well as the case where only Ga is used. Moreover, in the above-described oxide semiconductor, a transition metal element such as Fe or Ni or an oxide of the transition metal is sometimes contained as an impurity element in addition to a metal element contained as M. In this specification and the like, among the oxide semiconductors, an oxide semiconductor containing at least gallium as M is referred to as an In—Ga—Zn—O-based oxide semiconductor and a thin film using the material is referred to as an In—Ga—Zn—O-based non-single-crystal film in some cases.

Further, in the above, by using a multi-tone mask, a light-transmitting region (a region with high transmittance) and a region without light-transmitting properties (a region with low transmittance) can be formed with one mask (reticle). Thus, the increase in the number of masks can be suppressed.

In each of the above-described embodiments of the present invention, a variety of switches can be used as a switch. For example, an electrical switch, a mechanical switch, or the like can be used as a switch. That is, there is no particular limitation on the kind of switch as long as the switch can control the flow of current. Examples of switches are a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit combining such elements. An example of a mechanical switch is a switch formed using a MEMS (micro electro mechanical system) technology, such as a digital micromirror device (DMD). Such a switch includes an electrode that can be moved mechanically, and operates to control electrical connection or non-electrical-connection with the movement of the electrode.

When a transistor is used as a switch in each of the above-described embodiments, the polarity (conductivity type) of the transistor is not particularly limited to a certain type because the transistor operates just as a switch. Note that a transistor of polarity with smaller off-state current is preferably used when the off-state current should be small. Examples of a transistor with smaller off-state current are a transistor provided with a high-resistance region and a transistor with a multi-gate structure.

In each of the above-described embodiments of the present invention, an n-channel transistor is preferably used as a switch when a potential of a source of the transistor used as the switch is close to a potential of a low potential side power supply (e.g., Vss, GND, or 0 V). On the other hand, a p-channel transistor is preferably used as the switch when the potential of the source of the transistor is close to a potential of a high potential side power supply (e.g., Vdd). This is because the absolute value of gate-source voltage can be increased when the potential of the source of the n-channel transistor is close to a potential of a low potential side power supply and when the potential of the source of the p-channel transistor is close to a potential of a high potential side power supply; thus, the transistor can more accurately operate as a switch. Alternatively, this is because decrease in output voltage does not often occur since the transistor does not often perform source follower operation.

In each of the above-described embodiments of the present invention, a CMOS switch may be employed as a switch by using both n-channel and p-channel transistors. By using a CMOS switch, the switch can more accurately operate as a switch because current can flow when either the p-channel transistor or the n-channel transistor is turned on. Thus, appropriate voltage can be output regardless of whether voltage of an input signal to the switch is high or low. Alternatively, the voltage amplitude value of a signal for turning on or off the switch can be made small, so that power consumption can be reduced.

Note that when a transistor is used as a switch, the switch includes an input terminal (one of a source and a drain), an output terminal (the other of the source and the drain), and a terminal for controlling conduction (a gate) in some cases. On the other hand, when a diode is used as a switch, the switch does not have a terminal for controlling electrical conduction in some cases. Therefore, when a diode is used as a switch, the number of wirings for controlling terminals can be reduced as compared to the case of using a transistor.

In the invention disclosed in this specification, transistors with a variety of structures can be used. That is, there is no limitation on the structure of transistors to be used.

In this specification, a semiconductor device corresponds to a device having a circuit including a semiconductor element (e.g., a transistor, a diode, or a thyristor). Note that a semiconductor device may correspond to all devices that can function by utilizing semiconductor properties or a device including a semiconductor material. In this specification, a display device corresponds to a device including a display element.

In this specification, a driving device corresponds to a device including a semiconductor element, an electric circuit, or an electronic circuit. Examples of the driving device are a transistor that controls input of a signal from a source signal line to a pixel (also referred to as a selection transistor, a switching transistor, or the like), a transistor that supplies voltage or current to a pixel electrode, and a transistor that supplies voltage or current to a light-emitting element. Moreover, examples of the driving device are a circuit that supplies a signal to a gate signal line (also referred to as a gate driver, a gate line driver circuit, or the like) and a circuit that supplies a signal to a source signal line (also referred to as a source driver, a source line driver circuit, or the like).

It is possible to combine any of a display device, a semiconductor device, a lighting device, a cooling device, a light-emitting device, a reflecting device, a driving device, and the like. Such a device is also included in an embodiment of the present invention. For example, a display device sometimes includes a semiconductor device and a light-emitting device. In some cases, a semiconductor device includes a display device and a driving device.

In each of the above-described embodiments of the present invention, all the circuits that are necessary to realize a predetermined function can be formed using one substrate (e.g., a glass substrate, a plastic substrate, a single crystal substrate, or an SOI substrate). In this manner, costs can be reduced by reduction in the number of components or the reliability can be improved by reduction in the number of connections to circuit components.

Furthermore, it is possible not to form all the circuits that are necessary to realize the predetermined function over one substrate. That is, part of the circuits which are necessary to realize the predetermined function may be formed using one substrate and another part of the circuits which are necessary to realize the predetermined function may be formed using another substrate. For example, some of the circuits which are necessary to realize the predetermined function can be formed over a glass substrate and some of the circuits which are necessary to realize the predetermined function can be formed using a single crystal substrate (or an SOI substrate). Then, the single crystal substrate where some of the circuits which are necessary to realize the predetermined function (such a substrate is also referred to as an IC chip) can be connected to the glass substrate by COG (chip on glass), and the IC chip can be provided over the glass substrate. Alternatively, the IC chip can be connected to the glass substrate with TAB (tape automated bonding), COF (chip on film), SMT (surface mount technology), a printed circuit board, or the like.

In this specification, when it is explicitly described that X and Y are connected, the case where X and Y are electrically connected, the case where X and Y are functionally connected, and the case where X and Y are directly connected are included therein. Here, each of X and Y is an object (e.g., a device, an element, a circuit, a wiring, an electrode, a terminal, a conductive film, or a layer). Accordingly, another connection relation shown in drawings and texts is included without being limited to a predetermined connection relation, for example, the connection relation shown in the drawings and the texts.

For example, in the case where X and Y are electrically connected, one or more elements that enable electrical connection between X and Y (e.g., a switch, a transistor, a capacitor, an inductor, a resistor, and/or a diode) can be connected between X and Y.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing a potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, when a signal output from X is transmitted to Y, it can be said that X and Y are functionally connected even if another circuit is provided between X and Y.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that X and Y are electrically connected, the description is the same as the case where it is explicitly only described that X and Y are connected.

In this specification, explicit singular forms preferably mean singular forms. Note that in that case, the singular form can also include the plural. Similarly, explicit plural forms preferably mean plural forms. However, also in that case, the plural form can include the singular.

Note that the size, the thickness of layers, or regions in the drawings of this application are exaggerated for simplicity in some cases. Therefore, embodiments of the present invention are not limited to such scales. Note that a drawing schematically illustrates an ideal example, and embodiments of the present invention are not limited to the shape, value, or the like illustrated in the drawing. For example, it is possible to include variations in shape due to a manufacturing technique or an error, variations in signal, voltage, or current due to noise or difference in timing.

Note that technical terms are used in order to describe a specific embodiment or the like in many cases. Note that one embodiment of the present invention is not construed as being limited by the technical terms.

Note that terms that are not defined (including terms used for science and technology such as technical term or academic parlance) can be used as the terms having meaning equal to general meaning that an ordinary person skilled in the art understands. It is preferable that terms defined by dictionaries or the like be construed as consistent meaning with the background of related art.

The terms such as "first", "second", and "third" are used for distinguishing a variety of elements, members, regions, layers, areas, and the like from each other. Therefore, the terms such as "first", "second", and "third" do not limit the order and number of the elements, members, regions, layers, areas, and the like. Further, the term "first" can be replaced with the term "second", "third", or the like, for example.

Note that terms for describing spatial arrangement, such as "over", "above", "under", "below", "laterally", "right", "left", "obliquely", "behind", "front", "inside", "outside", and "in", are often used for briefly showing a relation between an element and another element or between a feature and another feature with reference to a diagram. Note that embodiments of the present invention are not limited to this use of terms, and such terms for describing spatial arrangement can indicate not only the direction illustrated in a diagram but also another direction in some cases. For example, when it is explicitly described that "Y is over X", it does not necessarily mean that Y is placed over X. Since a structure in a diagram can be inverted or rotated by 180°, the case where Y is placed under X can be included. Thus, "over" can refer to the direction described by "under" in addition to the direction described by "over". Note that the embodiments of the present invention are not limited to this, and "over" can refer to any of the other directions described by "laterally", "right", "left", "obliquely", "behind", "front", "inside", "outside", "in", and the like in addition to the directions described by "over" and "under" because a device in a diagram can be rotated in a variety of directions. That is, the terms for describing spatial arrangement can be construed adequately depending on the situation.

When it is explicitly described that Y is formed on or over X, it does not necessarily mean that Y is formed on and in direct contact with X. The description includes the case where X and Y are not in direct contact with each other, that is, the case where another object is placed between X and Y. Here, each of X and Y corresponds to an object (e.g., a device, an element, a circuit, a wiring, an electrode, a terminal, a conductive film, or a layer).

Accordingly, for example, when it is explicitly described that "a layer Y is formed on (or over) a layer X", it includes both the case where the layer Y is formed on and in direct contact with the layer X, and the case where another layer (e.g., a layer Z) is formed on and in direct contact with the layer X and the layer Y is formed on and in direct contact with the layer Z. Note that another layer (e.g., the layer Z) may be a single layer or a plurality of layers.

Similarly, when it is explicitly described that Y is formed above X, it does not necessarily mean that Y is formed on and in direct contact with X, and another object may be placed between X and Y. Therefore, for example, when it is described that "a layer Y is formed above a layer X", it includes both the case where the layer Y is formed on and in direct contact with the layer X, and the case where another layer (e.g., a layer Z) is formed on and in direct contact with the layer X and the layer Y is formed on and in direct contact with the layer Z. Note that another layer (e.g., the layer Z) may be a single layer or a plurality of layers.

Note that when it is explicitly described that Y is formed over, on, or above X, it includes the case where Y is formed obliquely over/above X.

Note that the same can be said when it is explicitly described that Y is formed below or under X.

In one embodiment of the invention disclosed in this specification and the like, a light-transmitting material is used for at least part of a transistor and part of a storage capacitor in a pixel portion. Consequently, light can pass through a region where the transistor and the storage capacitor are provided, so that the aperture ratio can be increased. Moreover, since a wiring for connecting elements is formed using a material with low resistivity (with high conductivity) in a driver circuit portion, distortion of signal waveforms can be reduced and a voltage drop due to wiring resistance can be reduced. Thus, power consumption of a semiconductor device can be reduced. Furthermore, the size of a semiconductor device (the size of a screen) can be easily increased.

BRIEF DESCRIPTION OF THE DRAWINGS

In the accompanying drawings:

FIGS. 3A1 to 3A4 and 3B1 to 3B4 are cross-sectional views illustrating a method for manufacturing a semiconductor device;

FIGS. 4A1 to 4A4 and 4B1 to 4B4 are cross-sectional views illustrating a method for manufacturing a semiconductor device;

FIGS. 5A1 to 5A4 and 5B1 to 5B4 are cross-sectional views illustrating a method for manufacturing a semiconductor device;

FIGS. 6A1 to 6A3 and 6B1 to 6B3 are cross-sectional views illustrating a method for manufacturing the semiconductor device;

FIGS. 8A1 to 8A4 and 8B1 to 8B4 are cross-sectional views illustrating a method for manufacturing a semiconductor device;

FIGS. 9A1 to 9A3 and 9B1 to 9B3 are cross-sectional views illustrating a method for manufacturing a semiconductor device;

FIGS. 10A1 to 10A3 and 10B1 to 10B3 are cross-sectional views illustrating a method for manufacturing a semiconductor device;

FIGS. 11A1 to 11A3 and 11B1 to 11B3 are cross-sectional views illustrating a method for manufacturing a semiconductor device;

FIGS. 12A1, 12A2, 12B1, and 12B2 each illustrate a multi-tone mask;

FIGS. 15A1 and 15A2 are plan views and FIG. 15B is a cross-sectional view of a semiconductor device;

DETAILED DESCRIPTION OF THE INVENTION

Figure 1A:
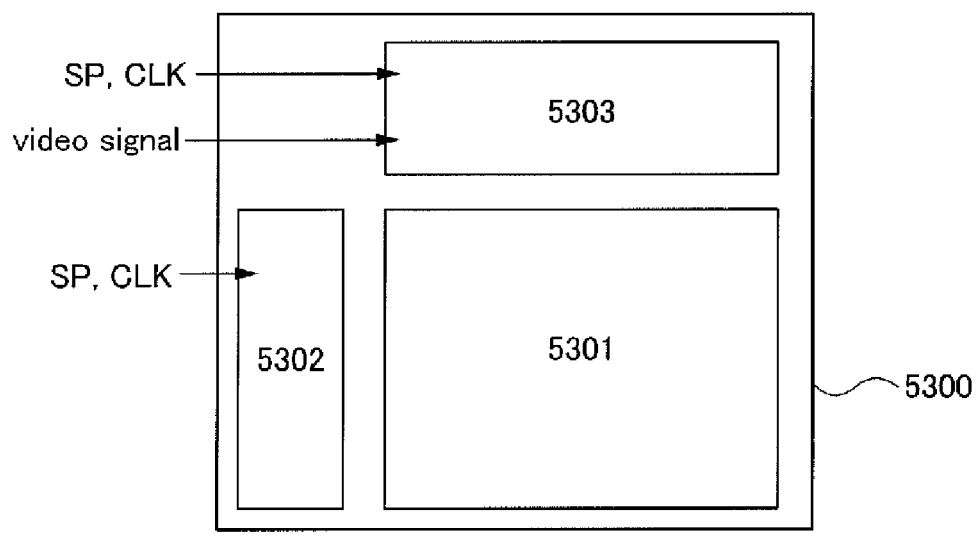
FIG. 1A is a block diagram of a semiconductor device.

Embodiments of the present invention will be described below. An embodiment of the invention disclosed in this specification can achieve any of the following objects, for example. Note that the description of a plurality of objects does not preclude the existence of another object. In addition, each embodiment of the present invention is not necessary to achieve all the following objects.

The embodiments of the present invention can be carried out in many different modes, and it is easily understood by those skilled in the art that modes and details can be modified in various ways without departing from the spirit and scope of the present invention. Therefore, the present invention is not interpreted as being limited to the description of the embodiments below. Note that in structures described below, the same portions or portions having similar functions are denoted by the same reference numerals, and description thereof is not repeated.

What is described in one embodiment (or part of the content) can be selected, combined or replaced with another content in the same embodiment and/or what is described in another embodiment or other embodiments (or part of the content). Note that in each embodiment, what is described in the embodiment is the content described with reference to one or a plurality of diagrams and the content described in text form.

A combination of a diagram (or part of the diagram) used in one embodiment with another part of the diagram, a different diagram (or part thereof) used in the same embodiment, and/or a diagram (or part thereof) used in one or a plurality of different embodiments can form a diagram in which another structure example is illustrated. On the basis of part of a diagram or a text used in one embodiment, another embodiment can be constituted. Therefore, in the case where a diagram or a text related to some portion is described, the present invention also discloses another embodiment represented by the diagram or the text for that portion.

Therefore, for example, it is possible to constitute one embodiment of the inventions by taking out part of a diagram (e.g., a cross-sectional view, a plan view, a circuit diagram, a block diagram, a flow chart, a process diagram, a perspective view, a cubic diagram, a layout diagram, a timing chart, a structure diagram, a schematic view, a graph, a list, a ray diagram, a vector diagram, a phase diagram, a waveform chart, a photograph, or a chemical formula) or a text in which one or more of an active element (e.g., a transistor and a diode), a wiring, a passive element (e.g., a capacitor and a resistor), a conductive layer, an insulating layer, a semiconductor layer, an organic material, an inorganic material, a component, a substrate, a module, a device, a solid, a liquid, a gas, an operating method, a manufacturing method, and the like are described.

For example, from a circuit diagram in which N circuit elements (e.g., transistors or capacitors; N is an integer) are provided, it is possible to constitute one embodiment of the inventions by taking out M circuit elements (e.g., transistors or capacitors; M is an integer, where M<N). As another example, it is possible to constitute one embodiment of the inventions by taking out M layers (M is an integer, where M<N) from a cross-sectional view in which N layers (N is an integer) are provided. As another example, it is possible to constitute one embodiment of the inventions by taking out M elements (M is an integer, where M<N) from a flow chart in which N elements (N is an integer) are provided.

Further, in the case where at least one specific example is described in a diagram or a text described in one embodiment, it is readily appreciated by those skilled in the art that a broader concept of the specific example can be derived. Therefore, in the case where at least one specific example is described in the diagram or the text described in one embodiment, a broader concept of the specific example can constitute one embodiment of the inventions disclosed in this specification.

The content described in at least a diagram (or part of the diagram) is disclosed as one embodiment of the inventions, and can constitute one embodiment of the inventions. Therefore, when certain content is described in a diagram, one embodiment of the invention disclosed in this specification can be constituted by the content even when the content is not described with a text. Similarly, one embodiment of the invention disclosed in this specification can be constituted by a diagram obtained by taking out part of a diagram.

It might be possible for those skilled in the art to constitute one embodiment of the inventions even when portions to which all terminals of an active element (e.g., a transistor or a diode), a passive element (e.g., a capacitor or a resistor), or the like are connected are not specified. In particular, in the case where the number of portions to which the terminal is connected is plural, it is not necessary to specify the portions to which the terminal is connected. Therefore, in some cases, it is possible to constitute an embodiment of the inventions by only specifying portions to which only some of terminals of an active element (e.g., a transistor or a diode), a passive element (e.g., a capacitor or a resistor), or the like are connected.

It is sometimes possible for those skilled in the art to specify an embodiment of the inventions when at least a connection portion of a circuit is specified, and such a case is included in the embodiment of the invention disclosed in this specification. Moreover, it is sometimes possible for those skilled in the art to specify an embodiment of the invention disclosed in this specification when at least a function of a circuit is specified. Such a case is included in the embodiment of the invention disclosed in this specification.

EMBODIMENT 1

In this embodiment, a method for manufacturing transistors in a pixel portion and at least some of driver circuits over one substrate in a semiconductor device will be described with reference to FIGS. 1A and 1B, FIGS. 2A and 2B, FIGS. 3A1 to 3A4 and 3B1 to 3B4, FIGS. 4A1 to 4A4 and 4B1 to 4B4, FIGS. 5A1 to 5A4 and 5B1 to 5B4, and FIGS. 6A1 to 6A3 and 6B1 to 6B3.

FIG. 1A is a block diagram of an example of a semiconductor device according to this embodiment. A liquid crystal display device is specifically described as a semiconductor device in this embodiment; however, the disclosed invention is not limited to a liquid crystal display device. The disclosed invention can be applied to an electroluminescent display device (an EL display device), a display device using an electrophoretic element (i.e., a so-called electronic paper), and the like and also applied to a semiconductor device other than a display device.

The display device illustrated in FIG. 1A includes, over a substrate 5300, a pixel portion 5301 having a plurality of pixels each including a display element; a scan line driver circuit 5302 that selects a pixel; and a signal line driver circuit 5303 that controls input of a video signal to a selected pixel.

Figure 1B:
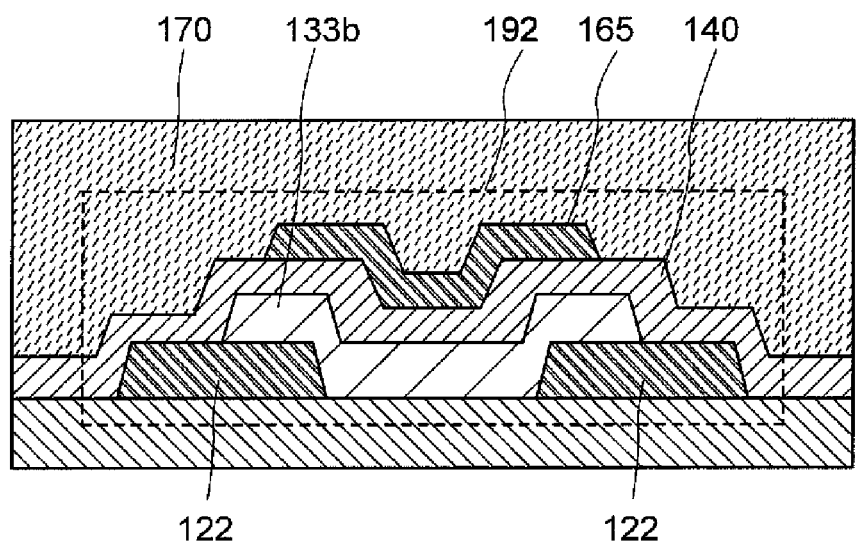
FIG. 1B is a cross-sectional view of a semiconductor device.

FIG. 1B is a cross-sectional view of a transistor 192 that can be applied to a driver circuit portion such as the scan line driver circuit 5302 or the signal line driver circuit 5303. The transistor 192 is a so-called top-gate transistor that includes a conductive layer 122 functioning as a source electrode (or a drain electrode), a semiconductor layer 133b, a gate insulating layer 140, and a conductive layer 165 functioning as a gate electrode. Note that a driver circuit portion refers to some or all of pixel peripheral circuits, and is not limited to only a scan line driver circuit and a signal line driver circuit as in this embodiment.

Figure 2A:
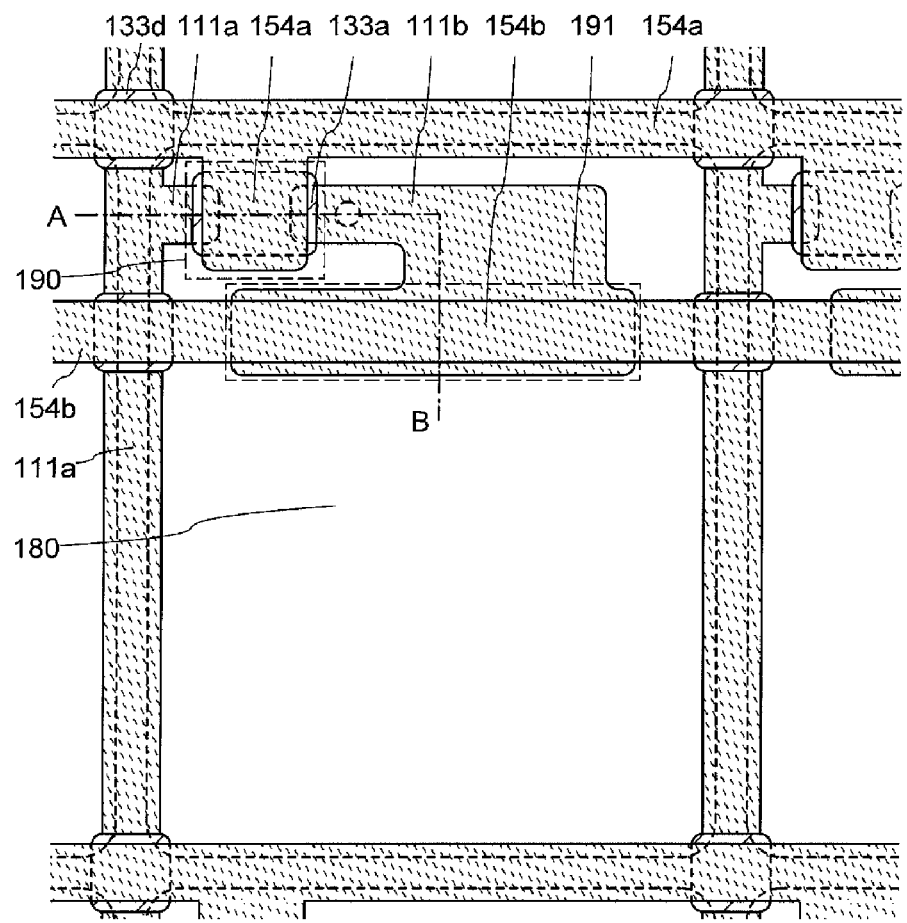
FIG. 2A is a plan view and FIG. 2B is a cross-sectional view of a semiconductor device.
Figure 2B:
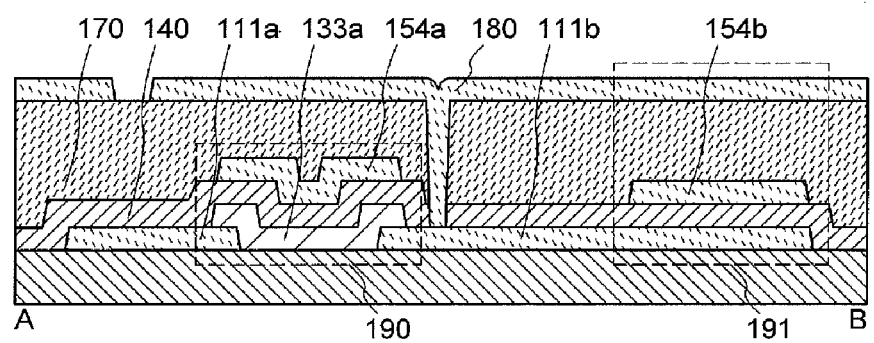

FIGS. 2A and 2B illustrate an example of a structure of the pixel portion 5301 illustrated in FIG. 1A. FIG. 2A is an enlarged plan view of one of a plurality of pixels arranged in the pixel portion 5301. FIG. 2B is a cross-sectional view along line A-B in FIG. 2A.

One of the plurality of pixels arranged in the pixel portion 5301, which is illustrated in FIGS. 2A and 2B, includes a conductive layer 111a functioning as a source wiring; a conductive layer 154a and a conductive layer 154b that intersect the conductive layer 111a and function as a gate wiring and a capacitor wiring, respectively; a transistor 190 near the intersection of the conductive layer 154a and the conductive layer 111a; and a storage capacitor 191 electrically connected to the conductive layer 154b. Note that in this specification and the like, a pixel refers to a region surrounded by a conductive layer functioning as a gate wiring and a conductive layer functioning as a source wiring. In FIG. 2A, the conductive layer 111a and the conductive layers 154a and 154b intersect at 90°; however, the disclosed invention is not limited to this structure. That is, the conductive layer 111a and the conductive layers 154a and 154b may intersect at an angle other than 90°. Although not illustrated, the source wiring is connected to the signal line driver circuit and the gate wiring is connected to the scan line driver circuit. A semiconductor layer 133d that is formed using the same layer as a semiconductor layer 133a is preferably provided at the intersection of the source wiring and the gate wiring. With the formation of the semiconductor layer 133d, the capacitance generated because wirings intersect each other can be reduced, so that distortion of signal waveforms can be suppressed. This is particularly effective in large semiconductor devices.

The transistor 190 in the pixel portion illustrated in FIGS. 2A and 2B is a so-called top-gate transistor including the conductive layer 111a functioning as a source electrode, a conductive layer 111b functioning as a drain electrode, the semiconductor layer 133a, the gate insulating layer 140, and the conductive layer 154a functioning as a gate electrode. Note that since functions of the source electrode and the drain electrode of a transistor are sometimes replaced with each other depending on the direction in which carriers flow, the terms "source electrode" and "drain electrode" are used only for convenience. In other words, a function of each conductive layer should not be construed as being limited to the above terms. Moreover, the storage capacitor 191 includes the conductive layer 111b, the gate insulating layer 140, the conductive layer 154b, an insulating layer 170, and a conductive layer 180. Specifically, the capacitance is formed between the conductive layer 111b and the conductive layer 154b, and between the conductive layer 154b and the conductive layer 180.

Here, the conductive layers 111a and 111b, the semiconductor layer 133a, and the conductive layers 154a and 154b, which are included in the transistor 190, are formed using light-transmitting materials. Thus, the aperture ratio of a pixel can be increased.

The conductive layers 122 and 165 included in the transistor 192 illustrated in FIG. 1B are formed using a low resistance material. Accordingly, the resistance due to electrodes and the like can be reduced, and characteristics of the transistor can be improved. Note that since a low resistance material often has light-shielding properties, a transistor to be formed does not transmit light but does not need to have complete light-shielding properties (e.g., the light transmittance may be 10% or less).

In such a manner, a transistor including a light-transmitting material is formed in a pixel portion and a transistor including a low resistance material is formed in a driver circuit portion, whereby it is possible to provide a semiconductor device in which the aperture ratio of the pixel portion is increased and the performance of the pixel peripheral circuits is improved. In other words, the object of improving the characteristics of the semiconductor device can be achieved.

Note that in the above description, the term "light-transmitting" means that the light transmittance in the visible range (approximately 400 nm to 800 nm) is higher than at least that of the conductive layer 122 and the conductive layer 165.

In this specification, a film that transmits visible light refers to a film having a visible light transmittance of 75% to 100%; when the film has conductivity, it is also referred to as a transparent conductive film. Further, a conductive film that is semi-transparent to visible light may be used for a metal oxide applied to a gate electrode layer, a source electrode layer, a drain electrode layer, a pixel electrode layer, or another electrode layer or another wiring layer. Semi-transparency to visible light means that the visible light transmittance is 50% to 75%.

Next, an example of the method for manufacturing a semiconductor device is described with reference to FIGS. 3A1 to 3A4 and 3B1 to 3B4, FIGS. 4A1 to 4A4 and 4B1 to 4B4, FIGS. 5A1 to 5A4 and 5B1 to 5B4, and FIGS. 6A1 to 6A3 and 6B1 to 6B3. Note that a method for manufacturing a transistor and a storage capacitor in a pixel portion is illustrated in FIGS. 3A1 to 3A4, FIGS. 4A1 to 4A4, FIGS. 5A1 to 5A4, and FIGS. 6A1 to 6A3. A method for manufacturing a transistor in a driver circuit portion is illustrated in FIGS. 3B1 to 3B4, FIGS. 4B1 to 4B4, FIGS. 5B1 to 5B4, and FIGS. 6B1 to 6B3.

First, a conductive layer 110 is formed over a substrate 100 having an insulating surface (see FIGS. 3A1 and 3B1).

As the substrate 100 having an insulating surface, a glass substrate that transmits visible light and is used in a liquid crystal display device or the like can be used, for example. The glass substrate is preferably a non-alkali glass substrate. For the non-alkali glass substrate, a glass material such as aluminosilicate glass, aluminoborosilicate glass, or barium borosilicate glass is used, for example. Moreover, an insulating substrate formed of an insulator, such as a ceramic substrate, a quartz substrate, or a sapphire substrate, can be used as the substrate 100 having an insulating surface. A flexible synthetic resin typified by polyethylene terephthalate (PET), polyethylene naphthalate (PEN), and polyether sulfone (PES) may be used.

Although not illustrated, a base film is preferably provided over the substrate 100 having an insulating surface. The base film has a function of preventing diffusion of alkali metal (e.g., Li, Cs, or Na), alkaline earth metal (e.g., Ca or Mg), or other impurities from the substrate 100. In other words, by providing the base film, the object of improving the reliability of the semiconductor device can be achieved. The base film can be formed using one or a plurality of insulating layers such as a silicon nitride film, a silicon oxide film, a silicon nitride oxide film, a silicon oxynitride film, an aluminum oxide film, an aluminum nitride film, an aluminum oxynitride film, or an aluminum nitride oxide film. For example, the base film preferably has a structure in which a silicon nitride film and a silicon oxide film are stacked in this order from the substrate side. This is because the silicon nitride film is highly effective in blocking impurities. Meanwhile, since defects might occur in the case where the silicon nitride film is in contact with a semiconductor, a silicon oxide film is preferably formed as a film in contact with the semiconductor.

The base film can be formed by a plasma-enhanced CVD method, a sputtering method, or the like. In this embodiment, the base film is formed using a silicon nitride film and a silicon oxide film that are stacked in this order from the substrate 100 side by a sputtering method.

Note that in this specification and the like, oxynitride refers to a substance that contains more oxygen (atoms) than nitrogen (atoms). For example, silicon oxynitride contains oxygen, nitrogen, silicon, and hydrogen in ranges of 50 at. % to 70 at. %, 0.5 at. % to 15 at. %, 25 at. % to 35 at. %, and 0.1 at. % to 10 at. %, respectively. Further, nitride oxide refers to a substance that contains more nitrogen (atoms) than oxygen (atoms). For example, silicon nitride oxide contains oxygen, nitrogen, silicon, and hydrogen in ranges of 5 at. % to 30 at. %, 20 at. % to 55 at. %, 25 at. % to 35 at. %, and 10 at. % to 25 at. %, respectively. Note that rates of oxygen, nitrogen, silicon, and hydrogen fall within the aforementioned ranges when measurement is performed using Rutherford backscattering spectrometry (RBS) or hydrogen forward scattering (HFS). In addition, the total of the percentages of the constituent elements does not exceed 100 at. %.

The conductive layer 110 is preferably formed using a material with light-transmitting properties (visible light-transmitting properties), such as indium tin oxide (ITO), indium tin oxide containing silicon oxide (ITSO), organoindium, organotin, zinc oxide (ZnO), or titanium nitride. Alternatively, indium zinc oxide (IZO) containing zinc oxide, a material obtained by adding gallium (Ga) to zinc oxide, tin oxide ($SnO_2$), indium oxide containing tungsten oxide, indium zinc oxide containing tungsten oxide, indium oxide containing titanium oxide, indium tin oxide containing titanium oxide, or the like may be used. The conductive layer 110 may have a signal-layer structure or a layered structure. When a layered structure is employed, the conductive layer 110 is preferably formed so as to have a sufficiently high light transmittance. Note that a sputtering method is preferably used for forming the conductive layer 110; however, this embodiment is not limited to a sputtering method. The thickness of the conductive layer 110 can be selected as appropriate in the range of 50 nm to 300 nm. In this embodiment, indium tin oxide is used for the conductive layer 110.

Next, a resist mask 101a and a resist mask 101b are formed over the conductive layer 110, and the conductive layer 110 is selectively etched using the resist masks 101a and 101b so that the conductive layer 111a and the conductive layer 111b are formed (see FIGS. 3A2 and 3B2). As the etching, dry etching or wet etching may be used. Note that the resist masks 101a and 101b are removed after the etching. In order to improve the coverage of the conductive layers 111a and 111b with an insulating layer and the like which are formed later and prevent disconnection, it is preferable to form the conductive layers 111a and 111b with their end portions tapered. By forming the conductive layers 111a and 111b to be tapered in such a manner, the object of increasing the yield of the semiconductor device can be achieved.

The conductive layer 111a functions as a source electrode of the transistor in the pixel portion. The conductive layer 111b functions as a drain electrode of the transistor and an electrode (a capacitor electrode) of the storage capacitor in the pixel portion. Note that a function of each conductive layer should not be construed as being limited to the term "source electrode" or "drain electrode".

Next, a conductive layer 120 is formed so as to cover the conductive layers 111a and 111b (see FIGS. 3A3 and 3B3). Note that the conductive layer 120 is formed so as to cover the conductive layers 111a and 111b here; however, the disclosed invention is not limited to this structure.

The conductive layer 120 can be formed with a single-layer structure or a layered structure using a metal element such as aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), niobium (Nb), chromium (Cr), or cerium (Ce); an alloy material containing any of such metal materials as a main component; or a nitride containing such a metal material. For example, the conductive layer 120 is preferably formed using a low resistance material such as aluminum.

In the case where the conductive layer 120 is formed over the conductive layers 111a and 111b, these conductive layers might react with each other. For example, when ITO is used for the conductive layers 111a and 111b and aluminum is used for the conductive layer 120, chemical reaction might be caused. In order to prevent such reaction, the conductive layer 120 may have a layered structure of a high melting point material and a low resistance material. Specifically, for example, it is preferable that a region where the conductive layer 120 is in contact with the conductive layers 111a and 111b be formed using a high melting point material and a region where the conductive layer 120 is not in contact with the conductive layers 111a and 111b be formed using a low resistance material.

Examples of the high melting point material are molybdenum, titanium, tungsten, tantalum, and chromium. Examples of the low resistance material are aluminum, copper, and silver.

It is needless to say that the conductive layer 120 may have a layered structure of three or more layers. In that case, it is possible to employ a layered structure in which molybdenum, aluminum, molybdenum are used for a first layer, a second layer, and a third layer, respectively; or a layered structure in which molybdenum, aluminum containing a small amount of neodymium, and molybdenum are used for a first layer, a second layer, and a third layer, respectively. When the conductive layer 120 has such a layered structure, generation of hillocks can be prevented. Thus, the object of improving the reliability of the semiconductor device can be achieved.

Next, a resist mask 102 is formed over the conductive layer 120, and the conductive layer 120 is selectively etched using the resist mask 102 so that the conductive layer 122 is formed (see FIGS. 3A4 and 3B4). At this time, the conductive layer 122 is not formed over the conductive layers 111a and 111b which function as the source electrode (and the drain electrode) of the transistor in the pixel portion. Note that the conductive layer 122 functions as a source electrode (or a drain electrode) of the transistor in the driver circuit portion.

The conductive layer 122 is formed using a low resistance material. The resist mask 102 is removed after the conductive layer 122 is formed.

Note that this embodiment shows the steps for forming the conductive layer 122 after the conductive layers 111a and 111b are formed; however, the disclosed invention should not be construed as being limited thereto. For example, the order of formation of the conductive layers 111a and 111b and formation of the conductive layer 122 may be changed. That is, the conductive layers 111a and 111b which function as the source electrode (and the drain electrode) of the transistor in the pixel portion can be formed after the formation of the conductive layer 122 functioning as the source electrode of the transistor in the driver circuit portion.

Next, a semiconductor layer 130 is formed so as to cover at least the conductive layers 111a and 111b (see FIGS. 4A1 and 4B1). In this embodiment, the semiconductor layer 130 is formed over the substrate 100 so as to cover the conductive layers 111a and 111b and the conductive layer 122.

The semiconductor layer 130 can be formed using any of a variety of oxide semiconductor materials.

An oxide semiconductor used in this specification forms a thin film represented by $InMO_3(ZnO)_m$ (m is larger than 0 and is not an integer), and a thin film transistor is manufactured by using the thin film as an oxide semiconductor layer. Note that M represents one or more of metal elements selected from Ga, Fe, Ni, Mn, or Co. As an example, M may be Ga or may include the above metal element in addition to Ga, for example, M may be Ga and Ni or Ga and Fe. Moreover, in the above oxide semiconductor, a transition metal element such as Fe or Ni or an oxide of the transition metal is sometimes contained as an impurity element in addition to the metal element contained as M. In this specification, among oxide semiconductors having a composition formula expressed by $InMO_3(ZnO)_m$ (m is larger than 0 and is not an integer), an oxide semiconductor that contains Ga as M is referred to as an In—Ga—Zn—O-based oxide semiconductor, and a thin film of the In—Ga—Zn—O-based oxide semiconductor is referred to as an In—Ga—Zn—O-based non-single-crystal film.

As a metal oxide used for an oxide semiconductor layer, any of the following oxide semiconductors can be applied besides the above: an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, and a Zn—O-based metal oxide. Silicon oxide may be contained in the oxide semiconductor layer formed from any of the above metal oxides.

Moreover, other materials can be used. For example, the semiconductor layer 130 formed using an In—Ga—Zn—O-based oxide semiconductor material can be formed by a sputtering method using an oxide semiconductor target containing In, Ga, and Zn ($In_2O_3:Ga_2O_3:ZnO=1:1:1$). The condition of sputtering can be set as follows, for example: the distance between the substrate 100 and the target is 30 mm to 500 mm, the pressure is 0.1 Pa to 2.0 Pa, the direct current (DC) power supply is 0.25 kW to 5.0 kW (when a target of 8 inches in diameter is used), and the atmosphere is an argon atmosphere, an oxygen atmosphere, or a mixed atmosphere of argon and oxygen. Note that a ZnO-based non-single-crystal film may be used as the semiconductor layer 130. The semiconductor layer 130 can have a thickness of 5 nm to 200 nm. In this embodiment, the thickness of the semiconductor layer 130 is 50 nm or less.

As the sputtering method, an RF sputtering method in which a high frequency power supply is used as a sputtering power supply, a DC sputtering method, a pulsed DC sputtering method in which direct current bias is applied in pulses, or the like can be employed. Note that it is preferable to use a pulsed direct current (DC) power supply because dust can be reduced and thickness distribution becomes uniform. In that case, the object of improving the yield and reliability of the semiconductor device can be achieved.

Alternatively, a multi-target sputtering apparatus in which a plurality of targets that are formed of different materials from each other may be used. In the multi-source sputtering apparatus, a plurality of films can be formed in the same chamber, or one film can be formed by sputtering of plural kinds of materials in one chamber at the same time. Moreover, it is possible to employ a method using a magnetron sputtering apparatus in which a magnetic field generating system is provided inside the chamber (a magnetron sputtering method), an ECR sputtering method in which plasma generated by using a micro wave is used, or the like. Furthermore, it is possible to employ a reactive sputtering method in which a target substance and a sputtering gas component chemically react with each other during deposition to form a compound, a bias sputtering method in which high voltage is also applied to a substrate during deposition, or the like.

Before the semiconductor layer 130 is formed, plasma treatment may be performed on a surface where the semiconductor layer 130 is to be formed (e.g., surfaces of the conductive layers 111a and 111b and, in the case where the base film is formed, a surface of the base film). With the plasma treatment, dust and the like attached to the surface where the semiconductor layer 130 is to be formed can be removed. Moreover, by forming the semiconductor layer 130 without exposure to air after the plasma treatment is performed, the conductive layers 111a and 111b can be electrically connected to the semiconductor layer 130 in a favorable manner. In other words, the object of increasing the yield and reliability of the semiconductor device can be achieved.

Note that in this embodiment, the case where an oxide semiconductor material is used for the semiconductor layer 130 is described; however, one embodiment of the disclosed invention is not limited thereto. If a semiconductor material other than an oxide semiconductor material, a compound semiconductor material, or the like is used, the semiconductor layer can have light transmittance in some cases when its thickness is made smaller. Accordingly, another semiconductor material may be used instead of an oxide semiconductor material. Examples of another semiconductor material are various kinds of inorganic semiconductor materials such as silicon, gallium, and gallium arsenide; an organic semiconductor material such as a carbon nanotube; and a material in which such materials are mixed. Such a material with a variety of modes such as single crystallinity, polycrystallinity, microcrystallinity (including microcrystal state and nanocrystal state), and amorphous state can be used for the semiconductor layer 130.

Next, a resist mask 103a and a resist mask 103b are formed over the semiconductor layer 130, and the semiconductor layer 130 is selectively etched using the resist masks 103a and 103b so that the semiconductor layer 133a and the semiconductor layer 133b are formed (see FIGS. 4A2 and 4B2). The semiconductor layers 133a and 133b are formed in island shapes. Here, the semiconductor layer 133a serves as an active layer of the transistor in the pixel portion. The semiconductor layer 133b serves as an active layer of the transistor in the driver circuit portion.

The resist masks may be formed by a spin coating method or the like. When a droplet discharging method, a screen printing method, or the like is used, the resist mask can be selectively formed. In that case, the object of increasing the productivity can be achieved.

Either wet etching or dry etching can be employed as a method for etching the semiconductor layer 130. After the etching, the resist masks 103a and 103b are removed. In this embodiment, a liquid in which phosphoric acid, acetic acid, nitric acid, and pure water are mixed is used for etching of the semiconductor layer 130. Note that since the semiconductor layer 130 overlapping with the conductive layers 111a and 111b is removed, each material and etching conditions are adjusted as appropriate so that the conductive layers 111a and 111b are not removed in etching of the semiconductor layer 130. In order to perform selective etching of the semiconductor layer 130, the semiconductor layer 130 preferably has high etching selectivity to the conductive layers 111a and 111b provided below the semiconductor layer 130.

When the etching selectivity of the semiconductor layer 130 to the conductive layers 111a and 111b is high, reduction in thickness of the conductive layers 111a and 111b in the etching step of the semiconductor layer 130 can be reduced.

When dry etching is performed, a gas containing chlorine or a gas containing chlorine to which oxygen is added is preferably used, for example. This is because the etching selectivity of the semiconductor layer 130 to the conductive layer and the base film is likely to be high by using a gas containing chlorine and oxygen.

As an etching apparatus used for dry etching, an etching apparatus using a reactive ion etching method (an RIE method), or a dry etching apparatus using a high-density plasma source such as ECR (electron cyclotron resonance) or ICP (inductively coupled plasma) can be used. An ECCP (enhanced capacitively coupled plasma) mode etching apparatus may be used by which uniform electric discharge can be obtained over a wide area as compared to an ICP etching apparatus. The ECCP mode etching apparatus can be easily used even when a substrate of the tenth generation or later is used.

In the case where the semiconductor layer 133a is formed over the conductive layers 111a and 111b which function as the source electrode (and the drain electrode) of the transistor and the case where the semiconductor layer 133b is formed over the conductive layer 122 as in this embodiment, it is easy to reduce the thickness of the semiconductor layers 133a and 133b. This is because removal of the semiconductor layers 133a and 133b due to over-etching in etching the conductive layers 111a, 111b, and 122 does not occur in the case where the semiconductor layer 133a is placed over the conductive layers 111a and 111b and the case where the semiconductor layer 133b is placed over the conductive layer 122, which is different from the contrary case (e.g., the case where the semiconductor layer 133a is placed below the conductive layers 111a and 111b). Reduction in thickness of the semiconductor layers 133a and 133b is realized in such a manner, whereby depletion can be easily realized at the time of voltage application, and the S value can be reduced. Moreover, the off-state current can be reduced. In other words, the object of realizing higher performance of the semiconductor device can be achieved. Note that the thickness of the semiconductor layer 133a is preferably smaller than that of the conductive layer 111a which functions as the source electrode and the source wiring, the conductive layer 154a which is formed later and functions as a gate electrode and a gate wiring, or the like.

Then, it is preferable to perform heat treatment at 350° C. or higher, preferably 400° C. or higher, and lower than the strain point of the substrate. The heat treatment can be performed in a nitrogen atmosphere or an inert gas atmosphere, or under reduced pressure. Here, the heat treatment is performed at 350° C. for one hour in a nitrogen atmosphere. The semiconductor layers 133a and 133b can be subjected to dehydration or dehydrogenation with this heat treatment, and semiconductor properties of the semiconductor layers 133a and 133b can be improved. After the heat treatment is performed on the oxide semiconductor layers in a nitrogen atmosphere, it is preferable that water or hydrogen be prevented from being mixed into the oxide semiconductor layers while the oxide semiconductor layers are not exposed to the air. Note that there is no particular limitation on the timing of the heat treatment as long as the heat treatment is performed after the semiconductor layers 133a and 133b are formed. The heat treatment may be performed on an oxide semiconductor film before the oxide semiconductor film is processed into the island-shaped oxide semiconductor layers 133a and 133b.

Note that this embodiment shows the steps in which after the conductive layers 111a and 111b are formed, the conductive layer 122 is formed, and then the semiconductor layers 133a and 133b are formed; however, the disclosed invention should not be construed as being limited thereto. For example, it is possible to employ steps in which after the conductive layers 111a and 111b are formed, the semiconductor layers 133a and 133b are formed, and then the conductive layer 122 is formed.

Note that the thickness of each of the conductive layers 111a and 111b is preferably made smaller than that of the conductive layer 122. It is preferable to make the conductive layers 111a and 111b thinner because the light transmittance can be further increased. Needless to say, one embodiment of the disclosed invention should not be construed as being limited thereto.

Next, the gate insulating layer 140 is formed so as to cover the semiconductor layers 133a and 133b (see FIGS. 4A3 and 4B3).

The gate insulating layer 140 can be formed with a single-layer structure or a layered structure of a silicon oxide film, a silicon oxynitride film, a silicon nitride film, a silicon nitride oxide film, an aluminum oxide film, an aluminum nitride film, an aluminum oxynitride film, an aluminum nitride oxide film, or a tantalum oxide film. For example, the gate insulating layer 140 can be formed to a thickness of 50 nm to 250 nm by a sputtering method, a CVD method, or the like. Note that the gate insulating layer 140 preferably has light-transmitting properties. Here, as the gate insulating layer 140, a silicon oxide film is formed to a thickness of 100 nm by a sputtering method. A stack of a silicon oxide film and a silicon nitride film may be used as the gate insulating layer 140, and heat treatment may be performed before the second-layer silicon nitride film is formed.

Heat treatment after the formation of the gate insulating layer 140 is preferably performed at 200° C. to 400° C., for example, 250° C. to 350° C. in an inert gas atmosphere or an oxygen gas atmosphere. For example, the heat treatment is performed at 250° C. for one hour in a nitrogen atmosphere.

Next, a conductive layer 150 is formed over the gate insulating layer 140 (see FIGS. 4A4 and 4B4). The conductive layer 150 can be formed using a material and a method which are similar to those of the conductive layer 110. Since the description of the conductive layer 110 can be referred to for the details of the conductive layer 150, the description is not repeated. Note that the conductive layer 150 preferably has light-transmitting properties.

When the conductive layer 110 and the conductive layer 150 are formed using the same material, they can easily share the material and a manufacturing apparatus, which contributes to reduction in cost, increase in throughput, and the like. Needless to say, it is not essential that the conductive layer 110 and the conductive layer 150 be formed using the same material.

Next, a resist mask 104a and a resist mask 104b are formed over the conductive layer 150, and the conductive layer 150 is selectively etched using the resist masks 104a and 104b so that the conductive layers 154a and 154b are formed (see FIGS. 5A1 and 5B1). As the etching, either dry etching or wet etching may be used. The resist masks 104a and 104b are removed after the etching. In the pixel portion, the conductive layer 154a functions as the gate electrode of the transistor, and the conductive layer 154b functions as an electrode (a capacitor electrode) of the storage capacitor.

Note that the area of a region where the conductive layer 111b and the conductive layer 154b overlap with each other can be changed as appropriate. Since the conductive layers 111b and 154b are formed using a light-transmitting material as shown in this embodiment, the aperture ratio is not reduced even when the area of the region where the conductive layers overlap with each other is increased to increase the capacitance. That is, the object of increasing the capacitance can be achieved without reduction in aperture ratio.

Next, a conductive layer 160 is formed so as to cover the conductive layers 154a and 154b (see FIGS. 5A2 and 5B2). The conductive layer 160 can be formed using a material and a method which are similar to those of the conductive layer 120. Since the description of the conductive layer 120 can be referred to for the details of the conductive layer 160, the description is not repeated. In that case also, it is preferable to form the conductive layers 120 and 160 using the same material because reduction in cost, increase in throughput, and the like can be achieved.

Then, a resist mask 105 is formed over the conductive layer 160, and the conductive layer 160 is selectively etched using the resist mask 105 so that the conductive layer 165 is formed (see FIGS. 5A3 and 5B3). Note that the conductive layer 165 functions as a gate electrode of the transistor in the driver circuit portion. The conductive layer 165 is formed using a low resistance material. The resist mask 105 is removed after the conductive layer 165 is formed.

Note that the steps for forming the conductive layer 165 after the conductive layers 154a and 154b are formed are described in this embodiment; however, the disclosed invention should not be construed as being limited thereto. For example, the order of formation of the conductive layers 154a and 154b and formation of the conductive layer 165 may be changed. That is, it is possible to form the conductive layer 154a functioning as the gate electrode of the transistor in the pixel portion and the conductive layer 154b functioning as the electrode of the storage capacitor after the formation of the conductive layer 165 functioning as the gate electrode of the transistor in the driver circuit portion.

Note that the thickness of each of the conductive layers 154a and 154b is preferably made smaller than that of the conductive layer 165 or the like. It is advantageous to make the conductive layers 154a and 154b thinner because, although the resistance is increased, the transmittance can be further increased. It is needless to say that one embodiment of the disclosed invention should not be construed as being limited thereto.

Next, the insulating layer 170 is formed so as to cover the gate insulating layer 140, the conductive layers 154a and 154b, and the conductive layer 165 (see FIGS. 5A4 and 5B4).

A surface of the insulating layer 170 is preferably made flat because an electrode (a pixel electrode) is formed later on the surface. In particular, a variety of elements can be formed using a light-transmitting material in one embodiment of the disclosed invention; thus, a region where these elements are formed can also be used as a display region (an opening region). Consequently, it is extremely useful to form the insulating layer 170 so that unevenness caused by an element and a wiring is reduced.

The insulating layer 170 can be formed with a single-layer structure or a layered structure of an insulating film formed using a material containing oxygen and/or nitrogen, such as silicon oxide, silicon nitride, silicon oxynitride, or silicon nitride oxide; a film containing carbon such as a diamond-like carbon (DLC); a film formed using an organic material such as epoxy, polyimide, polyamide, polyvinylphenol, benzocyclobutene, or acrylic or a siloxane material such as a siloxane resin; or the like. For example, since a film containing silicon nitride is highly effective in blocking impurities, the film is preferably used for increasing the reliability of the element. Moreover, since a film containing an organic material can effectively reduce unevenness, the film is preferably used for improving the characteristics of the element. Note that when the insulating layer 170 has a layered structure of a film containing silicon nitride and a film containing an organic material, it is preferable that the film containing silicon nitride (e.g., a silicon nitride film, a silicon oxynitride film, or a silicon nitride oxide film) be disposed as a protective insulating layer on the lower side in the drawing (on the side nearer to the element) and the film containing the organic material be disposed as a planarization insulating layer on the upper side (on the side of the surface where the pixel electrode is formed). The insulating layer 170 preferably has sufficient light-transmitting properties.

Figure 20A:
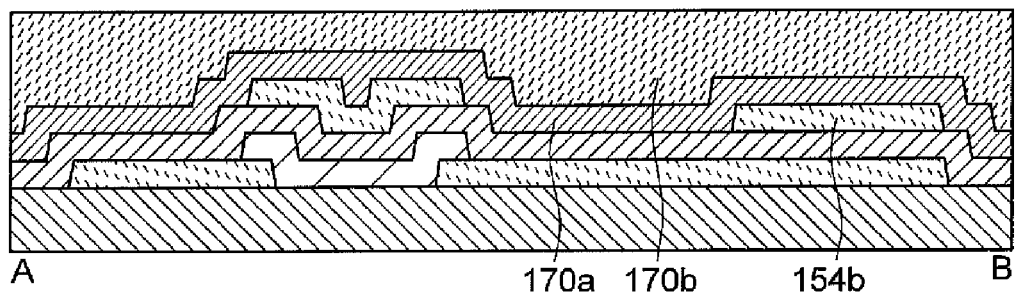
FIGS. 20A to 20C are cross-sectional views illustrating a method for manufacturing a semiconductor device.
Figure 20B:
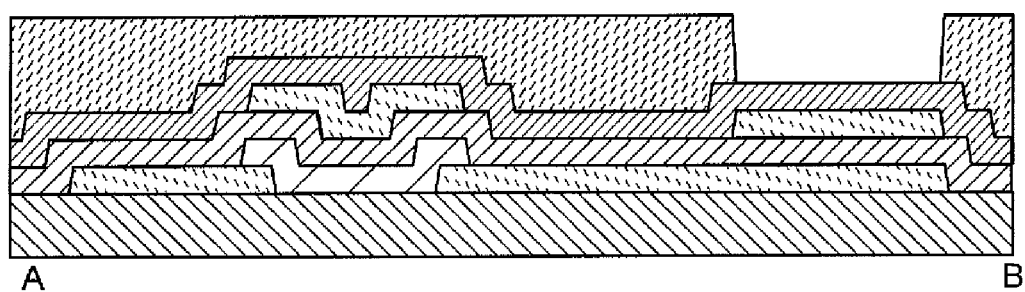
Figure 20C:
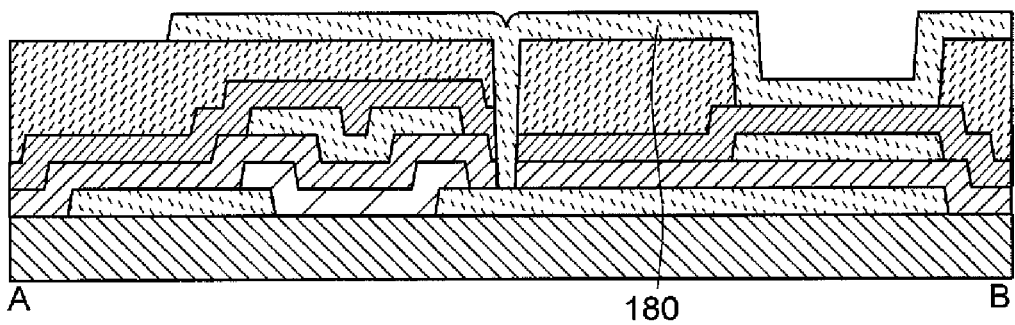

When the insulating layer 170 has a two-layer structure of an insulating layer 170a and an insulating layer 170b (see FIG. 20A), a region of the insulating layer 170b, which overlaps with the conductive layer 154b, is removed by etching (see FIG. 20B); thus, it is possible to increase the capacitance of a capacitor formed between the conductive layer 154b and the conductive layer 180 to be formed later (see FIG. 20C). Note that one embodiment of the disclosed invention is not limited to the above, and the insulating layer 170 may have a multi-layer structure of three layers or more.

The insulating layer 170 may be formed to have a function of a color filter. When a color filter is thus formed over the substrate where the element is formed, alignment in attaching a counter substrate or the like becomes easy. It is needless to say that the insulating layer 170 does not necessarily have a function of a color filter, and a layer functioning as a color filter may be additionally formed over the substrate 100. Note that in one embodiment of the disclosed invention, the source wiring, the gate wiring, and the like are formed using a light-shielding material. Accordingly, a portion between pixels can be shielded from light without additionally forming a black mask (a black matrix). That is, a high-performance semiconductor device can be provided while a process can be simplified as compared to the case where a black mask is additionally formed. It is needless to say that one embodiment of the disclosed invention should not be construed as being limited thereto, and a black mask may be additionally formed.

Note that in the case where major inconvenience does not occur without the provision of the insulating layer 170, it is possible to employ a structure in which the insulating layer 170 is not formed. In that case, there is an advantage in that a process can be simplified.

After that, a contact hole 176 that reaches the conductive layer 111b is formed in the insulating layer 170, and part of a surface of the conductive layer 111b is exposed (see FIGS. 6A1 and 6B1).

Then, the conductive layer 180 is formed so as to cover the insulating layer 170 (see FIGS. 6A1 and 6B2). Since the contact hole 176 is formed in the insulating layer 170, the conductive layer 111b and the conductive layer 180 are electrically connected to each other.

The conductive layer 180 can be formed using a material and a method which are similar to those of the conductive layers 110 and 150. Since the description of the conductive layers 110 and 150 can be referred to for the details of the conductive layer 180, the description is not repeated. Note that the conductive layer 180 preferably has light-transmitting properties. In that case also, it is preferable to form the conductive layers 110, 150, and 180 using the same material because reduction in cost, increase in throughput, and the like can be achieved.

Next, a resist mask is formed over the conductive layer 180, and the conductive layer 180 is selectively etched using the resist mask so that a conductive layer 187 is formed (see FIGS. 6A3 and 6B3). Here, the conductive layer 187 functions as the pixel electrode.

Although not illustrated, the source wiring, the source electrode, the gate wiring, the gate electrode, the capacitor wiring, the capacitor electrode, and the like can be connected to each other by using a conductive layer formed of the conductive layer 180. In other words, the conductive layer formed of the conductive layer 180 can function as a variety of wirings.

Through the above steps, it is possible to manufacture a semiconductor device that includes the light-transmitting transistor 190 in the pixel portion, the light-transmitting storage capacitor 191, and the transistor 192 including the low resistance electrode in the driver circuit portion (see FIGS. 6A3 and 6B3).

The transistor 190 and the storage capacitor 191 are formed using a light-transmitting material as described above, so that light can pass through a region where the source electrode, the drain electrode, the gate electrode, and the like are formed; thus, the aperture ratio of a pixel can be increased. Moreover, the transistor 192 in the driver circuit portion is formed using a low resistance material, whereby characteristics of the driver circuit can be improved.

The capacitor electrode is formed using a light-transmitting material, whereby the area of the capacitor electrode can be sufficiently increased. That is, the capacitance of the storage capacitor can be sufficiently increased. Thus, a potential holding property of the pixel electrode is improved, and the display quality is improved. Moreover, a feed-through potential can be lowered. Further, crosstalk can be reduced. Furthermore, flickers can be reduced.

Since the transistor 190 is formed using a light-transmitting material, the degree of freedom in setting the channel length (L) and the channel width (W) of the transistor 190 is extremely high (i.e., the degree of freedom for the layout is high). This is because the aperture ratio is not affected by the channel length and the channel width. Note that since a low resistance material without light-transmitting properties is used for a component that does not need light-transmitting properties, such as the driver circuit, an element used in the pixel portion and an element used in other regions (e.g., the driver circuit) can be separately formed.

Note that the channel length (L) and the channel width (W) of the transistor can be larger than the width of the conductive layer 165 or the like. This is because the aperture ratio does not depend on the size of the semiconductor layer 133a since the semiconductor layer 133a is formed using a light-transmitting material. However, one embodiment of the disclosed invention is not construed as being limited thereto. A plurality of transistors may be arranged in series or in parallel. Thus, the number of transistors can be increased.

This embodiment can be combined with any of the other embodiments as appropriate.

EMBODIMENT 2

In this embodiment, another example of a method for manufacturing a semiconductor device will be described with reference to FIG. 7, FIGS. 8A1 to 8A4 and 8B1 to 8B4, FIGS. 9A1 to 9A3 and 9B1 to 9B3, FIGS. 10A1 to 10A3 and 10B1 to 10B3, and FIGS. 11A1 to 11A3 and 11B1 to 11B3. Note that the method for manufacturing a semiconductor device according to this embodiment has a lot in common with the manufacturing method according to Embodiment 1. Therefore, in the following description, the description of the same structures, the same reference numerals, and the like are not repeated.

Note that a structure of the semiconductor device according to this embodiment and a plan view and a cross-sectional view of a pixel are similar to those in Embodiment 1 (see FIG. 1A and FIGS. 2A and 2B).

Figure 7:
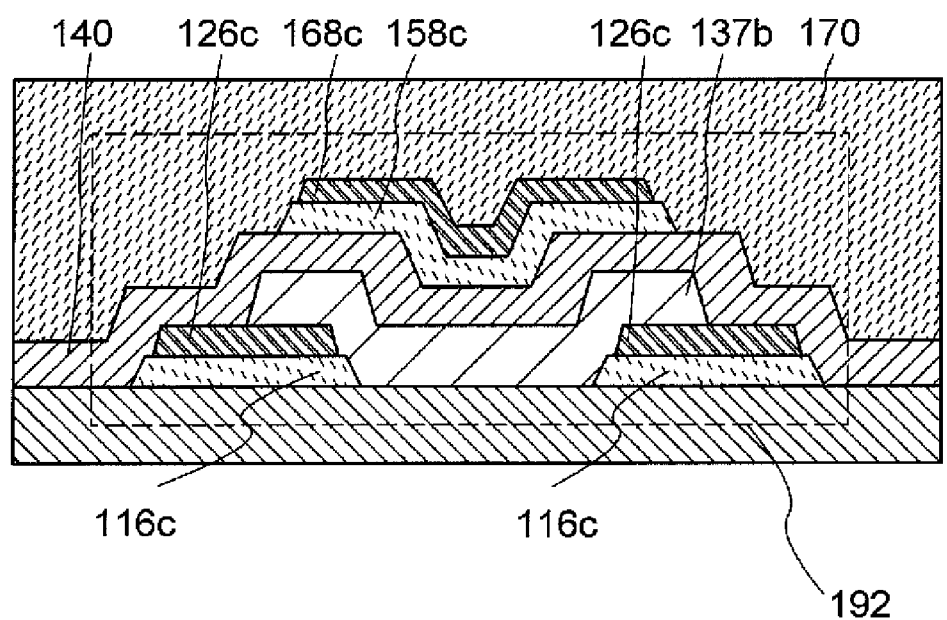
FIG. 7 is a cross-sectional view illustrating a semiconductor device.

FIG. 7 illustrates a cross-sectional structure of a transistor in a driver circuit portion according to this embodiment. The transistor is a so-called top-gate transistor that includes conductive layers 116c and 126c functioning as a source electrode (or a drain electrode), a semiconductor layer 137b, the gate insulating layer 140, and conductive layers 158c and 168c functioning as a gate electrode. In this embodiment, the source electrode (and the drain electrode) is formed using the conductive layer 116c formed from a light-transmitting material and the conductive layer 126c formed from a low resistance material; the gate electrode is formed using the conductive layer 158c formed from a light-transmitting material and the conductive layer 168c formed from a low resistance material.

Next, an example of the method for manufacturing a semiconductor device according to this embodiment is described with reference to FIGS. 8A1 to 8A4 and 8B1 to 8B4, FIGS. 9A1 to 9A3 and 9B1 to 9B3, FIGS. 10A1 to 10A3 and 10B1 to 10B3, and FIGS. 11A1 to 11A3 and 11B1 to 11B3. Note that a method for manufacturing a transistor and a storage capacitor in a pixel portion is illustrated in FIGS. 8A1 to 8A4, FIGS. 9A1 to 9A3, FIGS. 10A1 to 10A3, and FIGS. 11A1 to 11A3. A method for manufacturing a transistor in a driver circuit portion is illustrated in FIGS. 8B1 to 8B4, FIGS. 9B1 to 9B3, FIGS. 10B1 to 10B3, and FIGS. 11B1 to 11B3.

First, the conductive layer 110 and the conductive layer 120 are stacked in this order over the substrate 100 having an insulating surface (see FIGS. 8A1 and 8B1). It is possible to refer to Embodiment 1 for the details of the substrate 100 having an insulating surface, the conductive layer 110, and the conductive layer 120.

Although not illustrated, a base film is preferably provided over the substrate 100 having an insulating surface. It is possible to refer to Embodiment 1 for the details of the base film. Note that one embodiment of the disclosed invention is not limited to the formation of the base film.

Next, resist masks 106a to 106c are formed over the conductive layer 120, and the conductive layers 110 and 120 are selectively etched using the resist masks 106a to 106c, so that conductive layers 116a and 116b, the conductive layer 116c, conductive layers 126a and 126b, and the conductive layer 126c are formed (see FIGS. 8A2 and 8B2).

One of the differences between the method for manufacturing the semiconductor device according to this embodiment and that according to Embodiment 1 is an etching step of the conductive layers 110 and 120. In this embodiment, the resist masks 106a to 106c used in the etching step are formed using a multi-tone mask.

A multi-tone mask is a mask capable of light exposure with multi-level amount of light. With the use of a multi-tone mask, light exposure is performed with three levels of light amount to provide an exposed region, a half-exposed region, and an unexposed region, for example. That is, a multi-tone photomask makes it possible to form a resist mask with plural thicknesses (typically, two levels of thicknesses) by one-time exposure and development. Thus, the use of a multi-tone mask can reduce the number of photomasks to be used.

Typical examples of a multi-tone mask are a gray-tone mask and a half-tone mask. The gray-tone mask includes, on a light-transmitting substrate, a light-shielding portion formed using a material layer with light-shielding properties, and a slit portion provided in the material layer with light-shielding properties. The slit portion has slits (including dots, meshes, and the like) that are provided at intervals which are less than or equal to the resolution limit of light used for light exposure, so that the slit portion has a function of controlling the light transmittance. Note that the slit portion can have slits at regular intervals or at irregular intervals. The half-tone mask includes, on a light-transmitting substrate, a light-shielding portion formed using a material layer with light-shielding properties, and a semi-transmissive portion formed using a material layer with predetermined light-transmitting properties. The semi-transmissive portion has light transmittance depending on a material and the thickness of the material layer. The light transmittance of the semi-transmissive portion is approximately in the range of 10% to 70%.

FIGS. 12A1 and 12B1 each illustrate a cross section of a typical multi-tone mask. FIG. 12A1 illustrates a gray-tone mask 400. FIG. 12B1 illustrates a half-tone mask 410.

The gray-tone mask 400 illustrated in FIG. 12A1 includes, on a light-transmitting substrate 401, a light-shielding portion 402 formed using a material layer with light-shielding properties, and a slit portion 403 formed using patterns of the material layer with light-shielding properties.

The slit portion 403 has slits provided at intervals which are less than or equal to the resolution limit of light used for light exposure. For the light-transmitting substrate 401, a quartz substrate or the like can be used. The light-shielding layer for the light-shielding portion 402 and the slit portion 403 may be formed using a metal film, and is preferably formed using chromium, chromium oxide, or the like. When light is emitted to the gray-tone mask 400 in FIG. 12A1, the transmittance illustrated in FIG. 12A2 is obtained.

The half-tone mask 410 illustrated in FIG. 12B1 includes, on a light-transmitting substrate 411, a light-shielding portion 412 formed using a material layer with light-shielding properties, and a semi-transmissive portion 413 formed using a material layer with predetermined light-transmitting properties.

The semi-transmissive portion 413 can be formed using a material layer of MoSiN, MoSi, MoSiO, MoSiON, CrSi, or the like. The light-shielding portion 412 may be formed using a material similar to that for the tight-shielding portion of the gray-tone mask. Note that in FIG. 12B1, the light-shielding portion 412 has a layered structure of the material layer with predetermined light-transmitting properties and the material layer with light-shielding properties. When light is emitted to the half-tone mask 410 in FIG. 12B1, the transmittance illustrated in FIG. 12B2 is obtained.

Light exposure and development are performed using the above-described multi-tone mask, whereby the resist masks 106a to 106c having regions with different thicknesses can be formed.

Wet etching or dry etching may be used for etching of the conductive layers 110 and 120. Note that at this stage, both the conductive layer 110 and the conductive layer 120 need to be etched. By the etching, the conductive layer 116a that functions as a source electrode of the transistor in the pixel portion, the conductive layer 116b that functions as a drain electrode of the transistor in the pixel portion and an electrode of the storage capacitor, and the conductive layer 116c that functions as a source electrode (or a drain electrode) of the transistor in the driver circuit portion can be formed.

Then, resist masks 106d are formed by reducing the size of the resist masks 106c, and the resist masks 106a and 106b are removed. Next, the conductive layers 126a and 126b are removed using the resist masks 106d (see FIGS. 8A3 and 8B3). An example of a method for reducing the size of the resist mask 106c (and a method for removing the resist masks 106a and 106b) is ashing treatment using oxygen plasma. Note that the method is not limited to the above example.

Either wet etching or dry etching can be used for removing the conductive layers 126a and 126b. Note that at this stage, etching is performed in a condition that the selectivity of the conductive layer 126a (the conductive layer 126b) to the conductive layer 116a (the conductive layer 116b) is high. In other words, it is important that the shape of the conductive layers 116a and 116b be not changed much by the etching. The electrode formed by the etching, in which the conductive layer 126c is stacked over the conductive layer 116c, functions as the source electrode (or the drain electrode) of the transistor in the driver circuit portion. Here, the conductive layer 116a is formed using a light-transmitting material, and the conductive layer 126c is formed using a low resistance material.

Note that the resist masks 106d are removed after the etching. In order to improve the coverage of the above-described conductive layers with an insulating layer and the like to be formed later and prevent disconnection, it is preferable to form the conductive layers with their end portions tapered. The conductive layers are formed to be tapered in such a manner, whereby the object of increasing the yield of the semiconductor device can be achieved, which leads to reduction in manufacturing cost of the semiconductor device.

Next, the semiconductor layer 130 is formed so as to cover at least the conductive layers 116a and 116b (see FIGS. 8A4 and 8B4). In this embodiment, the semiconductor layer 130 is formed over the substrate 100 so as to cover the conductive layers 116a, 116b, and 126c. It is possible to refer to Embodiment 1 for the details of the semiconductor layer 130.

Before the semiconductor layer 130 is formed, plasma treatment may be performed on a surface where the semiconductor layer 130 is to be formed (e.g., surfaces of the conductive layers 116a and 116b and, in the case where the base film is formed, a surface of the base film). With the plasma treatment, dust attached to the surface where the semiconductor layer 130 is to be formed can be removed. Moreover, by forming the semiconductor layer 130 without exposure to air after the plasma treatment is performed, the conductive layers 116a and 116b can be electrically connected to the semiconductor layer 130 in a favorable manner. In other words, the object of increasing the yield and reliability of the semiconductor device can be achieved.

Next, a resist mask 107a and a resist mask 107b are formed over the semiconductor layer 130, and the semiconductor layer 130 is selectively etched using the resist masks 107a and 107b, so that semiconductor layers 137a and 137b are formed (see FIGS. 9A1 and 9B1). It is possible to refer to Embodiment 1 for the details of this step.

After that, heat treatment is preferably performed at 200° C. to 600° C., typically 300° C. to 500° C. Here, heat treatment is performed at 350° C. for one hour in a nitrogen atmosphere. With the heat treatment, semiconductor properties of the semiconductor layers 137a and 137b can be improved. Note that there is no particular limitation on the timing of the heat treatment as long as the heat treatment is performed after the formation of the semiconductor layers 137a and 137b.

Next, the gate insulating layer 140 is formed so as to cover the semiconductor layers 137a and 137b (see FIGS. 9A2 and 9B2). Embodiment 1 can be referred to for the detail of the gate insulating layer 140.

Then, the conductive layer 150 and the conductive layer 160 are stacked in this order over the gate insulating layer 140 (see FIGS. 9A3 and 9B3). It is possible to refer to Embodiment 1 for the details of the conductive layers 150 and 160.

Next, resist masks 108a to 108c are formed over the conductive layer 160, and the conductive layers 150 and 160 are selectively etched using the resist masks 108a to 108c, so that conductive layers 158a and 158b, the conductive layer 158c, conductive layers 168a and 168b, and the conductive layer 168c are formed (see FIGS. 10A1 and 10B1).

One of the differences between the method for manufacturing a semiconductor device according to this embodiment and that according to Embodiment 1 is an etching step of the conductive layers 150 and 160. In this embodiment, the resist masks 108a to 108c used in the etching step are formed using a multi-tone mask. It is possible to refer to the description of the resist masks 106a to 106c for the details of the multi-tone mask and the like.

Light exposure and development are performed using the multi-tone mask, whereby the resist masks 108a to 108c having regions with different thicknesses can be formed.

Wet etching or dry etching may be used for etching of the conductive layers 150 and 160. Note that at this stage, both the conductive layer 150 and the conductive layer 160 need to be etched. By the etching, the conductive layer 158a that functions as a gate electrode of the transistor in the pixel portion, the conductive layer 158b that functions as an electrode of the storage capacitor in the pixel portion, and the conductive layer 158c that functions as a gate electrode of the transistor in the driver circuit portion can be formed.

Next, the resist mask 108c is stripped so that a resist mask 108d is formed and the resist masks 108a and 108b are removed, and the conductive layers 168a and 168b are removed using the resist mask 108d (see FIGS. 10A2 and 10B2).

Note that since the conductive layers 168a and 168b overlapping with the conductive layers 158a and 158b are removed, each material and etching conditions are adjusted as appropriate so that the conductive layers 158a and 158b are not removed in etching of the conductive layers 168a and 168b. In order to perform selective etching of the conductive layers 168a and 168b, the conductive layers 168a and 168b preferably have high etching selectivity to the conductive layers 158a and 158b provided below the conductive layers 168a and 168b.

For example, a Ti film is used as the conductive layers 168a and 168b; an In—Sn—O-based metal oxide film is used as the conductive layers 158a and 158b; and an ammonia hydrogen peroxide solution (a mixture of ammonia, water, and a hydrogen peroxide solution), which is an alkaline etchant, is used as an etchant.

It is possible to refer to the description of the method for stripping the resist mask 106c (and the method for removing the resist masks 106a and 106b) and the description of removal of the conductive layers 126a and 126b for the details of a method for stripping the resist mask 108c (and a method for removing the resist masks 108a and 108b) and removal of the conductive layers 168a and 168b. Note that at this stage, etching is performed in a condition that the selectivity of the conductive layer 168a (the conductive layer 168b) to the conductive layer 158a (the conductive layer 158b) is high. In other words, it is important that the shape of the conductive layers 158a and 158b be not changed much by the etching. By the etching, the conductive layer 168c that functions as the gate electrode of the transistor in the driver circuit portion can be formed. Here, the conductive layer 168c is formed using a low resistance material.

The resist mask 108d is removed after the etching. In order to improve the coverage of the above conductive layers with an insulating layer and the like which are formed later and prevent disconnection, it is preferable to form the conductive layers with their end portions tapered. By forming the conductive layers to be tapered in such a manner, the object of increasing the yield of the semiconductor device can be achieved.

Note that the area of a region where the conductive layer 116b and the conductive layer 158b overlap with each other can be changed as appropriate. Since the conductive layers 116b and 158b are formed using a light-transmitting material as in this embodiment, the aperture ratio is not reduced even when the area of the region where the conductive layers overlap with each other is increased to increase the capacitance. That is, the object of increasing the capacitance can be achieved without reduction in aperture ratio.

In this embodiment, the conductive layers 116a, 116b, and 158a are formed so that the conductive layers 116a and 116b, which function as the source electrode and the drain electrode of the transistor in the pixel portion, respectively, overlap with part of the conductive layer 158a functioning as the gate electrode. In the case where the conductivity of part of the semiconductor layer 137a can be increased, it is possible to employ a structure in which the conductive layer 116a or the conductive layer 116b does not overlap with the conductive layer 158a. Embodiment 1 can be referred to for the details. With the structure in which the conductive layer 116a or the conductive layer 116b does not overlap with the conductive layer 158a in such a manner, the storage capacitance caused by the overlap between the conductive layer 116a (or the conductive layer 116b) and the conductive layer 158a can be reduced. In other words, the object of improving the characteristics of the semiconductor device can be achieved.

The conductive layer 168b may be formed so as to remain over the conductive layer 158b. By forming the conductive layer 168b in such a manner, the wiring resistance of the capacitor wiring can be reduced. Note that it is preferable that the width of the conductive layer 168b over the conductive layer 158b be sufficiently smaller than that of the conductive layer 158b. By forming the conductive layer 168b in this manner, the object of reducing the wiring resistance of the capacitor wiring can be achieved without reduction in aperture ratio.

Next, the insulating layer 170 is formed so as to cover the gate insulating layer 140, the conductive layers 158a and 158b, and the conductive layer 168c (see FIGS. 10A3 and 10B3). For example, when the insulating layer 170 has a layered structure of a film containing silicon nitride and a film containing an organic material, it is preferable that the film containing silicon nitride (e.g., a silicon nitride film, a silicon oxynitride film, or a silicon nitride oxide film) be disposed as a protective insulating layer on the lower side in the drawing (on the side nearer to the element) and the film containing the organic material be disposed as a planarization insulating layer on the upper side (on the side of the surface where a pixel electrode is formed). The insulating layer 170 preferably has sufficient light-transmitting properties. It is possible to refer to Embodiment 1 for the details of the insulating layer 170.

Note that in the case where major inconvenience does not occur without the provision of the insulating layer 170, it is possible to employ a structure in which the insulating layer 170 is not formed. In that case, there is an advantage in that a process can be simplified.

After that, the contact hole 176 that reaches the conductive layer 116b is formed in the insulating layer 170, and part of a surface of the conductive layer 116b is exposed (see FIGS. 11A1 and 11B1).

Then, the conductive layer 180 is formed so as to cover the insulating layer 170 (see FIGS. 11A2 and 11B2). Since the contact hole 176 is formed in the insulating layer 170, the conductive layer 116b and the conductive layer 180 are electrically connected to each other. Embodiment 1 can be referred to for the details of the conductive layer 180.

Next, a resist mask is formed over the conductive layer 180, and the conductive layer 180 is selectively etched using the resist mask, so that a conductive layer 189 is formed (see FIGS. 11A3 and 11B3). Here, the conductive layer 189 functions as the pixel electrode. It is possible to refer to Embodiment 1 for the details of the conductive layer 189 and the like.

A semiconductor device including the light-transmitting transistor 190 in the pixel portion, the light-transmitting storage capacitor 191, and the transistor 192 including the low resistance electrode in the driver circuit portion can be manufactured (see FIGS. 11A3 and 11B3).

Note that in this embodiment, the wirings and the electrodes are formed using a multi-tone mask; however, one embodiment of the disclosed invention is not construed as being limited thereto. A multi-tone mask may be used for only one of the step of forming the conductive layers 116a to 116c and the step of forming the conductive layers 168a to 168c.

In this embodiment, a resist mask is formed using a multi-tone mask to perform etching. As a result, the number of photomasks to be used can be reduced, and the number of steps can be reduced. That is, the object of reducing manufacturing costs of the semiconductor device can be achieved.

This embodiment can be combined with any of the other embodiments as appropriate.

EMBODIMENT 3

In this embodiment, another example of a pixel in the semiconductor device described in Embodiment 1 will be described with reference to FIGS. 13A and 13B and FIGS. 14A and 14B. Note that the semiconductor device according to this embodiment has a lot in common with the semiconductor device according to Embodiment 1. Therefore, in the following description, the description of the same structures, the same reference numerals, and the like are not repeated.

Figure 13A:
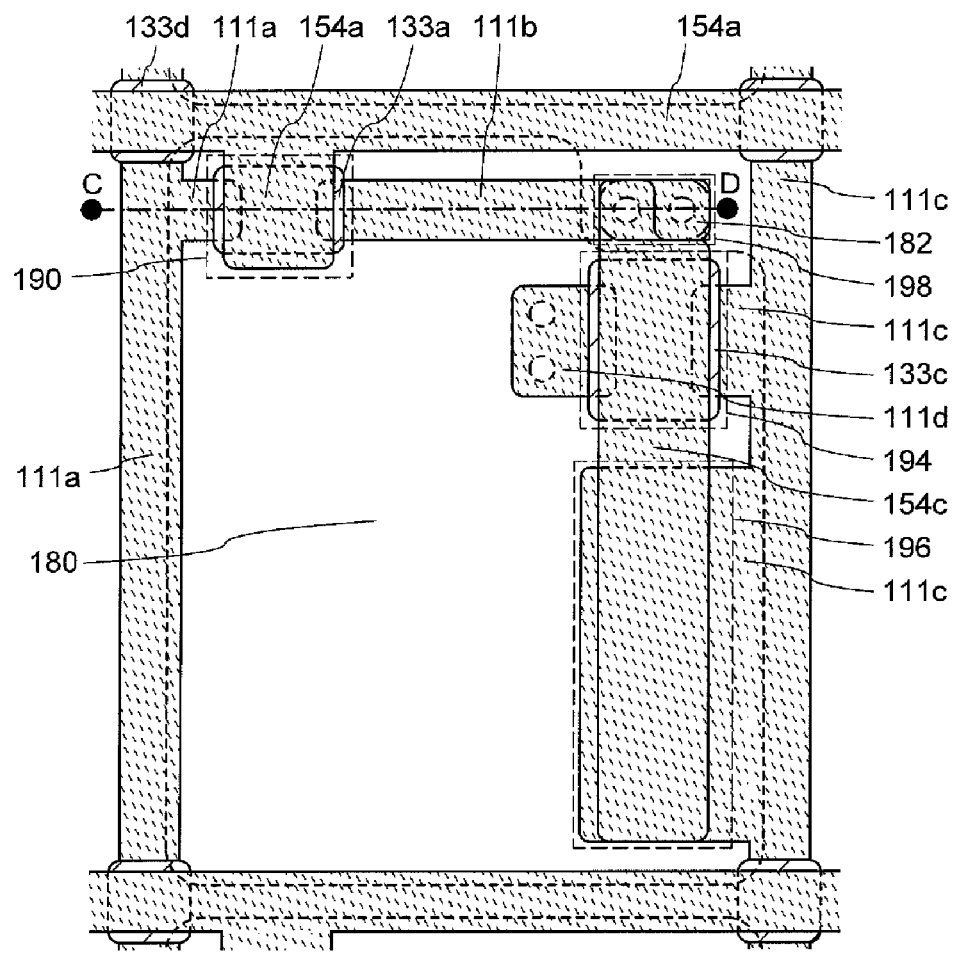
FIG. 13A is a plan view and FIG. 13B is a cross-sectional view of a semiconductor device.
Figure 13B:
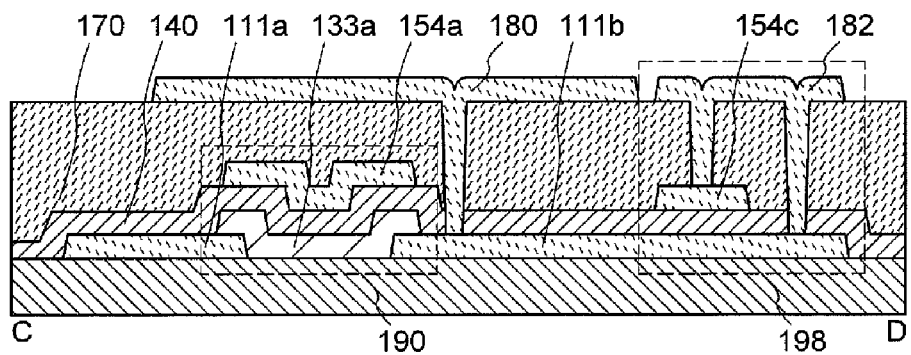

FIGS. 13A and 13B illustrate an example of a structure of a pixel according to this embodiment. The structure is preferably used particularly for an electroluminescent display device (an EL display device); however, the disclosed invention is not limited thereto. FIG. 13A is a plan view, and FIG. 13B is a cross-sectional view along line C-D in FIG. 13A.

The semiconductor device illustrated in FIG. 13A includes a pixel portion including the conductive layer 111a functioning as a source wiring; a conductive layer 111c that is formed in a manner similar to that of the conductive layer 111a and functions as a power supply wiring; the conductive layer 154a that intersects the conductive layers 111a and 111c and functions as a gate wiring; the transistor 190 near the intersection of the conductive layer 154a and the conductive layer 111a; a transistor 194 electrically connected to the conductive layer 111c; and a storage capacitor 196 electrically connected to the conductive layer 111c. Note that in FIG. 13A, the conductive layers 111a and 111c intersect the conductive layer 154a at 90°; however, the disclosed invention is not limited to this structure.

The transistor 190 is a so-called top-gate transistor including the conductive layer 111a functioning as a source electrode, the conductive layer 111b functioning as a drain electrode, the semiconductor layer 133a, the gate insulating layer 140, and the conductive layer 154a functioning as a gate electrode (see FIGS. 13A and 13B). Similarly, the transistor 194 includes the conductive layer 111c functioning as a source electrode, a conductive layer 111d functioning as a drain electrode, a semiconductor layer 133c, the gate insulating layer 140, and a conductive layer 154c functioning as a gate electrode. The storage capacitor 196 is constituted by the conductive layer 111c, the gate insulating layer 140, and the conductive layer 154c. Note that in the above description, the terms "source electrode" and "drain electrode" are used only for convenience.

In a connection portion 198, the conductive layer 111b and the conductive layer 154c are electrically connected to each other through a conductive layer 182 (see FIGS. 13A and 13B). Moreover, the conductive layer 111b and the conductive layer 180 are electrically connected to each other. Note that the conductive layer 180 functioning as a pixel electrode and the conductive layer 182 can be formed through the same step. Further, a contact hole for connecting the conductive layer 111b and the conductive layer 180, a contact hole for connecting the conductive layer 111b and the conductive layer 182, and a contact hole for connecting the conductive layer 154c and the conductive layer 182 can be formed through the same step.

The conductive layers 111a and 111b, the semiconductor layer 133a, and the conductive layer 154a which are included in the transistor 190; the conductive layers 111c and 111d, the semiconductor layer 133c, and the conductive layer 154c which are included in the transistor 194; and the conductive layer 111c included in the storage capacitor 196 are formed using light-transmitting materials. Thus, the aperture ratio of a pixel can be increased.

Although not illustrated, also in the semiconductor device according to this embodiment, electrodes of a transistor in a driver circuit portion are formed using a low resistance metal. This is the same as the example shown in Embodiment 1.

Note that the above is the description of the case where one pixel includes two transistors; however, the disclosed invention is not limited to this structure. Three or more transistors can be provided in one pixel.

Figure 14A:
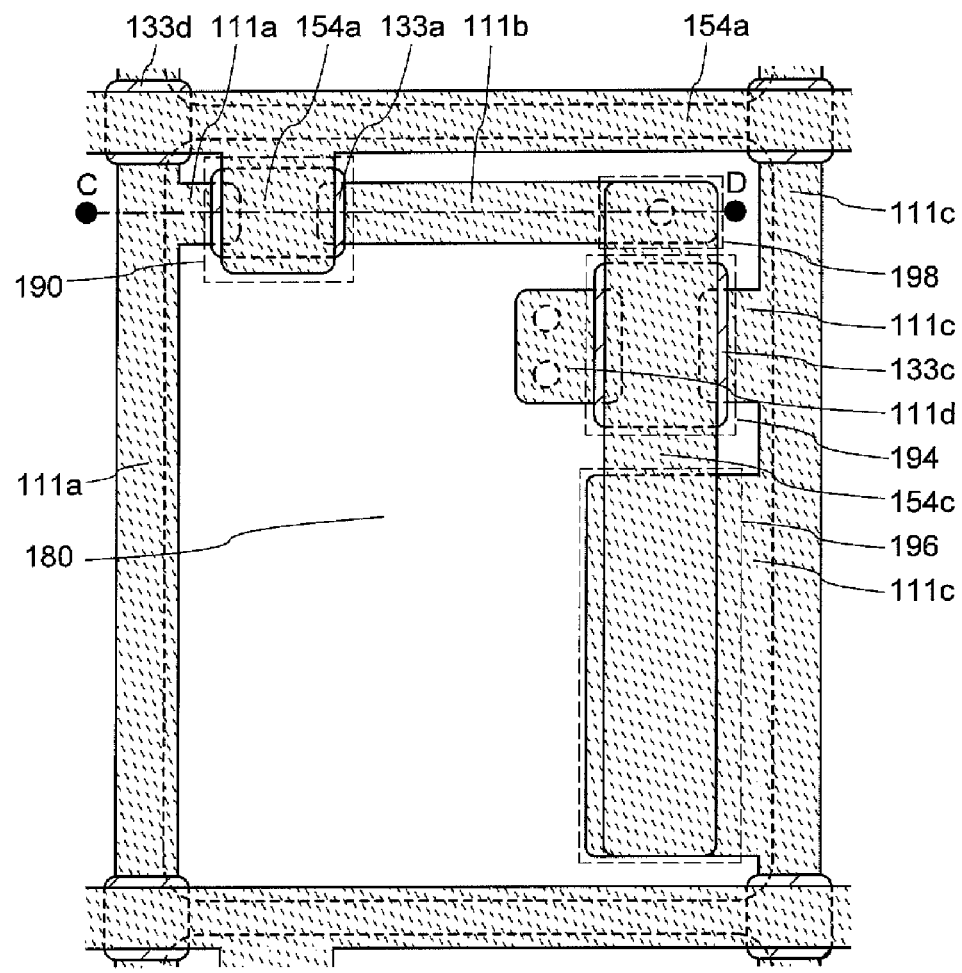
FIG. 14A is a plan view and FIG. 14B is a cross-sectional view of a semiconductor device.
Figure 14B:
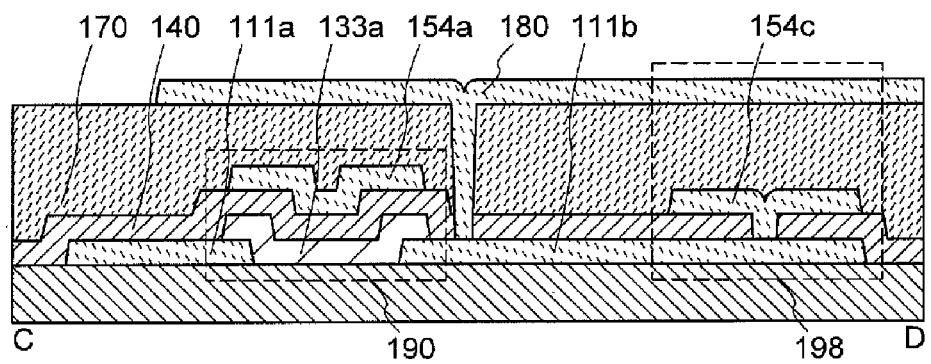

FIGS. 14A and 14B illustrate an example of a structure of a pixel according to this embodiment. The structure is preferably used particularly for an electroluminescent display device (an EL display device); however, the disclosed invention is not limited thereto. FIG. 14A is a plan view, and FIG. 14B is a cross-sectional view along line C-D in FIG. 14A.

The structure illustrated in FIGS. 14A and 14B is basically similar to that in FIGS. 13A and 13B. The difference between the structure in FIGS. 14A and 14B and the structure in FIGS. 13A and 13B is the connection portion 198. The conductive layer 111b and the conductive layer 154c are connected to each other through the conductive layer 182 in FIGS. 13A and 13B, whereas the conductive layer 111b and the conductive layer 154c are directly connected to each other in FIGS. 14A and 14B. In that case, the conductive layer 182 illustrated in FIGS. 13A and 13B is not necessary in FIGS. 14A and 14B; therefore, the size of the conductive layer 180 functioning as the pixel electrode can be further increased. Thus, the aperture ratio can be increased as compared to that in the structure illustrated in FIGS. 13A and 13B. In order to realize electrical connection between the conductive layer 111b and the conductive layer 154c, a contact hole needs to be formed in the gate insulating layer 140 before the conductive layer 154c is formed.

This embodiment can be combined with any of the other embodiments as appropriate.

EMBODIMENT 4

In this embodiment, the case where thin film transistors are formed and used in a pixel portion and a peripheral circuit portion (e.g., a driver circuit) to manufacture a semiconductor device having a display function (i.e., a display device) will be described. When part of or all the peripheral circuit portion is formed over a substrate where the pixel portion is formed, a system-on-panel can be realized.

A display device includes a display element. As the display element, a liquid crystal element (also referred to as a liquid crystal display element), a light-emitting element (also referred to as a light-emitting display element), or the like can be used. The light-emitting element includes, in its category, an element whose luminance is controlled by current or voltage, and specifically includes, in its category, an inorganic electroluminescent (EL) element, an organic EL element, and the like. Further, a display medium whose contrast is changed by an electric effect, such as electronic ink, may be used.

In addition, a display device includes a panel in which a display element is sealed, and a module in which an IC including a controller or the like is mounted on the panel. Moreover, an element substrate included in a display device is provided with a means for supplying current to a display element in each of pixels. Specifically, the element substrate may be in a state after only a pixel electrode of the display element is formed, or in a state after a conductive layer to be a pixel electrode is formed and before the conductive layer is etched.

In this embodiment, an example of a liquid crystal display device is described below. FIGS. 15A1 and 15A2 are plan views and FIG. 15B is a cross-sectional view of a panel in which thin film transistors 4010 and 4011 and a liquid crystal element 4013 that are formed over a first substrate 4001 are sealed by a second substrate 4006 and a sealing material 4005. Here, each of FIGS. 15A1 and 15A2 is a plan view, and FIG. 15B is a cross-sectional view along line M-N in FIGS. 15A1 and 15A2.

The sealing material 4005 is provided so as to surround a pixel portion 4002 and a scan line driver circuit 4004 that are provided over the first substrate 4001. The second substrate 4006 is provided over the pixel portion 4002 and the scan line driver circuit 4004. In other words, the pixel portion 4002 and the scan line driver circuit 4004 are sealed together with a liquid crystal layer 4008, by the first substrate 4001, the sealing material 4005, and the second substrate 4006. Further, a signal line driver circuit 4003 that is formed using a single crystal semiconductor or a polycrystalline semiconductor over a substrate separately prepared is mounted in a region different from the region surrounded by the sealing material 4005 over the first substrate 4001.

Note that there is no particular limitation on the connection method of the driver circuit which is separately formed, and a COG method, a wire bonding method, a TAB method, or the like can be used as appropriate. FIG. 15A1 illustrates an example where the signal line driver circuit 4003 is mounted by a COG method. FIG. 15A2 illustrates an example where the signal line driver circuit 4003 is mounted by a TAB method.

The pixel portion 4002 and the scan line driver circuit 4004, which are provided over the first substrate 4001, each include a plurality of thin film transistors. FIG. 15B illustrates the thin film transistor 4010 included in the pixel portion 4002 and the thin film transistor 4011 included in the scan line driver circuit 4004. An insulating layer 4020 is provided over the thin film transistors 4010 and 4011.

As the thin film transistors 4010 and 4011, the thin film transistors which are described in the foregoing Embodiments or the like can be employed. Note that in this embodiment, the thin film transistors 4010 and 4011 are n-channel transistors.

A pixel electrode layer 4030 included in the liquid crystal element 4013 is electrically connected to the thin film transistor 4010. A counter electrode layer 4031 of the liquid crystal element 4013 is formed on the second substrate 4006. The liquid crystal element 4013 is formed using the pixel electrode layer 4030, the counter electrode layer 4031, and the liquid crystal layer 4008. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 therebetween.

Note that for the first substrate 4001 and the second substrate 4006, glass, ceramic, plastics, or the like can be used. As plastics, a fiberglass-reinforced plastic (FPR) substrate, a polyvinyl fluoride (PVF) film, a polyester film, an acrylic resin film, or the like can be used.

A columnar spacer 4035 is provided in order to control the distance (a cell gap) between the pixel electrode layer 4030 and the counter electrode layer 4031. The columnar spacer 4035 can be obtained by selective etching of an insulating film. Note that a spherical spacer may be used instead of the columnar spacer. The counter electrode layer 4031 is electrically connected to a common potential line provided over the substrate where the thin film transistor 4010 is formed. For example, the counter electrode layer 4031 can be electrically connected to the common potential line through conductive particles provided between the pair of substrates. Note that the conductive particles are preferably contained in the sealing material 4005.

A liquid crystal exhibiting a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent of 5 wt % or more is preferably used. Thus, the temperature range can be improved. The liquid crystal composition that includes a liquid crystal exhibiting a blue phase and a chiral agent has a short response time of 10 μs to 100 μs, has optical isotropy, which makes the alignment process unneeded, and has small viewing angle dependence.

Although an example of a transmissive liquid crystal display device is described in this embodiment, this embodiment is not limited thereto and can be applied to a reflective liquid crystal display device or a transflective liquid crystal display device.

As the example of the liquid crystal display device described in this embodiment, a polarizing plate is provided on the outer surface of the substrate (on the viewer side) and a coloring layer and an electrode layer used for a display element are provided on the inner surface of the substrate; however, the polarizing plate may be provided on the inner surface of the substrate. Moreover, the layered structure of the polarizing plate and the coloring layer is not limited to that described in this embodiment and may be set as appropriate depending on materials or conditions of manufacturing steps of the polarizing plate and the coloring layer. Further, a black mask (a black matrix) may be provided as a light-shielding film.

In this embodiment, the thin film transistor obtained in the foregoing Embodiments is covered with the insulating layer 4020 in order to reduce the surface roughness of the thin film transistor; however, the disclosed invention is not limited to this structure.

For the insulating layer 4020, an organic material having heat resistance, such as polyimide, acrylic, benzocyclobutene, polyamide, or epoxy, can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4020 may be formed by stacking a plurality of insulating films formed of these materials.

Here, the siloxane-based resin corresponds to a resin including a Si—O—Si bond which is formed using a siloxane-based material as a starting material. As a substituent, an organic group (e.g., an alkyl group or an aryl group) or a fluoro group may be used. The organic group may include a fluoro group.

There is no particular limitation on the method for forming the insulating layer 4020, and the following method or means can be used depending on the material: a sputtering method, an SOG method, a spin coating method, a dipping method, a spray coating method, or a droplet discharging method (e.g., an ink-jet method, screen printing, or offset printing); a doctor knife, a roll coater, a curtain coater, a knife coater, or the like.

For the pixel electrode layer 4030 and the counter electrode layer 4031, the following light-transmitting conductive material can be used, for example: indium oxide containing tungsten oxide, indium zinc oxide containing tungsten oxide, indium oxide containing titanium oxide, indium tin oxide containing titanium oxide, indium tin oxide (referred to as ITO), indium zinc oxide, or indium tin oxide to which silicon oxide is added.

A conductive composition containing a conductive high molecule (also referred to as a conductive polymer) may be used for the pixel electrode layer 4030 and the counter electrode layer 4031. The pixel electrode formed using the conductive composition preferably has a sheet resistance of $1.0 \times 10^4$ ohms/square or less and a light transmittance of 70% or more at a wavelength of 550 nm. Furthermore, the resistivity of the conductive high molecule contained in the conductive composition is preferably 0.1 Ω·cm or less.

As the conductive high molecule, a so-called π-electron conjugated conductive polymer can be used. Examples of the conductive high molecule are polyaniline and its derivatives, polypyrrole and its derivatives, polythiophene and its derivatives, and copolymers of two or more kinds of these materials.

A variety of signals are supplied from an FPC 4018 to the signal line driver circuit 4003, the scan line driver circuit 4004, the pixel portion 4002, or the like.

A connection terminal electrode 4015 is formed from the same conductive film as the pixel electrode layer 4030 included in the liquid crystal element 4013. A terminal electrode 4016 is formed from the same conductive film as source and drain electrode layers of the thin film transistors 4010 and 4011.

The connection terminal electrode 4015 is electrically connected to a terminal included in the FPC 4018 through an anisotropic conductive film 4019.

Note that FIGS. 15A1, 15A2, and 15B illustrate the example in which the signal line driver circuit 4003 is formed separately and mounted on the first substrate 4001; however, this embodiment is not limited to this structure. The scan line driver circuit may be formed separately and then mounted, or only part of the signal line driver circuit or part of the scan line driver circuit may be formed separately and then mounted.

Figure 16:
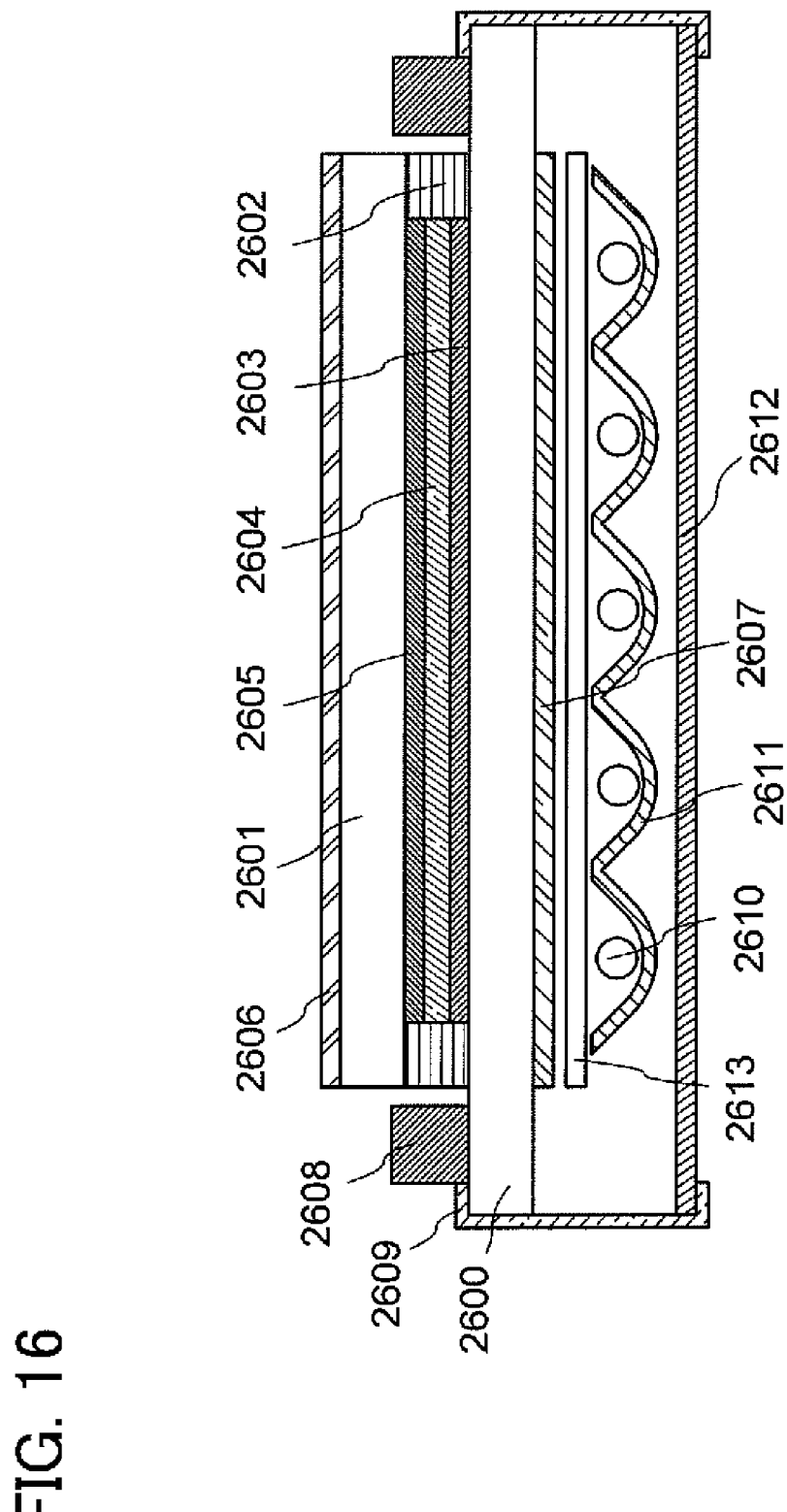
FIG. 16 illustrates a semiconductor device.

FIG. 16 illustrates an example in which a TFT substrate 2600 is used for a liquid crystal display module which is one embodiment of a semiconductor device.

In FIG. 16, the TFT substrate 2600 and a counter substrate 2601 are firmly attached to each other by a sealing material 2602; and an element layer 2603 including a TFT and the like, a liquid crystal layer 2604 including an alignment film and a liquid crystal, a coloring layer 2605, and the like are provided between the TFT substrate 2600 and the counter substrate 2601, whereby a display region is formed. The coloring layer 2605 is necessary for color display. In the case of the RGB system, coloring layers corresponding to colors of red, green, and blue are provided for pixels. A polarizing plate 2606, a polarizing plate 2607, and a diffuser plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 with a flexible wiring board 2609. Consequently, an external circuit such as a control circuit or a power source circuit is included in the liquid crystal module. Moreover, a retardation plate may be provided between the polarizing plate and the liquid crystal layer.

For a method for driving the liquid crystal, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optically compensated birefringence) mode, an FLC (ferroelectric liquid crystal) mode, an AFLC (antiferroelectric liquid crystal) mode, or the like can be used.

Through the above steps, a high-performance liquid crystal display device can be manufactured. This embodiment can be implemented in combination with any of the other embodiments as appropriate.

EMBODIMENT 5

In this embodiment, active matrix electronic paper which is an example of a semiconductor device will be described with reference to FIG. 17. A thin film transistor 650 used for the semiconductor device can be manufactured in a manner similar to that of the thin film transistor described in the foregoing Embodiments.

Figure 17:
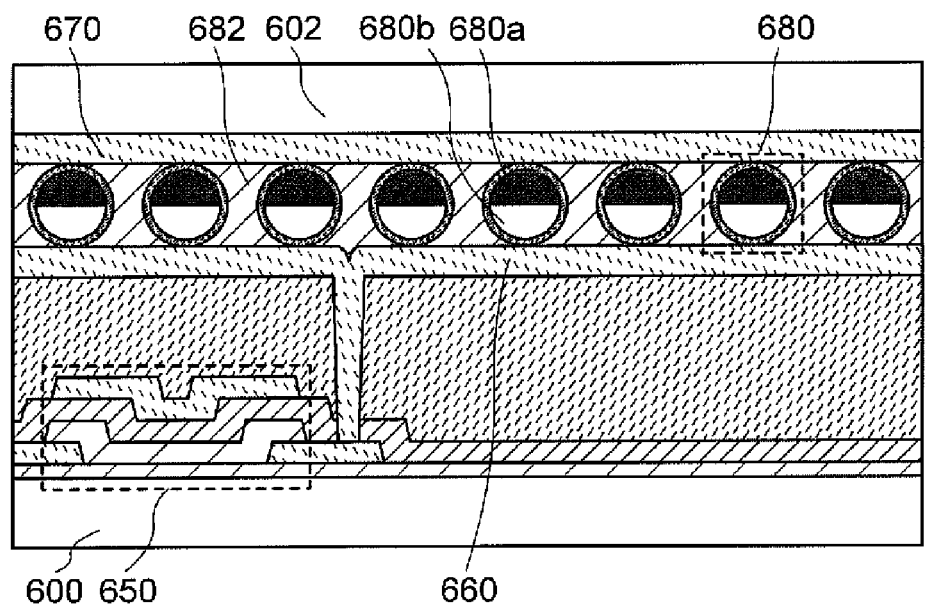
FIG. 17 is a cross-sectional view of a semiconductor device.

FIG. 17 illustrates an example of electronic paper using a twisting ball display system. The twisting ball display system refers to a method in which spherical particles each colored in black and white are arranged between a first electrode layer and a second electrode layer, and a potential difference is generated between the first electrode layer and the second electrode layer to control orientation of the spherical particles so that display is performed.

The thin film transistor 650 provided over a substrate 600 is a thin film transistor of the disclosed invention and has a structure in which a semiconductor layer is sandwiched between a gate electrode layer which is placed above the semiconductor layer and source and drain electrode layers which are placed below the semiconductor layer. Note that the source electrode layer or the drain electrode layer is electrically connected to a first electrode layer 660 through a contact hole formed in an insulating layer. A substrate 602 is provided with a second electrode layer 670. Spherical particles 680 each having a black region 680a and a white region 680b are provided between the first electrode layer 660 and the second electrode layer 670. A space around the spherical particles 680 is filled with a filler 682 such as a resin (see FIG. 17). In FIG. 17, the first electrode layer 660 corresponds to a pixel electrode, and the second electrode layer 670 corresponds to a common electrode. The second electrode layer 670 is electrically connected to a common potential line provided over the substrate where the thin film transistor 650 is formed.

An electrophoretic display element can be used instead of the twisting ball. In that case, a microcapsule having a diameter of approximately 10 μm to 200 μm in which light-transmitting liquid, positively-charged white microparticles, and negatively-charged black microparticles are encapsulated is used, for example. When an electric field is applied by the first electrode layer and the second electrode layer, the white microparticles and the black microparticles move in directions opposite to each other, so that white display or black display is performed. The electrophoretic display element has higher reflectivity than a liquid crystal display element, so that an auxiliary light is unnecessary and a display portion can be recognized in a place where brightness is not sufficient. In addition, there is an advantage that even when power is not supplied to the display portion, an image that has been displayed once can be maintained.

In the above-described manner, high-performance electronic paper can be manufactured using the disclosed invention. Note that this embodiment can be implemented in combination with any of the other embodiments as appropriate.

EMBODIMENT 6

In this embodiment, an example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, voltage is applied to the light-emitting element, so that electrons and holes are separately injected from a pair of electrodes into a layer containing a light-emitting organic compound, and current flows. Then, the carriers (electrons and holes) are recombined, so that light is emitted. Owing to such a mechanism, the light-emitting element is called a current-excitation light-emitting element.

Inorganic EL elements are classified in a dispersive inorganic EL element and a thin-film inorganic EL element according to their element structures. A dispersive inorganic EL element includes a light-emitting layer in which particles of a light-emitting material are dispersed in a binder, and light emission mechanism thereof is donor-acceptor recombination light emission utilizing a donor level and an acceptor level. In a thin film inorganic EL element, a light-emitting layer is sandwiched between dielectric layers, and the dielectric layers are sandwiched between electrodes. Light emission mechanism of the thin film inorganic EL element is local light emission utilizing inner-shell electron transition of a metal ion. Note that here, an organic EL element is used as a light-emitting element.

A structure of a light-emitting element is described with reference to FIGS. 18A to 18C. A cross-sectional structure of a pixel including an n-channel driving TFT is described as an example. TFTs 701, 711, and 721 used for semiconductor devices illustrated in FIGS. 18A to 18C can be manufactured in a manner similar to that of the thin film transistors described in the foregoing Embodiments.

In order to extract light from a light-emitting element, at least one of an anode and a cathode has light-transmitting properties. Here, the term "light-transmitting properties" means that at least transmittance at the wavelength of emitted light is sufficiently high. As a method for extracting light, there are a top emission method (a top extraction method) by which light is extracted from a side opposite to a substrate where a thin film transistor and a light-emitting element are formed, a bottom emission method (a bottom extraction method) by which light is extracted from the substrate side, a dual emission method (a dual extraction method) by which light is extracted from both the substrate side and the side opposite to the substrate, and the like.

A light-emitting element with a top emission method is described with reference to FIG. 18A.

Figure 18A:
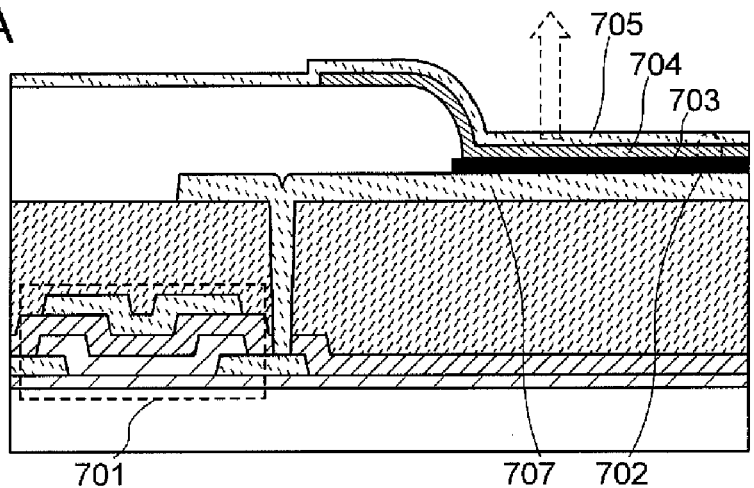
FIGS. 18A to 18C are cross-sectional views of semiconductor devices.

FIG. 18A is a cross-sectional view of a pixel in the case where light is emitted from a light-emitting element 702 to an anode 705 side. Here, the light-emitting element 702 is formed over a light-transmitting conductive layer 707 that is electrically connected to the driving TFT 701, and a light-emitting layer 704 and the anode 705 are stacked in this order over a cathode 703. As the cathode 703, a conductive film that has a low work function and reflects light can be used. For example, the cathode 703 is preferably formed using a material such as Ca, Al, MgAg, or AlLi. The light-emitting layer 704 may be formed using a single layer or a plurality of layers stacked. When the light-emitting layer 704 is formed using a plurality of layers, an electron injection layer, an electron transport layer, a light-emitting layer, a hole transport layer, and a hole injection layer are preferably stacked in this order over the cathode 703; however, it is needless to say that it is not necessary to form all of these layers. The anode 705 is formed using a light-transmitting conductive material. For example, the following light-transmitting conductive material may be used: indium oxide containing tungsten oxide, indium zinc oxide containing tungsten oxide, indium oxide containing titanium oxide, indium tin oxide containing titanium oxide, indium tin oxide (referred to as ITO), indium zinc oxide, or indium tin oxide to which silicon oxide is added.

A structure in which the light-emitting layer 704 is sandwiched between the cathode 703 and the anode 705 can be called the light-emitting element 702. In the case of the pixel illustrated in FIG. 18A, light is emitted from the light-emitting element 702 to the anode 705 side as indicated by an arrow. The structure of the light-emitting element 702 may be a microcavity structure. Accordingly, it is possible to select a wavelength to be extracted, so that the color purity can be improved. Note that in that case, the thickness of layers included in the light-emitting element 702 is set depending on the wavelength to be extracted. Moreover, an electrode is preferably formed using a material with a predetermined reflectivity.

An insulating layer containing silicon nitride, silicon oxide, or the like may be formed over the anode 705. Thus, deterioration of the light-emitting element can be suppressed.

Next, a light-emitting element with a bottom emission method is described with reference to FIG. 18B.

Figure 18B:
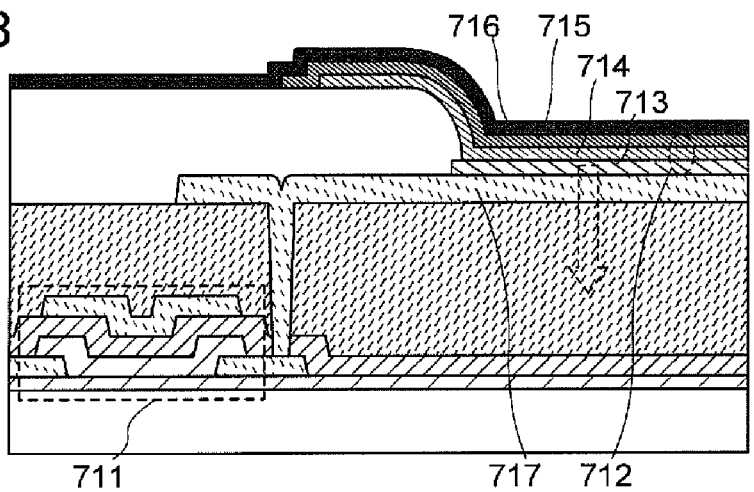

FIG. 18B is a cross-sectional view of a pixel in the case where light is emitted from a light-emitting element 712 to a cathode 713 side. Here, the cathode 713 of the light-emitting element 712 is formed over a light-transmitting conductive film 717 that is electrically connected to the driving TFT 711, and a light-emitting layer 714 and an anode 715 are stacked in this order over the cathode 713. Note that when the anode 715 has light-transmitting properties, a light-shielding film 716 may be provided so as to cover the anode 715. For the cathode 713, a conductive material having a low work function can be used as in FIG. 18A. Note that the cathode 713 has a thickness that can transmit light (preferably approximately 5 nm to 30 nm). For example, an aluminum film with a thickness of approximately 20 nm can be used as the cathode 713. As in FIG. 18A, the light-emitting layer 714 may be formed using a single layer or a plurality of layers stacked. The anode 715 does not necessarily transmit light, but may be formed using a light-transmitting conductive material as in FIG. 18A. The light-shielding film 716 can be formed using a metal that reflects light or the like; however, this embodiment is not limited thereto. Note that when the light-shielding film 716 has a function of reflecting light, light extraction efficiency can be improved.

A structure in which the light-emitting layer 714 is sandwiched between the cathode 713 and the anode 715 can be called the light-emitting element 712. In the case of the pixel illustrated in FIG. 18B, light is emitted from the light-emitting element 712 to the cathode 713 side as indicated by an arrow. The structure of the light-emitting element 712 may be a microcavity structure. Moreover, an insulating layer may be formed over the anode 715.

Next, a light-emitting element with a dual emission method is described with reference to FIG. 18C.

Figure 18C:
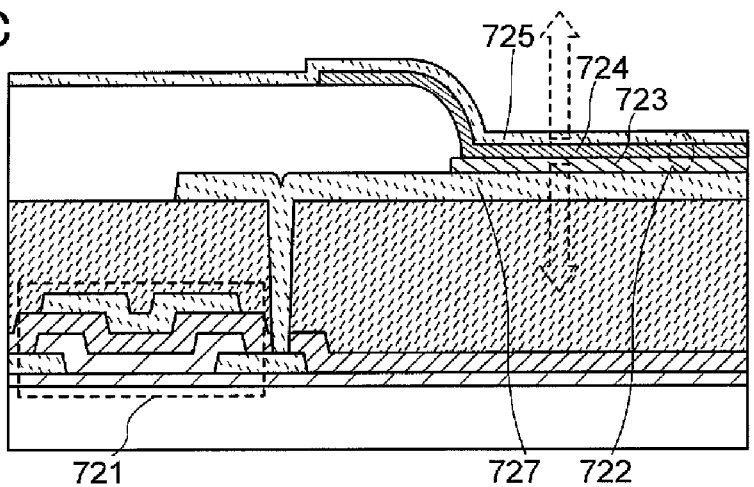

In FIG. 18C, a cathode 723 of a light-emitting element 722 is formed over a light-transmitting conductive layer 727 that is electrically connected to the driving TFT 721, and a light-emitting layer 724 and an anode 725 are stacked in this order over the cathode 723. For the cathode 723, a conductive material having a low work function can be used as in FIG. 18A. Note that the cathode 723 has a thickness that can transmit light. For example, a 20-nm-thick aluminum film can be used as the cathode 723. As in FIG. 18A, the light-emitting layer 724 may be formed using a single layer or a plurality of layers stacked. As in FIG. 18A, the anode 725 can be formed using a light-transmitting conductive material.

A structure where the cathode 723, the light-emitting layer 724, and the anode 725 overlap with each another can be called the light-emitting element 722. In the case of the pixel illustrated in FIG. 18C, light is emitted from the light-emitting element 722 to both the anode 725 side and the cathode 723 side as indicated by arrows. The structure of the light-emitting element 722 may be a microcavity structure. Moreover, an insulating layer may be formed over the anode 725.

The organic EL element is described here as the light-emitting element; it is possible to provide an inorganic EL element as the light-emitting element. In addition, the example is shown here in which the thin film transistor (the driving TFT) for controlling driving of the light-emitting element is electrically connected to the light-emitting element; alternatively, a TFT for current control may be connected between the driving TFT and the light-emitting element.

Note that the semiconductor device described in this embodiment is not limited to have the structures illustrated in FIGS. 18A to 18C, and can be modified in various ways.

Figure 19A:
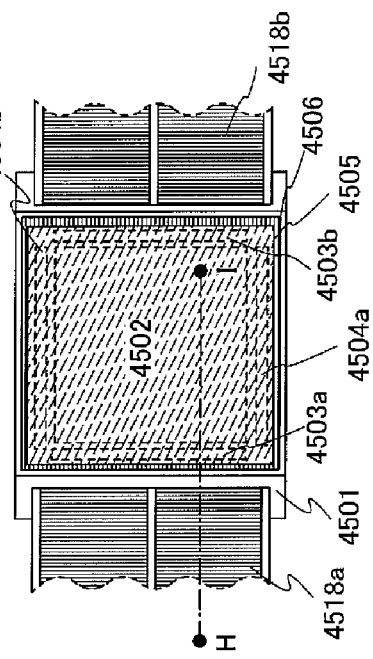
FIG. 19A is a plan view and FIG. 19B is a cross-sectional view of a semiconductor device.
Figure 19B:
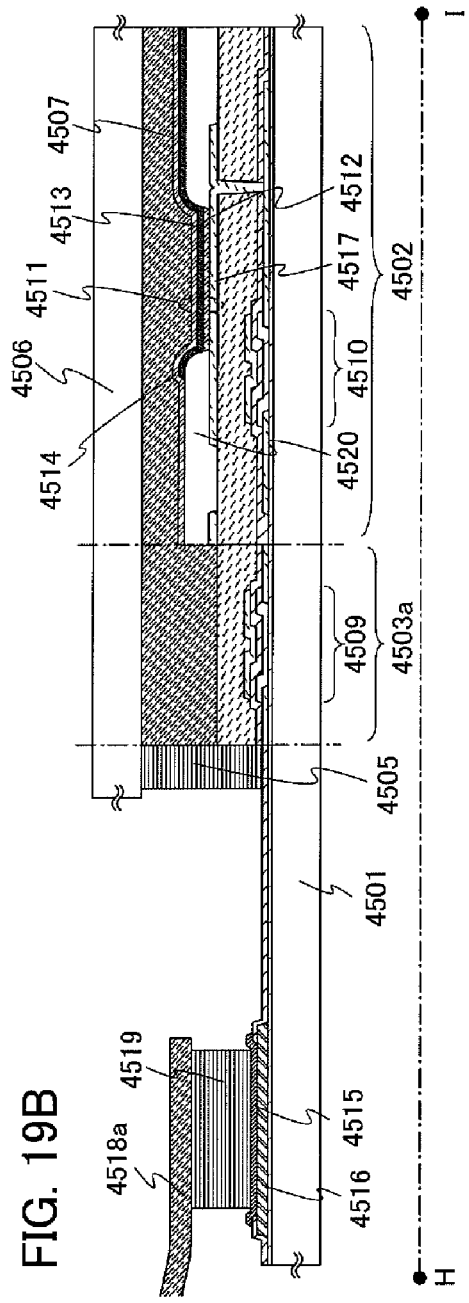

Next, the appearance and a cross section of a light-emitting display panel (also referred to as a light-emitting panel), which corresponds to one embodiment of the semiconductor device, are described with reference to FIGS. 19A and 19B. FIG. 19A is a plan view and FIG. 19B is a cross-sectional view of a panel in which thin film transistors 4509 and 4510 and a light-emitting element 4511 that are formed over a first substrate 4501 are sealed by a second substrate 4506 and a sealing material 4505. Here, FIG. 19A is a plan view, and FIG. 19B is a cross-sectional view along line H-I in FIG. 19A.

The sealing material 4505 is provided so as to surround a pixel portion 4502, signal line driver circuits 4503a and 4503b, and scan line driver circuits 4504a and 4504b that are provided over the first substrate 4501. Moreover, a second substrate 4506 is provided over the pixel portion 4502, the signal line driver circuits 4503a and 4503b, and the scan line driver circuits 4504a and 4504b. In other words, the pixel portion 4502, the signal line driver circuits 4503a and 4503b, and the scan line driver circuits 4504a and 4504b are sealed together with a filler 4507, by the first substrate 4501, the sealing material 4505, and the second substrate 4506. In such a manner, packaging (sealing) is preferably performed using a protective film (e.g., a bonding film or an ultraviolet curable resin film), a cover material, or the like with high air-tightness and little degasification.

The pixel portion 4502, the signal line driver circuits 4503a and 4503b, and the scan line driver circuits 4504a and 4504b, which are formed over the first substrate 4501, each include a plurality of thin film transistors. FIG. 19B illustrates the thin film transistor 4510 included in the pixel portion 4502 and the thin film transistor 4509 included in the signal line driver circuit 4503a.

As the thin film transistors 4509 and 4510, the thin film transistors described in the foregoing Embodiments can be employed. Note that in this embodiment, the thin film transistors 4509 and 4510 are n-channel transistors.

Reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is not limited to the layered structure shown in this embodiment, which includes the first electrode layer 4517, a second electrode layer 4512, an electroluminescent layer 4513, and a third electrode layer 4514. The structure of the light-emitting element 4511 can be changed as appropriate depending on the direction in which light is extracted from the light-emitting element 4511, or the like.

A partition 4520 is formed using an organic resin film, an inorganic insulating film, organic polysiloxane, or the like. It is particularly preferable that the partition 4520 be formed using a photosensitive material to have an opening over the first electrode layer 4517 so that a sidewall of the opening is formed as an inclined surface with continuous curvature.

The electroluminescent layer 4513 may be formed using a single layer or a plurality of layers stacked.

In order to prevent oxygen, hydrogen, moisture, carbon dioxide, or the like from entering the light-emitting element 4511, a protective film may be formed over the third electrode layer 4514 and the partition 4520. As the protective film, a silicon nitride film, a silicon nitride oxide film, a DLC film, or the like can be formed.

A variety of signals are supplied from FPCs 4518a and 4518b to the signal line driver circuits 4503a and 4503b, the scan line driver circuits 4504a and 4504b, the pixel portion 4502, or the like.

This embodiment shows an example in which a connection terminal electrode 4515 is formed from the same conductive film as the first electrode layer 4517 of the light-emitting element 4511, and a terminal electrode 4516 is formed from the same conductive film as the source and drain electrode layers of the thin film transistors 4509 and 4510.

The connection terminal electrode 4515 is electrically connected to a terminal of the FPC 4518a through an anisotropic conductive film 4519.

The substrate placed in the direction in which light is extracted from the light-emitting element 4511 should have light-transmitting properties. Examples of a substrate having light-transmitting properties are a glass plate, a plastic plate, a polyester film, and an acrylic film.

As the filler 4507, an ultraviolet curable resin, a thermosetting resin, or the like can be used, in addition to an inert gas such as nitrogen or argon. For example, polyvinyl chloride (PVC), acrylic, polyimide, an epoxy resin, a silicone resin, polyvinyl butyral (PVB), ethylene vinyl acetate (EVA), or the like can be used. This embodiment shows an example where nitrogen is used for the filler.

If needed, a polarizing plate, a circularly polarizing plate (including an elliptically polarizing plate), a retardation plate (a quarter-wave plate or a half-wave plate), or an optical film such as a color filter may be provided on a light-emitting surface of the light-emitting element. Further, an antireflection treatment may be performed on a surface. For example, anti-glare treatment may be performed by which reflected light can be diffused by projections and depressions on the surface so that the glare can be reduced.

The signal line driver circuits 4503a and 4503b and the scan line driver circuits 4504a and 4504b may be formed using a single crystal semiconductor or a polycrystalline semiconductor over a substrate separately prepared. Alternatively, only the signal line driver circuits or part thereof or only the scan line driver circuits or part thereof may be separately formed and mounted. This embodiment is not limited to the structure illustrated in FIGS. 19A and 19B.

Through the above steps, a high-performance light-emitting display device (display panel) can be manufactured.

Figure 21A:
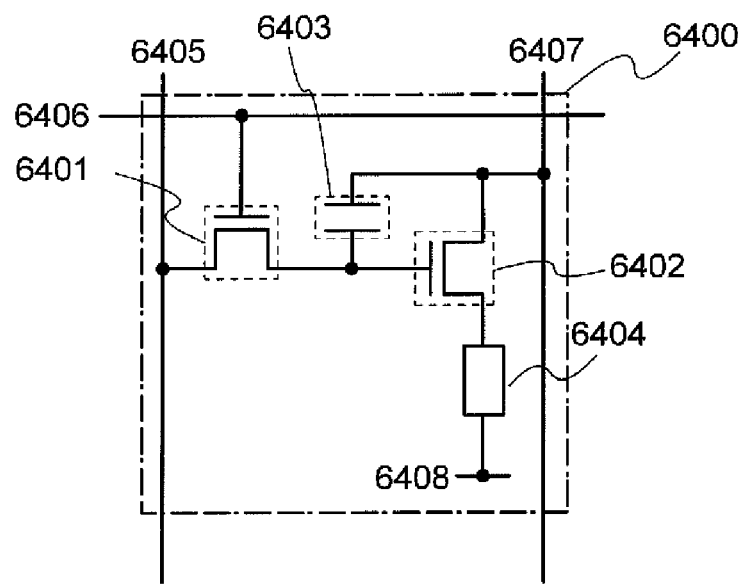
FIGS. 21A and 21B are circuit diagrams each illustrating a semiconductor device.
Figure 21B:
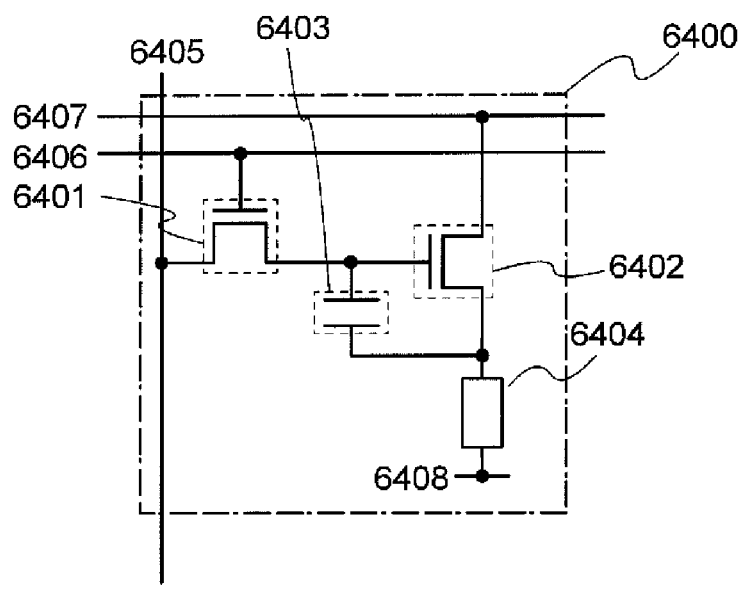

Next, a structure and an operation of a pixel to which digital time ratio grayscale driving can be applied are described. FIGS. 21A and 21B each illustrate an example of a pixel structure to which digital time ratio grayscale driving can be applied. Here, an example is described in which one pixel includes two n-channel transistors in which an oxide semiconductor layer (an In—Ga—Zn—O-based non-single-crystal film) is used in a channel formation region.

In FIG. 21A, a pixel 6400 includes a switching transistor 6401, a driving transistor 6402, a light-emitting element 6404, and a capacitor 6403. A gate of the switching transistor 6401 is connected to a scan line 6406. A first electrode (one of a source electrode and a drain electrode) of the switching transistor 6401 is connected to a signal line 6405. A second electrode (the other of the source electrode and the drain electrode) of the switching transistor 6401 is connected to a gate of the driving transistor 6402. The gate of the driving transistor 6402 is connected to a power supply line 6407 through the capacitor 6403. A first electrode of the driving transistor 6402 is connected to the power supply line 6407. A second electrode of the driving transistor 6402 is connected to a first electrode (a pixel electrode) of the light-emitting element 6404. A second electrode of the light-emitting element 6404 corresponds to a common electrode 6408.

Note that as for the relation of potentials of the second electrode (on the common electrode 6408 side) and the first electrode (on the power supply line 6407 side) of the light-emitting element 6404, one of the potentials can be set higher than the other. In the light-emitting display device, the potential difference between a high potential and a low potential is applied to the light-emitting element 6404 and current generated by the potential difference makes the light-emitting element 6404 emit light; therefore, the potentials are set so that the potential difference between the high potential and the low potential is equal to or higher than the threshold voltage of the light-emitting element 6404.

Note that gate capacitance of the driving transistor 6402 may be used as a substitute for the capacitor 6403, so that the capacitor 6403 can be omitted. The gate capacitance of the driving transistor 6402 may be formed between the channel region and the gate electrode.

In the case of using a voltage-input voltage-driving method, a video signal that turns the driving transistor 6402 on or off is input to the gate of the driving transistor 6402. That is, the driving transistor 6402 operates in a linear region.

In addition, by making input signals vary, analog grayscale driving can be realized using the pixel structure illustrated in FIG. 21A. For example, when an analog video signal is used, it is possible to supply current corresponding to the video signal to the light-emitting element 6404 and perform analog grayscale driving. The video signal is preferably a signal with which the driving transistor 6402 operates in a saturation region.

The potential of the power supply line 6407 may be changed in a pulse manner. In this case, it is preferable to employ a structure illustrated in FIG. 21B.

In the structure in FIG. 21A, the potential of the second electrode of the light-emitting element 6404 in a given pixel is often the same as the potential of the second electrode in another pixel (the potential of the common electrode 6408); alternatively, cathodes may be patterned for each pixel and connected to their respective driving transistors.

Note that one embodiment of the disclosed invention is not construed as being limited to the pixel structures illustrated in FIGS. 21A and 21B. For example, a switch, a resistor, a capacitor, a transistor, a logic circuit, or the like may be added to the pixel illustrated in FIGS. 21A and 21B.

Note that this embodiment can be implemented in combination with any of the other embodiments as appropriate.

EMBODIMENT 7

The semiconductor device can be applied as electronic paper. Electronic paper can be used for electronic devices of a variety of fields for displaying data. For example, electronic paper can be used for electronic book readers (e-book readers), posters, advertisement in vehicles such as trains, display portions in a variety of cards such as credit cards, and the like. Examples of the electronic devices are illustrated in FIGS. 22A and 22B and FIG. 23.

Figure 22A:
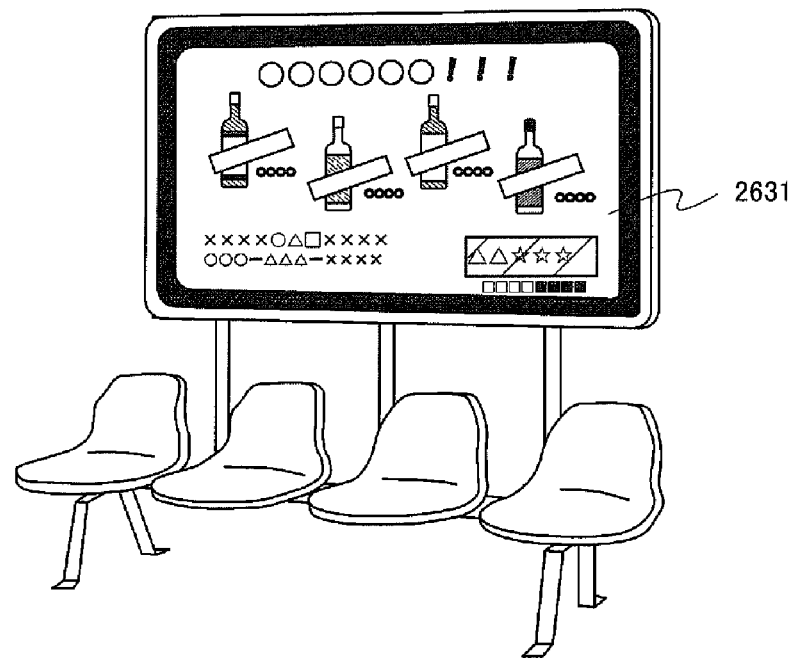
FIGS. 22A and 22B illustrate examples of applications of electronic paper.

FIG. 22A illustrates a poster 2631 formed using electronic paper. When an advertising medium is printed paper, the advertisement is replaced by hands; when electronic paper is used, the advertising display can be changed in a short time. Moreover, stable images can be obtained without display deterioration. Note that the poster may be configured to wirelessly transmit and receive data.

Figure 22B:
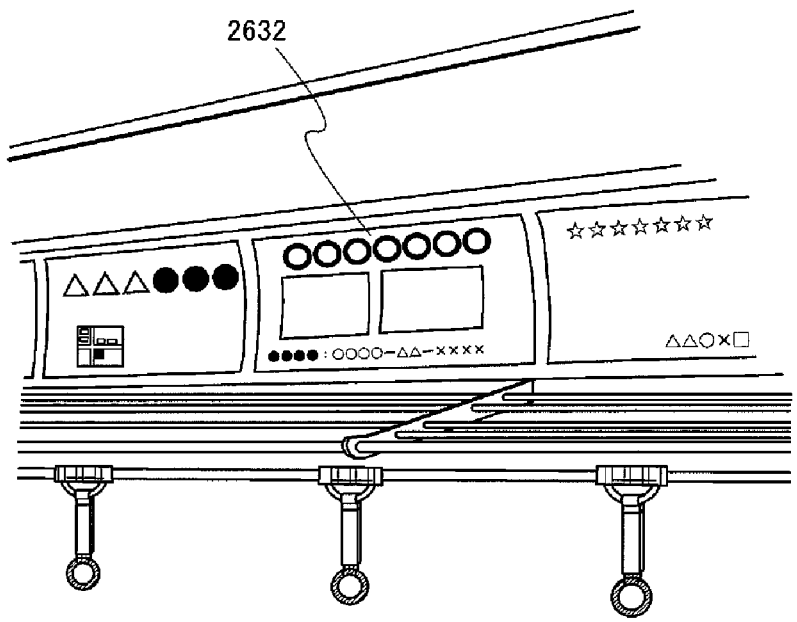

FIG. 22B illustrates an advertisement 2632 in a vehicle such as a train. When an advertising medium is printed paper, the advertisement is replaced by hands; when electronic paper is used, the advertising display can be changed in a short time without much manpower. Further, stable images can be obtained without display deterioration. Note that the advertisement may be configured to wirelessly transmit and receive data.

Figure 23:
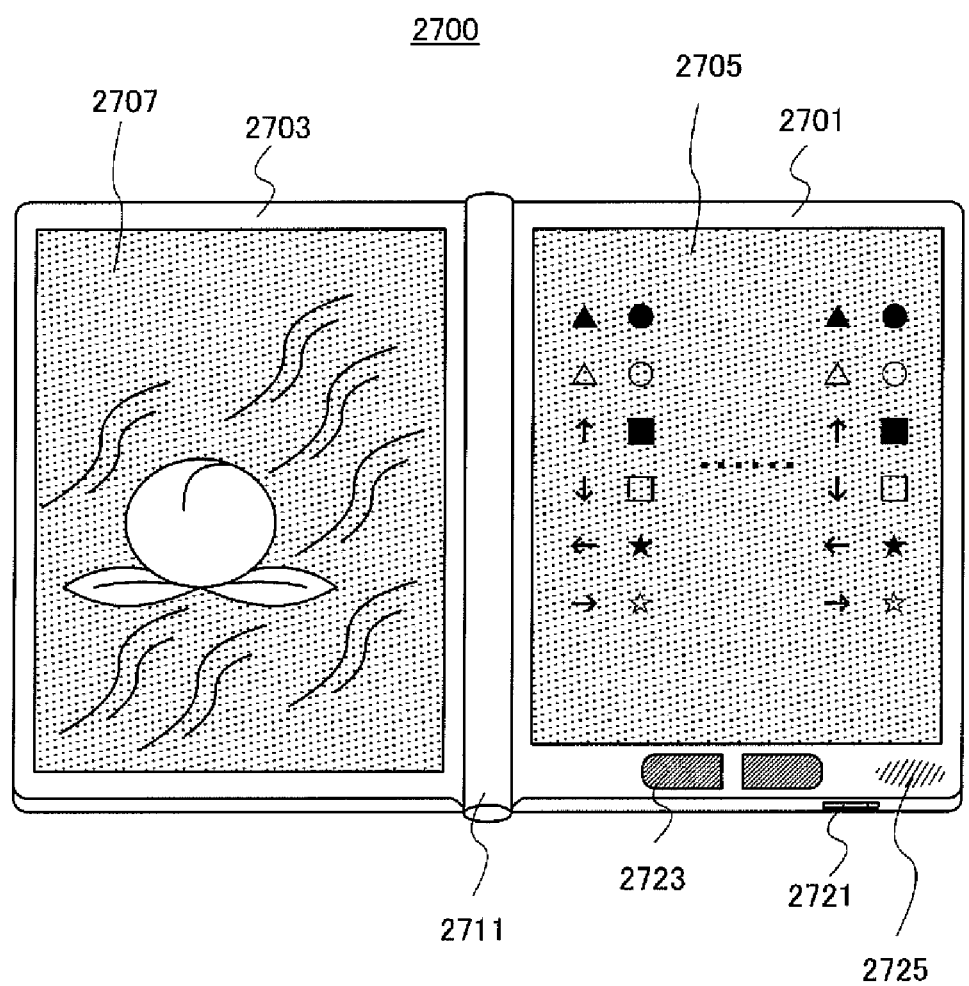
FIG. 23 is an external view of an example of an e-book reader.

FIG. 23 illustrates an e-book reader 2700. For example, the e-book reader 2700 includes two housings: a housing 2701 and a housing 2703. The housing 2701 and the housing 2703 are connected with a hinge 2711 so that the e-book reader 2700 can be opened and closed with the hinge 2711 as an axis. With such a structure, the e-book reader 2700 can operate like a paper book.

A display portion 2705 is incorporated into the housing 2701, and a display portion 2707 is incorporated into the housing 2703. The display portions 2705 and 2707 may display one image or different images. When the display portions 2705 and 2707 display different images, for example, a display portion on the right side (the display portion 2705 in FIG. 23) can display text and a display portion on the left side (the display portion 2707 in FIG. 23) can display graphics.

FIG. 23 illustrates an example in which the housing 2701 is provided with an operation portion and the like. For example, the housing 2701 is provided with a power switch 2721, an operation key 2723, a speaker 2725, and the like. Pages can be turned with the operation key 2723. Note that a keyboard, a pointing device, or the like may be provided on the same surface as the display portion of the housing. Further, an external connection terminal (e.g., an earphone terminal, a USB terminal, or a terminal connectable to various cables such as an AC adapter and a USB cable), a recording medium insertion portion, or the like may be provided on the back surface or the side surface of the housing. Moreover, the e-book reader 2700 may have a function of an electronic dictionary.

The e-book reader 2700 may be configured to wirelessly transmit and receive data. Through wireless communication, desired book data or the like can be purchased and downloaded from an electronic book server.

This embodiment can be implemented in combination with any of the other embodiments as appropriate.

EMBODIMENT 8

In this embodiment, a structure and operation of a pixel that can be applied to a liquid crystal display device will be described. As an operation mode of a liquid crystal element in this embodiment, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optically compensated birefringence) mode, an FLC (ferroelectric liquid crystal) mode, an AFLC (antiferroelectric liquid crystal) mode, or the like can be used.

Figure 27A:
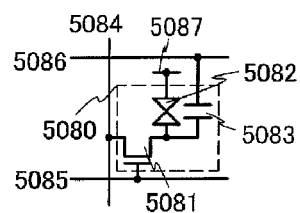
FIGS. 27A to 27G each illustrate a semiconductor device.

FIG. 27A shows an example of a pixel structure that can be applied to a liquid crystal display device. A pixel 5080 includes a transistor 5081, a liquid crystal element 5082, and a capacitor 5083. A gate of the transistor 5081 is electrically connected to a wiring 5085. A first terminal of the transistor 5081 is electrically connected to a wiring 5084. A second terminal of the transistor 5081 is electrically connected to a first terminal of the liquid crystal element 5082. A second terminal of the liquid crystal element 5082 is electrically connected to a wiring 5087. A first terminal of the capacitor 5083 is electrically connected to the first terminal of the liquid crystal element 5082. A second terminal of the capacitor 5083 is electrically connected to a wiring 5086. Note that a first terminal of a transistor refers to one of a source and a drain, and a second terminal of the transistor refers to the other of the source and the drain. That is, when the first terminal of the transistor is the source, the second terminal of the transistor is the drain. Similarly, when the first terminal of the transistor is the drain, the second terminal of the transistor is the source.

The wiring 5084 can function as a signal line. The signal line is a wiring for transmitting a signal voltage, which is input from the outside of the pixel, to the pixel 5080. The wiring 5085 can function as a scan line. The scan line is a wiring for controlling on and off of the transistor 5081. The wiring 5086 can function as a capacitor line. The capacitor line is a wiring for applying a predetermined voltage to the second terminal of the capacitor 5083. The transistor 5081 can function as a switch. The capacitor 5083 can function as a storage capacitor. The storage capacitor is a capacitor with which the signal voltage continues to be applied to the liquid crystal element 5082 even when the switch is off. The wiring 5087 can function as a counter electrode. The counter electrode is a wiring for applying a predetermined voltage to the second terminal of the liquid crystal element 5082. Note that a function of each wiring is not limited thereto, and each wiring can have a variety of functions. For example, by changing a voltage applied to the capacitor line, a voltage applied to the liquid crystal element can be adjusted. Note that the transistor 5081 can be a p-channel transistor or an n-channel transistor because the transistor 5081 merely functions as a switch.

Figure 27B:
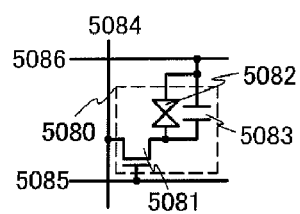

FIG. 27B illustrates an example of a pixel structure that can be applied to a liquid crystal display device. The example of the pixel structure illustrated in FIG. 27B is the same as that in FIG. 27A, except that the wiring 5087 is eliminated and the second terminal of the liquid crystal element 5082 and the second terminal of the capacitor 5083 are electrically connected to each other. The example of the pixel structure in FIG. 27B can be particularly applied to the case of using a liquid crystal element with a horizontal electric field mode (including an IPS mode and FFS mode). This is because in the horizontal electric field mode liquid crystal element, the second terminal of the liquid crystal element 5082 and the second terminal of the capacitor 5083 can be formed over one substrate; thus, it is easy to electrically connect the second terminal of the liquid crystal element 5082 and the second terminal of the capacitor 5083. With the pixel structure in FIG. 27B, the wiring 5087 can be eliminated, so that a manufacturing process can be simplified and manufacturing costs can be reduced.

Figure 27D:
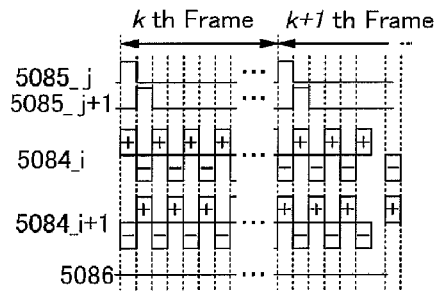
Figure 27F:
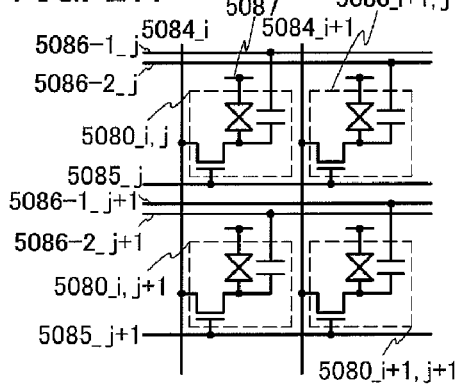
Figure 27C:
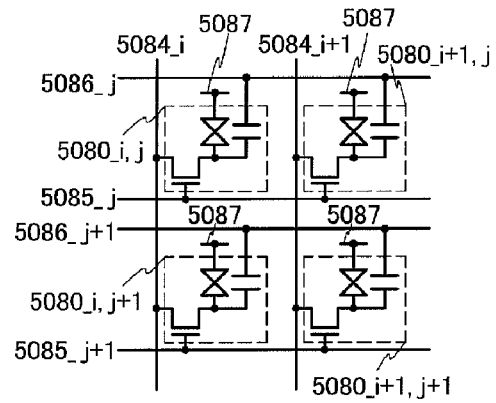

A plurality of pixel structures illustrated in FIG. 27A or FIG. 27B can be arranged in a matrix. Accordingly, a display portion of a liquid crystal display device is formed, so that a variety of images can be displayed. FIG. 27C illustrates a circuit configuration in the case where a plurality of pixel structures illustrated in FIG. 27A are arranged in a matrix. FIG. 27C is a circuit diagram illustrating four pixels among a plurality of pixels included in the display portion. A pixel arranged in an ith column and a jth row (each of i and j is a natural number) is represented as a pixel 5080_$i, j$, and a wiring 5084_$i$, a wiring 5085_$j$, and a wiring 5086_$j$ are electrically connected to the pixel 5080_$i,j$. Similarly, a pixel 5080_$i+1, j$ is electrically connected to a wiring 5084_$i+1$, the wiring 5085_$j$, and the wiring 5086_$j$. Similarly, a pixel 5080_$i, j+1$ is electrically connected to the wiring 5084_$i$, a wiring 5085_$j+1$, and a wiring 5086_$j+1$. Similarly, a pixel 5080_$i+1, j+1$ is electrically connected to the wiring 5084_$i+1$, the wiring 5085_$j+1$, and the wiring 5086_$j+1$. Note that each wiring can be used in common with a plurality of pixels in the same column or the same row. In the pixel structure illustrated in FIG. 27C, the wiring 5087 is a counter electrode, which is used by all the pixels in common; therefore, the wiring 5087 is not indicated by the natural number i or j. Further, since the pixel structure in FIG. 27B can also be used, the wiring 5087 is not essential even in a structure where the wiring 5087 is described, and the wiring 5087 can be omitted when another wiring functions as the wiring 5087, for example.

The pixel structure in FIG. 27C can be driven by a variety of driving methods. In particular, when the pixels are driven by a method called alternating-current driving, degradation (burn-in) of the liquid crystal element can be suppressed. FIG. 27D is a timing chart of voltages applied to each wiring in the pixel structure in FIG. 27C in the case where dot inversion driving which is a kind of alternating-current driving is performed. By the dot inversion driving, flickers seen when the alternating-current driving is performed can be suppressed.

In the pixel structure in FIG. 27C, a switch in a pixel electrically connected to the wiring 5085_$j$ is brought into a selection state (an on state) in a jth gate selection period in one frame period, and brought into a non-selection state (an off state) in the other periods. Then, after the jth gate selection period, a (j+1)th gate selection period is provided. By performing sequential scanning in this manner, all the pixels are sequentially selected in one frame period. In the timing chart in FIG. 27D, when the voltage is set to high level, the switch in the pixel is brought into a selection state; when the voltage is set to low level, the switch is brought into a non-selection state. Note that this is the case where the transistors in the pixels are n-channel transistors. In the case of using p-channel transistors, the relation between the voltage and the selection state is opposite to that in the case of using n-channel transistors.

In the timing chart illustrated in FIG. 27D, in the jth gate selection period in a kth frame (k is a natural number), a positive signal voltage is applied to the wiring 5084_$i$ used as a signal line, and a negative signal voltage is applied to the wiring 5084_$i+1$. Then, in the (j+1)th gate selection period in the kth frame, a negative signal voltage is applied to the wiring 5084_$i$, and a positive signal voltage is applied to the wiring 5084_$i+1$. After that, signals whose polarity is reversed in each gate selection period are alternately supplied to each of the signal lines. Thus, in the kth frame, the positive signal voltage is applied to the pixel 5080_$i, j$ and the pixel 5080_$i+1, j+1$, and the negative signal voltage is applied to the pixel 5080_$i+1, j$ and the pixel 5080_$i, j+1$. Then, in a (k+1)th frame, a signal voltage whose polarity is opposite to that of the signal voltage written in the kth frame is written to each pixel. Thus, in the (k+1)th frame, the positive signal voltage is applied to the pixel 5080_$i+1, j$ and the pixel 5080_$i, j+1$, and the negative signal voltage is applied to the pixel 5080_$i, j$ and the pixel 5080_$i+1, j+1$. The dot inversion driving is a driving method in which signal voltages whose polarity is different between adjacent pixels are applied in one frame and the polarity of the signal voltage for one pixel is reversed in each frame as described above. By the dot inversion driving, flickers seen when the entire or part of an image to be displayed is uniform can be suppressed while degradation of the liquid crystal element is suppressed. Note that voltages applied to all the wirings 5086 including the wiring 5086_$j$ and the wiring 5086_$j+1$ can be a constant voltage. Moreover, although only the polarity of the signal voltages for the wirings 5084 is shown in the timing chart, the signal voltages can actually have a variety of values in the polarity shown. Here, the case where the polarity is reversed per dot (per pixel) is described; however, this embodiment is not limited thereto, and the polarity can be reversed per a plurality of pixels. For example, when the polarity of signal voltages to be written is reversed per two gate selection periods, power consumed by writing the signal voltages can be reduced. Moreover, the polarity may be reversed per column (source line inversion) or per row (gate line inversion).

Figure 27E:
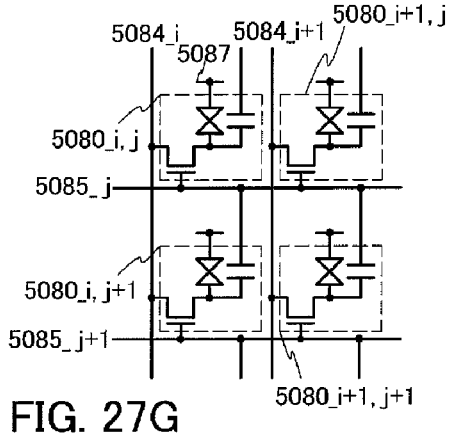

Note that a constant voltage may be applied to the second terminal of the capacitor 5083 in the pixel 5080 in one frame period. Here, a voltage applied to the wiring 5085 used as a scan line is at low level in most of one frame period, which means that a substantially constant voltage is applied to the wiring 5085; therefore, the second terminal of the capacitor 5083 in the pixel 5080 may be connected to the wiring 5085. FIG. 27E illustrates an example of a pixel structure that can be applied to a liquid crystal display device. Compared to the pixel structure in FIG. 27C, features of the pixel structure in FIG. 27E are that the wiring 5086 is eliminated and the second terminal of the capacitor 5083 in the pixel 5080 and the wiring 5085 in the previous row are electrically connected to each other. Specifically, in the range illustrated in FIG. 27E, the second terminals of the capacitors 5083 in the pixel 5080_$i$, $j$+1 and the pixel 5080_$i$+1, $j$+1 are electrically connected to the wiring 5085_$j$. The wiring 5086 can be eliminated when the second terminals of the capacitors 5083 in the pixels 5080 and the wiring 5085 in the previous row are electrically connected to each other in such a manner, so that the aperture ratio of the pixel can be increased. Note that the second terminal of the capacitor 5083 may be connected to the wiring 5085 in another row instead of the wiring 5085 in the previous row. Further, the pixel structure in FIG. 27E can be driven by a driving method similar to that in the pixel structure in FIG. 27C.

Note that a voltage applied to the wiring 5084 used as a signal line can be made lower by using the capacitor 5083 and the wiring electrically connected to the second terminal of the capacitor 5083. A structure and a driving method of a pixel in that case are described with reference to FIGS. 27F and 27G. Compared to the pixel structure in FIG. 27A, features of the pixel structure in FIG. 27F are that two wirings 5086 are provided per pixel row, and that one of the wirings 5086 is electrically connected to every other second terminal of the capacitors 5083 and the other of the wirings 5086 is electrically connected to the remaining every other second terminal of the capacitors 5083 in the adjacent pixels 5080. Two wirings 5086 are referred to as a wiring 5086-1 and a wiring 5086-2. Specifically, in the range illustrated in FIG. 27F, the second terminal of the capacitor 5083 in the pixel 5080_$i$, $j$ is electrically connected to a wiring 5086-1_$j$; the second terminal of the capacitor 5083 in the pixel 5080_$i$+1, $j$ is electrically connected to a wiring 5086-2_$j$; the second terminal of the capacitor 5083 in the pixel 5080_$i$, $j$+1 is electrically connected to a wiring 5086-2_$j$+1; and the second terminal of the capacitor 5083 in the pixel 5080_$i$+1, $j$+1 is electrically connected to a wiring 5086-1_$j$+1.

Figure 27G:
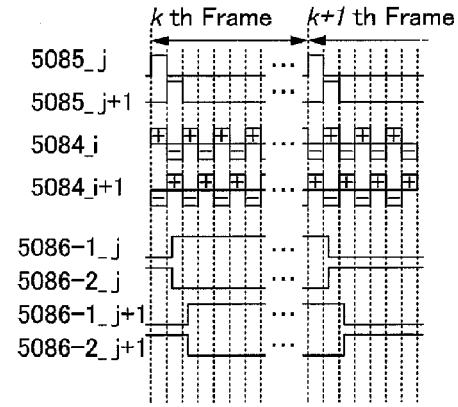

For example, as illustrated in FIG. 27G, when a positive signal voltage is written to the pixel 5080_$i$, $j$ in the kth frame, the wiring 5086-1_$j$ is set to low level in the jth gate selection period and is changed to high level after the jth gate selection period. Then, the wiring 5086-1_$j$ is kept at high level in one frame period, and after a negative signal voltage is written in the jth gate selection period in the (k+1)th frame, the wiring 5086-1_$j$ is changed to low level. In such a manner, a voltage of the wiring that is electrically connected to the second terminal of the capacitor 5083 is changed in the positive direction after a positive signal voltage is written to the pixel, whereby a voltage applied to the liquid crystal element can be changed in the positive direction by a predetermined amount. That is, a signal voltage written to the pixel can be reduced accordingly, so that power consumed by signal writing can be reduced. Note that when a negative signal voltage is written in the jth gate selection period, a voltage of the wiring that is electrically connected to the second terminal of the capacitor 5083 is changed in the negative direction after a negative signal voltage is written to the pixel. Thus, a voltage applied to the liquid crystal element can be changed in the negative direction by a predetermined amount, so that the signal voltage written to the pixel can be reduced as in the case of the positive polarity. In other words, as for the wiring that is electrically connected to the second terminal of the capacitor 5083, different wirings are preferably used for a pixel to which a positive signal voltage is applied and a pixel to which a negative signal voltage is applied in the same row in one frame. FIG. 27F illustrates the example in which the wiring 5086-1 is electrically connected to the pixels to which a positive signal voltage is applied in the kth frame, and the wiring 5086-2 is electrically connected to the pixels to which a negative signal voltage is applied in the kth frame. Note that this is just an example, and for example, in the case of using a driving method in which pixels to which a positive signal voltage is applied and pixels to which a negative signal voltage is applied are arranged every two pixels, the wirings 5086-1 and 5086-2 are preferably electrically connected to every alternate two pixels accordingly. Furthermore, in the case where signal voltages of the same polarity are written in all the pixels in one row (gate line inversion), one wiring 5086 is provided per row. In other words, the pixel structure in FIG. 27C can employ the driving method where a signal voltage written to a pixel is reduced as described with reference to FIGS. 27F and 27G.

Figure 28A:
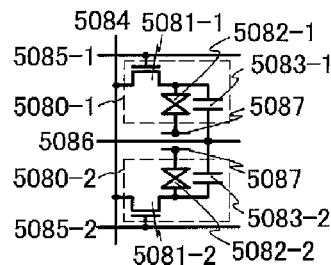
FIGS. 28A to 28H each illustrate a semiconductor device.
Figure 28B:
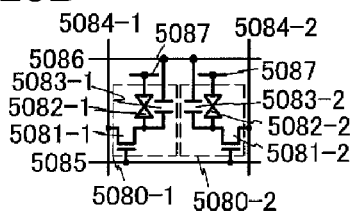

Next, a pixel structure and a driving method are described which are preferably used particularly by a liquid crystal element with a vertical alignment (VA) mode typified by an MVA mode or a PVA mode. The VA mode has advantages that a rubbing process is not necessary in manufacturing, the amount of light leakage is small in displaying black images, and the level of drive voltage is low; however, the VA mode has a problem in that the quality of images deteriorates when a screen is viewed from an angle (the viewing angle is small). In order to increase the viewing angle in the VA mode, a pixel structure where one pixel includes a plurality of subpixels as illustrated in FIGS. 28A and 28B is effective. Pixel structures illustrated in FIGS. 28A and 28B are examples of the case where the pixel 5080 includes two subpixels (a subpixel 5080-1 and a subpixel 5080-2). Note that the number of subpixels in one pixel is not limited to two and can be other numbers. As the number of subpixels becomes larger, the viewing angle can be further increased. A plurality of subpixels can have the same circuit configuration. Here, the case is described in which all the subpixels have the same circuit configuration as that in FIG. 27A. The first subpixel 5080-1 includes a transistor 5081-1, a liquid crystal element 5082-1, and a capacitor 5083-1. The connection relation is the same as that in the circuit configuration in FIG. 27A. Similarly, the second subpixel 5080-2 includes a transistor 5081-2, a liquid crystal element 5082-2, and a capacitor 5083-2. The connection relation is the same as that in the circuit configuration in FIG. 27A.

The pixel structure in FIG. 28A includes, for two subpixels included in one pixel, two wirings 5085 (a wiring 5085-1 and a wiring 5085-2) used as scan lines, one wiring 5084 used as a signal line, and one wiring 5086 used as a capacitor line. When the signal line and the capacitor line are shared with two subpixels in such a manner, the aperture ratio can be increased. Further, a signal line driver circuit can be simplified, so that manufacturing costs can be reduced. Moreover, the number of connections between a liquid crystal panel and a driver circuit IC can be reduced, so that the yield can be increased. The pixel structure in FIG. 28B includes, for two subpixels included in one pixel, one wiring 5085 used as a scan line, two wirings 5084 (a wiring 5084-1 and a wiring 5084-2) used as signal lines, and one wiring 5086 used as a capacitor line. When the scan line and the capacitor line are shared with two subpixels in such a manlier, the aperture ratio can be increased. Further, the total number of scan lines can be reduced, so that one gate line selection period can be sufficiently long even in a high-definition liquid crystal panel, and an appropriate signal voltage can be written in each pixel.

Figure 28C:
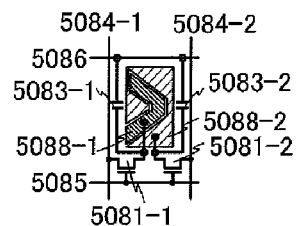
Figure 28D:
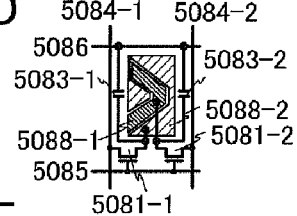

FIGS. 28C and 28D each schematically illustrate an example of electrical connections of elements in the case where the liquid crystal element in the pixel structure in FIG. 28B is replaced with the shape of a pixel electrode. In FIGS. 28C and 28D, an electrode 5088-1 represents a first pixel electrode, and an electrode 5088-2 represents a second pixel electrode. In FIG. 28C, the first pixel electrode 5088-1 corresponds to a first terminal of the liquid crystal element 5082-1 in FIG. 28B, and the second pixel electrode 5088-2 corresponds to a first terminal of the liquid crystal element 5082-2 in FIG. 28B. That is, the first pixel electrode 5088-1 is electrically connected to one of a source and a drain of the transistor 5081-1, and the second pixel electrode 5088-2 is electrically connected to one of a source and a drain of the transistor 5081-2. In FIG. 28D, the connection relation between the pixel electrode and the transistor is opposite to that in FIG. 28C. That is, the first pixel electrode 5088-1 is electrically connected to one of the source and the drain of the transistor 5081-2, and the second pixel electrode 5088-2 is electrically connected to one of the source and the drain of the transistor 5081-1.

Figure 28E:
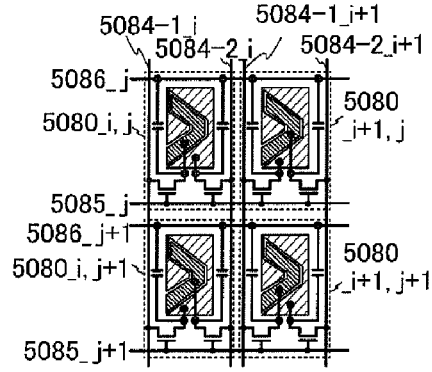
Figure 28F:
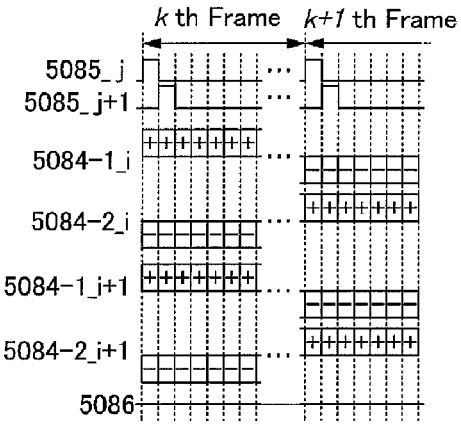

By alternately arranging a plurality of pixel structures illustrated in FIGS. 28C and 28D in a matrix, special advantageous effects can be obtained. FIGS. 28E and 28F illustrate an example of such a pixel structure and driving method. In the pixel structure in FIG. 28E, portions corresponding to the pixel 5080_$i, j$ and the pixel 5080_$i+1, j+1$ have the structure illustrated in FIG. 28C, and portions corresponding to the pixel 5080_$i+1, j$ and the pixel 5080_$i, j+1$ have the structure illustrated in FIG. 28D. When the pixels with this structure are driven as the timing chart illustrated in FIG. 28F, in the jth gate selection period in the kth frame, a positive signal voltage is written to the first pixel electrode in the pixel 5080_$i, j$ and the second pixel electrode in the pixel 5080_$i+1, j$, and a negative signal voltage is written to the second pixel electrode in the pixel 5080_$i, j$ and the first pixel electrode in the pixel 5080_$i+1, j$. Then, in the (j+1)th gate selection period in the kth frame, a positive signal voltage is written to the second pixel electrode in the pixel 5080_$i, j+1$ and the first pixel electrode in the pixel 5080_$i+1, j+1$, and a negative signal voltage is written to the first pixel electrode in the pixel 5080_$i, j+1$ and the second pixel electrode in the pixel 5080_$i+1, j+1$. In the (k+1)th frame, the polarity of the signal voltage is reversed in each pixel. Thus, the polarity of the voltage applied to the signal line can be the same in one frame period while driving corresponding to dot inversion driving is realized in the pixel structure including subpixels, whereby power consumed by writing the signal voltages to the pixels can be drastically reduced. Note that voltages applied to all the wirings 5086 including the wiring 5086_$j$ and the wiring 5086_$j+1$ can be a constant voltage.

Figure 28G:
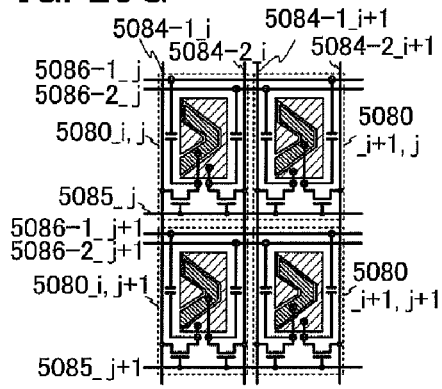
Figure 28H:
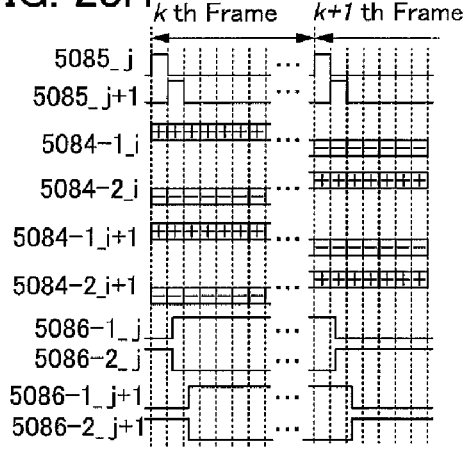

Further, with a pixel structure and a driving method illustrated in FIGS. 28G and 28H, the level of the signal voltage written to a pixel can be reduced. In the structure, capacitor lines which are electrically connected to a plurality of subpixels included in each pixel are different between the subpixels. That is, with the pixel structure and the driving method illustrated in FIGS. 28G and 28H, one capacitor line is shared with subpixels in one row, to which signal voltages of the same polarity are written in one frame; and subpixels to which signal voltages of the different polarities are written in one frame use different capacitor lines in one row. Then, when writing in each row is finished, voltages of the capacitor lines are changed in the positive direction in the subpixels to which a positive signal voltage is written, and changed in the negative direction in the subpixels to which a negative signal voltage is written; thus, the level of the signal voltage written to the pixel can be reduced. Specifically, two wirings 5086 (the wirings 5086-1 and 5086-2) used as capacitor lines are provided per row. The first pixel electrode in the pixel 5080_$i, j$ and the wiring 5086-1_$j$ are electrically connected to each other through the capacitor. The second pixel electrode in the pixel 5080_$i, j$ and the wiring 5086-2_$j$ are electrically connected to each other through the capacitor. The first pixel electrode in the pixel 5080_$i+1, j$ and the wiring 5086-2_$j$ are electrically connected to each other through the capacitor. The second pixel electrode in the pixel 5080_$i+1, j$ and the wiring 5086-1_$j$ are electrically connected to each other through the capacitor. The first pixel electrode in the pixel 5080_$i, j+1$ and the wiring 5086-2_$j+1$ are electrically connected to each other through the capacitor. The second pixel electrode in the pixel 5080_$i, j+1$ and the wiring 5086-1_$j+1$ are electrically connected to each other through the capacitor. The first pixel electrode in the pixel 5080_$i+1, j+1$ and the wiring 5086-1_$j+1$ are electrically connected to each other through the capacitor. The second pixel electrode in the pixel 5080_$i+1, j+1$ and the wiring 5086-2_$j+1$ are electrically connected to each other through the capacitor. Note that this is just an example, and for example, in the case of using a driving method in which pixels to which a positive signal voltage is applied and pixels to which a negative signal voltage is applied are arranged every two pixels, the wirings 5086-1 and 5086-2 are preferably electrically connected to every alternate two pixels accordingly. Furthermore, in the case where signal voltages of the same polarity are written in all the pixels in one row (gate line inversion), one wiring 5086 is provided per row. In other words, the pixel structure in FIG. 28E can employ the driving method where a signal voltage written to a pixel is reduced as described with reference to FIGS. 28G and 28H.

EMBODIMENT 9

Next, another structure example and a driving method of a display device will be described. In this embodiment, a display device including a display element whose luminance response with respect to signal writing is slow (whose response time is long) will be described. In this embodiment, a liquid crystal element is described as an example of the display element with long response time; however, a display element in this embodiment is not limited the liquid crystal element, and a variety of display elements whose luminance response with respect to signal writing is slow can be used.

In a general liquid crystal display device, luminance response with respect to signal writing is slow, and it sometimes takes more than one frame period to complete the response even when a signal voltage continues to be applied to a liquid crystal element. Moving images cannot be precisely displayed by such a display element. Further, in the case of employing active matrix driving, the time for signal writing to one liquid crystal element is usually only a period (one scan line selection period) obtained by dividing a signal writing cycle (one frame period or one subframe period) by the number of scan lines, and the liquid crystal element cannot respond in such a short time in many cases. Consequently, most of the response of the liquid crystal element is performed in a period during which signal writing is not performed. Here, the dielectric constant of the liquid crystal element is changed in accordance with the transmittance of the liquid crystal element, and the response of the liquid crystal element in a period during which signal writing is not performed means that the dielectric constant of the liquid crystal element is changed when electric charge is not exchanged with the outside of the liquid crystal element (in a constant charge state). In other words, in the formula where charge=(capacitance)·(voltage), the capacitance is changed when the charge is constant. Thus, a voltage applied to the liquid crystal element is changed from a voltage at the time of signal writing, in accordance with the response of the liquid crystal element. Therefore, when the liquid crystal element whose luminance response with respect to signal writing is slow is driven by an active matrix mode, a voltage applied to the liquid crystal element cannot theoretically reach the voltage at the time of signal writing.

In a display device in this embodiment, the signal level at the time of signal writing is corrected in advance (a correction signal is used) so that a display element can reach desired luminance within a signal writing cycle, whereby the above problem can be solved. Further, since the response time of the liquid crystal element is shorter as the signal level becomes higher, the response time of the liquid crystal element can also be reduced by writing a correction signal. A driving method by which such a correction signal is added is referred to as overdriving. By overdriving in this embodiment, even when a signal writing cycle is shorter than a cycle (an input image signal cycle $T_{in}$) for an image signal input to the display device, the signal level is corrected in accordance with the signal writing cycle, whereby the display element can reach desired luminance within the signal writing cycle. An example of the case where the signal writing cycle is shorter than the input image signal cycle $T_{in}$ is the case where one original image is divided into a plurality of subimages and the plurality of subimages are sequentially displayed in one frame period.

Figure 29A:
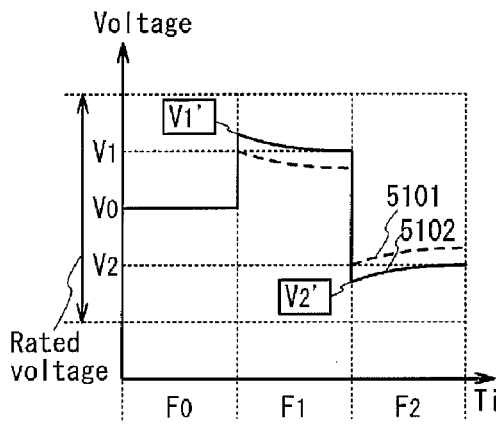
FIGS. 29A to 29F each illustrate a semiconductor device.
Figure 29B:
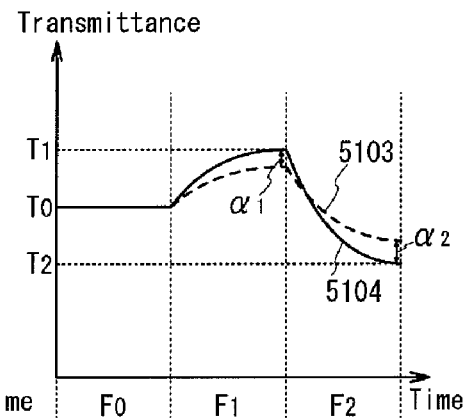

Next, an example of a method for correcting the signal level at the time of signal writing in an active matrix display device is described with reference to FIGS. 29A and 29B. FIG. 29A is a graph schematically illustrating change over time in signal level at the time of signal writing in one display element, with the time as the horizontal axis and the signal level at the time of signal writing as the vertical axis. FIG. 29B is a graph schematically illustrating change over time in display level in one display element, with the time as the horizontal axis and the display level as the vertical axis. Note that when the display element is a liquid crystal element, the signal level at the time of signal writing can be the voltage, and the display level can be the transmittance of the liquid crystal element. In the following description, the vertical axis in FIG. 29A represents voltage, and the vertical axis in FIG. 29B represents transmittance. Note that in the overdriving in this embodiment, the signal level may be other than voltage (may be the duty ratio or current, for example). Moreover, in the overdriving in this embodiment, the display level may be other than transmittance (may be luminance or current, for example). Liquid crystal elements are classified into two modes: a normally black mode in which black is displayed when a voltage is 0 (e.g., a VA mode and an IPS mode), and a normally white mode in which white is displayed when a voltage is 0 (e.g., a TN mode and an OCB mode). The graph in FIG. 29B can correspond to both modes; the transmittance increases in the upper part of the graph in the normally black mode, whereas the transmittance increases in the lower part of the graph in the normally white mode. That is, a liquid crystal mode in this embodiment may be a normally black mode or a normally white mode. Note that the timing of signal writing is represented on the time axis by dotted lines, and a period after signal writing is performed until the next signal writing is performed is referred to as a retention period $F_i$. In this embodiment, i is an integer and an index for representing each retention period. In FIGS. 29A and 29B, i is 0 to 2; however, i can be an integer other than 0 to 2 (only the case where i is 0 to 2 is illustrated). Note that in the retention period $F_i$, the transmittance for realizing luminance corresponding to an image signal is denoted by $T_i$, and the voltage for providing the transmittance $T_i$, in a constant state is denoted by $V_i$. In FIG. 29A, a dashed line 5101 represents change over time in voltage applied to the liquid crystal element in the case where overdriving is not performed, and a solid line 5102 represents change over time in voltage applied to the liquid crystal element in the case where the overdriving in this embodiment is performed. Similarly, in FIG. 29B, a dashed line 5103 represents change over time in transmittance of the liquid crystal element when overdriving is not performed, and a solid line 5104 represents change over time in transmittance of the liquid crystal element when the overdriving in this embodiment is performed. Note that the difference between the desired transmittance $T_i$ and the actual transmittance at the end of the retention period $F_i$ is referred to as an error $\alpha_i$.

It is assumed that, in the graph illustrated in FIG. 29A, both the dashed line 5101 and the solid line 5102 represent the case where a desired voltage $V_0$ is applied in a retention period $F_0$; and in the graph illustrated in FIG. 29B, both the dashed line 5103 and the solid line 5104 represent the case where desired transmittance $T_0$ is obtained. When overdriving is not performed, a desired voltage $V_1$ is applied at the beginning of a retention period $F_1$ as shown by the dashed line 5101. As has been described above, a period for signal writing is extremely shorter than a retention period, and the liquid crystal element is in a constant charge state in most of the retention period. Consequently, a voltage applied to the liquid crystal element in the retention period is changed along with the change in transmittance and becomes greatly different from the desired voltage $V_1$ at the end of the retention period $F_1$. In this case, the dashed line 5103 in the graph of FIG. 29B is also greatly different from desired transmittance $T_1$. Thus, accurate display of an image signal cannot be performed, and the image quality is degraded. On the other hand, when the overdriving in this embodiment is performed, a voltage $V_1'$ which is higher than the desired voltage $V_1$ is applied to the liquid crystal element at the beginning of the retention period $F_1$ as shown by the solid line 5102. That is, the voltage $V_1'$ which is corrected from the desired voltage $V_1$ is applied to the liquid crystal element at the beginning of the retention period $F_1$ so that the voltage applied to the liquid crystal element at the end of the retention period $F_1$ is close to the desired voltage $V_1$ in anticipation of gradual change in voltage applied to the liquid crystal element in the retention period $F_1$. Thus, the desired voltage $V_1$ can be accurately applied to the liquid crystal element. At that time, as shown by the solid line 5104 in the graph of FIG. 29B, the desired transmittance $T_1$ can be obtained at the end of the retention period $F_1$. In other words, the response of the liquid crystal element within the signal writing cycle can be realized, despite the fact that the liquid crystal element is in a constant charge state in most of the retention period. Then, in a retention period $F_2$, the case where a desired voltage $V_2$ is lower than $V_1$ is shown. In that case also, as in the retention period $F_1$, a voltage $V_2'$ which is corrected from the desired voltage $V_2$ may be applied to the liquid crystal element at the beginning of the retention period $F_2$ so that the voltage applied to the liquid crystal element at the end of the retention period $F_2$ is close to the desired voltage $V_2$ in anticipation of gradual change in voltage applied to the liquid crystal element in the retention period $F_2$. Accordingly, as shown by the solid line 5104 in the graph of FIG. 29B, desired transmittance $T_2$ can be obtained at the end of the retention period $F_2$. Note that when $V_i$ is higher than $V_{i-1}$ as in the retention period $F_1$, the corrected voltage $V_i'$ is preferably corrected to be higher than a desired voltage $V_i$. Further, when $V_i$ is lower than $V_{i-1}$ as in the retention period $F_2$, the corrected voltage $V_i'$ is preferably corrected to be lower than the desired voltage $V_i$. A specific correction value can be derived by measuring response characteristics of the liquid crystal element in advance. As a method for realizing the overdriving in the device, a method in which a correction formula is formulated and included in a logic circuit, a method in which a correction value is stored in a memory as a lookup table and read as necessary, or the like can be used.

Figure 29C:
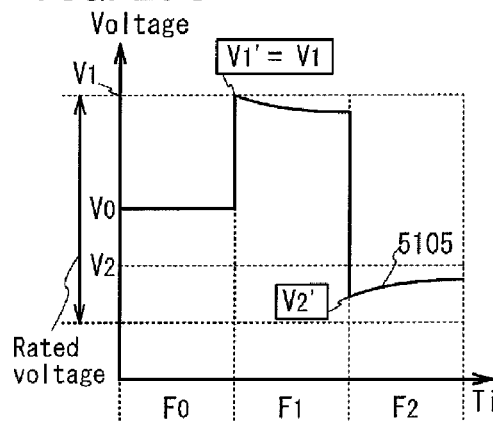
Figure 29D:
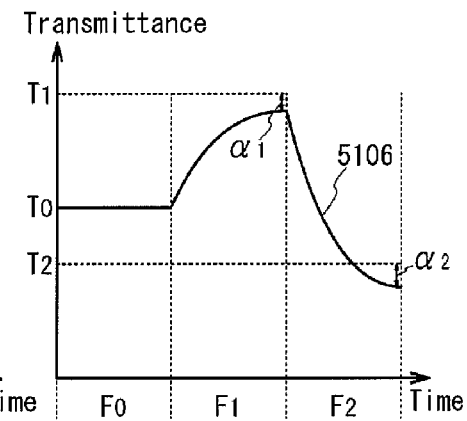
Figure 29E:
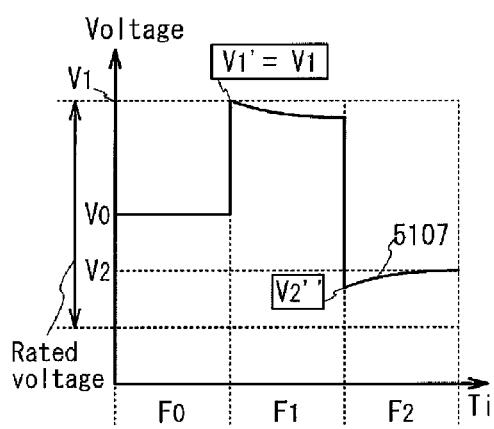
Figure 29F:
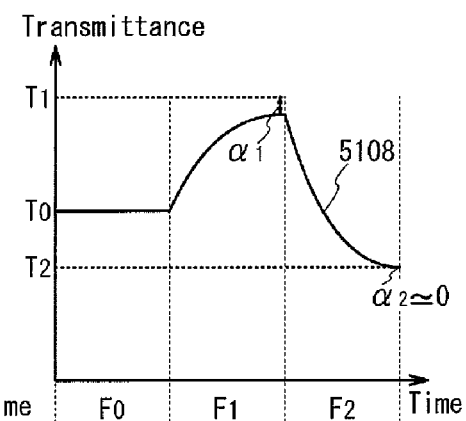

Note that there are several limitations on the actual realization of the overdriving in this embodiment as a device. For example, voltage correction should be performed in the range of the rated voltage of a source driver. That is, if a desired voltage is originally high and an ideal correction voltage exceeds the rated voltage of the source driver, complete correction cannot be performed. Problems in such a case are described with reference to FIGS. 29C and 29D. As in FIG. 29A, FIG. 29C is a graph in which change over time in voltage in one liquid crystal element is schematically illustrated as a solid line 5105 with the time as the horizontal axis and the voltage as the vertical axis. As in FIG. 29B, FIG. 29D is a graph in which change over time in transmittance of one liquid crystal element is schematically illustrated as a solid line 5106 with the time as the horizontal axis and the transmittance as the vertical axis. Note that other references are similar to those in FIGS. 29A and 29B; therefore, the description is not repeated. FIGS. 29C and 29D illustrate a state where sufficient correction is not performed because the correction voltage $V_1'$ for realizing the desired transmittance $T_1$ in the retention period $F_1$ exceeds the rated voltage of the source driver, and thus $V_1' = V_1$ has to be given. At that time, the transmittance at the end of the retention period $F_1$ is deviated from the desired transmittance $T_1$ by the error $\alpha_1$. Note that the error $\alpha_1$ is increased only when the desired voltage is originally high; therefore, degradation of image quality due to occurrence of the error $\alpha_1$ is often in the allowable range. However, as the error $\alpha_1$ is increased, an error in the algorithm for voltage correction is also increased. In other words, in the algorithm for voltage correction, when it is assumed that the desired transmittance is obtained at the end of the retention period, even though the error $\alpha_1$ is increased, the voltage correction is performed on the basis that the error $\alpha_1$ is small. Accordingly, the error is included in the correction in the next retention period $F_2$, and thus, an error $\alpha_2$ is also increased. Moreover, when the error $\alpha_2$ is increased, the following error $\alpha_3$ is further increased, and the error is increased in a chain reaction manner, resulting in significant degradation of image quality. In the overdriving in this embodiment, in order to prevent the increase of errors in such a chain reaction manner, when the correction voltage $V_i'$ exceeds the rated voltage of the source driver in the retention period $F_i$, an error $\alpha_i$ at the end of the retention period $F_i$ is assumed, and the correction voltage in a retention period $F_{i+1}$ can be adjusted in consideration of the amount of the error $\alpha_i$. Accordingly, even when the error $\alpha_i$ is increased, the adverse effect of the error $\alpha_i$ on the error $\alpha_{i+1}$ can be minimized, whereby the increase of errors in a chain reaction manner can be prevented. An example where the error $\alpha_2$ is minimized in the overdriving in this embodiment is described with reference to FIGS. 29E and 29F. In a graph of FIG. 29E, a solid line 5107 represents change over time in voltage in the case where the correction voltage $V_2'$ in the graph of FIG. 29C is further adjusted to be a correction voltage $V_2''$. A graph of FIG. 29F illustrates change over time in transmittance in the case where a voltage is corrected in accordance with the graph of FIG. 29E. The solid line 5106 in the graph of FIG. 29D indicates that excessive correction (i.e., correction in a situation where an error is large) is caused by the correction voltage $V_2'$. On the other hand, a solid line 5108 in the graph of FIG. 29F indicates that excessive correction is suppressed by the correction voltage $V_2''$, which is adjusted in consideration of the error $\alpha_1$, and the error $\alpha_2$ is minimized. A specific correction value can be derived by measuring response characteristics of the liquid crystal element in advance. As a method for realizing the overdriving in the device, a method in which a correction formula is formulated and included in a logic circuit, a method in which a correction value is stored in a memory as a lookup table and read as necessary, or the like can be used. Moreover, such a method can be added separately from a portion for calculating a correction voltage $V_i'$ or included in the portion for calculating the correction voltage $V_i'$. Note that the amount of correction of a correction voltage $V_i''$ which is adjusted in consideration of an error $\alpha_{i-1}$ (the difference with the desired voltage $V_i$) is preferably smaller than that of $V_i'$. That is, $|V_i'' - V_i| < |V_i' - V_i|$ is preferable.

Note that the error $\alpha_i$ which is caused because an ideal correction voltage exceeds the rated voltage of the source driver is increased as a signal writing cycle is shorter. This is because the response time of the liquid crystal element needs to be shorter as the signal writing cycle is shorter, and thus, the higher correction voltage is necessary. Further, as a result of increasing the correction voltage needed, the correction voltage exceeds the rated voltage of the source driver more frequently, whereby large errors $\alpha_i$ occur more frequently. Thus, the overdriving in this embodiment is more effective in the case where the signal writing cycle is shorter. Specifically, the overdriving in this embodiment is significantly effective in the case of performing the following driving methods, for example: the case where one original image is divided into a plurality of subimages and the plurality of subimages are sequentially displayed in one frame period, the case where motion of a plurality of images is detected and an intermediate image of the plurality of images is generated and interpolated between the plurality of images (so-called motion compensation frame rate conversion), and the case where such driving methods are combined.

Note that a rated voltage of the source driver has the lower limit in addition to the upper limit described above. An example of the lower limit is the case where a voltage lower than the voltage 0 cannot be applied. At that time, since an ideal correction voltage cannot be applied as in the case of the upper limit described above, the error $\alpha_i$ is increased. However, in that case also, the error $\alpha_i$ at the end of the retention period $F_i$ is assumed, and the correction voltage in the retention period $F_{i+1}$ can be adjusted in consideration of the amount of the error $\alpha_i$ in a similar manner as the above method. Note that when a voltage (a negative voltage) lower than the voltage 0 can be applied as a rated voltage of the source driver, the negative voltage may be applied to the liquid crystal element as a correction voltage. Accordingly, the voltage applied to the liquid crystal element at the end of retention period $F_i$ can be adjusted to be close to the desired voltage $V_i$ in anticipation of change in potential due to a constant charge state.

In addition, in order to suppress degradation of the liquid crystal element, so-called inversion driving in which the polarity of a voltage applied to the liquid crystal element is periodically reversed can be performed in combination with the overdriving. That is, the overdriving in this embodiment includes, in its category, the case where the overdriving is performed at the same time as the inversion driving. For example, in the case where the length of the signal writing cycle is ½ of that of the input image signal cycle $T_{in}$, when the length of a cycle for reversing the polarity is approximately the same as that of the input image signal cycle $T_{in}$, two sets of writing of a positive signal and two sets of writing of a negative signal are alternately performed. The length of the cycle for reversing the polarity is made larger than that of the signal writing cycle in such a manner, whereby the frequency of charge and discharge of a pixel can be reduced, so that power consumption can be reduced. Note that when the cycle for reversing the polarity is made too long, a defect sometimes occurs in which luminance difference due to the difference of polarity is recognized as a flicker; therefore, it is preferable that the length of the cycle for reversing the polarity be substantially the same as or smaller than that of the input image signal cycle $T_{in}$.

EMBODIMENT 10

Next, another structure example and a driving method of a display device will be described. In this embodiment, a method will be described by which an image that compensates motion of an image (an input image) which is input from the outside of a display device is generated inside the display device on the basis of a plurality of input images and the generated image (the generation image) and the input image are sequentially displayed. Note that when an image for interpolating motion of an input image is a generation image, motion of moving images can be made smooth, and decrease in quality of moving images because of afterimages or the like due to hold driving can be suppressed. Here, moving image interpolation is described below. Ideally, display of moving images is realized by controlling the luminance of each pixel in real time; however, individual control of pixels in real time has problems such as the enormous number of control circuits, space for wirings, and the enormous amount of input image data. Thus, it is difficult to realize the individual control of pixels. Therefore, for display of moving images by a display device, a plurality of still images are sequentially displayed in a certain cycle so that display appears to be moving images. The cycle (in this embodiment, referred to as an input image signal cycle and denoted by $T_{in}$) is standardized, and for example, ⅟60 second in NTSC and ⅟50 second in PAL. Such a cycle does not cause a problem of moving image display in a CRT, which is an impulsive display device. However, in a hold-type display device, when moving images conforming to these standards are displayed without change, a defect (hold blur) in which display is blurred because of afterimages or the like due to hold driving occurs. Since hold blur is recognized by discrepancy between unconscious motion interpolation due to human eye tracking and hold-type display, the hold blur can be reduced by making the input image signal cycle shorter than that in conventional standards (by making the control closer to individual control of pixels in real time). However, it is difficult to reduce the length of the input image signal cycle because the standard needs to be changed and the amount of data is increased. However, when an image for interpolating motion of an input image is generated inside the display device on the basis of a standardized input image signal and display is performed while the generation image interpolates the input image, hold blur can be reduced without change in the standard or increase in the amount of data. Operation such that an image signal is generated inside the display device on the basis of an input image signal to interpolate motion of the input image is referred to as moving image interpolation.

Figure 30A:
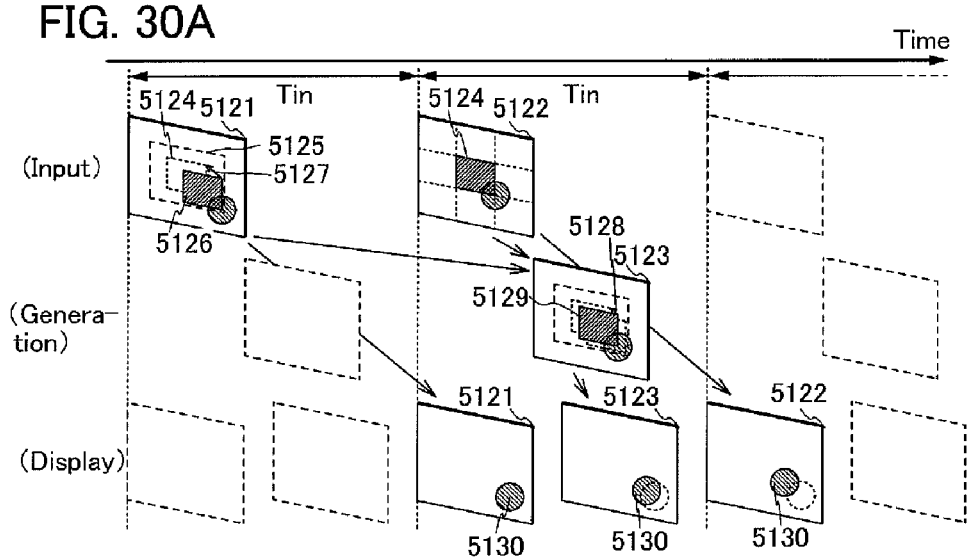
FIGS. 30A to 30C each illustrate a semiconductor device.
Figure 30B:
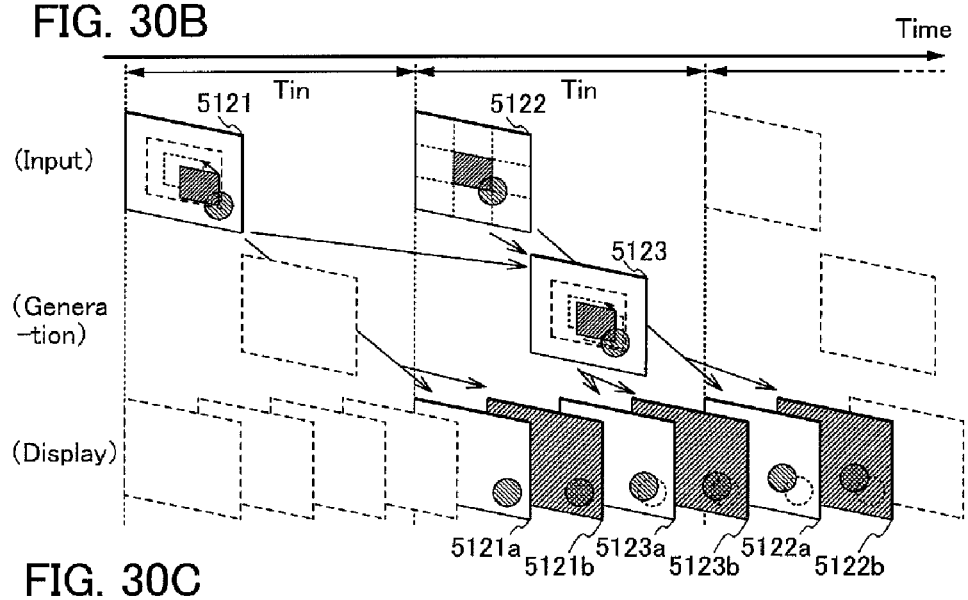

By a method for interpolating moving images in this embodiment, motion blur can be reduced. The method for interpolating moving images in this embodiment can include an image generation method and an image display method. Further, by using a different image generation method and/or a different image display method for motion with a specific pattern, motion blur can be effectively reduced. FIGS. 30A and 30B are schematic diagrams each illustrating an example of a method for interpolating moving images in this embodiment. FIGS. 30A and 30B each illustrate timing of treating each image by using the position of the horizontal direction, with the time as the horizontal axis. A portion represented as "input" indicates timing at which an input image signal is input. Here, images 5121 and 5122 are focused as two images that are temporally adjacent to each other. An input image is input at an interval of the cycle $T_{in}$. Note that the length of one cycle $T_{in}$ is referred to as one frame or one frame period in some cases. A portion represented as "generation" indicates timing at which a new image is generated from an input image signal. Here, an image 5123 which is a generation image generated on the basis of the images 5121 and 5122 is focused. A portion represented as "display" indicates timing at which an image is displayed in the display device. Note that images other than the focused images are only represented by dashed lines, and by treating such images in a manner similar to that of the focused images, the example of the method for interpolating moving images in this embodiment can be realized.

In the example of the method for interpolating moving images in this embodiment, as illustrated in FIG. 30A, a generation image which is generated on the basis of two input images that are temporally adjacent is displayed in a period after one image is displayed until the other image is displayed, so that moving image interpolation can be performed. In this case, a display cycle of a display image is preferably half of an input cycle of the input image. Note that the display cycle is not limited to this and can be a variety of display cycles. For example, when the length of the display cycle is smaller than half of that of the input cycle, moving images can be displayed more smoothly. Alternatively, when the length of the display cycle is larger than half of that of the input cycle, power consumption can be reduced. Note that here, an image is generated on the basis of two input images which are temporally adjacent; however, the number of input images to be used is not limited to two and can be other numbers. For example, when an image is generated on the basis of three (or more than three) input images which are temporally adjacent, a generation image with higher accuracy can be obtained as compared to the case where an image is generated on the basis of two input images. Note that the display timing of the image 5121 is the same as the input timing of the image 5122, that is, the display timing is one frame later than the input timing. However, the display timing in the method for interpolating moving images in this embodiment is not limited to this and can be a variety of display timings. For example, the display timing can be delayed with respect to the input timing by more than one frame. Thus, the display timing of the image 5123 which is the generation image can be delayed, which allows enough time to generate the image 5123 and leads to reduction in power consumption and manufacturing cost. Note that when the display timing is significantly delayed with respect to the input timing, a period for holding an input image becomes longer, and the memory capacity for holding the input image is increased. Therefore, the display timing is preferably delayed with respect to the input timing by approximately one to two frames.

Here, an example of a specific generation method of the image 5123, which is generated on the basis of the images 5121 and 5122, is described. It is necessary to detect motion of an input image in order to interpolate moving images. In this embodiment, a method called a block matching method can be used in order to detect motion of an input image. Note that this embodiment is not limited to this, and a variety of methods (e.g., a method for obtaining a difference of image data or a method using Fourier transformation) can be used. In the block matching method, first, image data for one input image (here, image data of the image 5121) is stored in a data storage means (e.g., a memory circuit such as a semiconductor memory or a RAM). Then, an image in the next frame (here, the image 5122) is divided into a plurality of regions. Note that the divided regions can have the same rectangular shapes as illustrated in FIG. 30A; however, the divided regions are not limited to them and can have a variety of shapes (e.g., the shape or size varies depending on images). After that, in each divided region, data is compared to the image data in the previous frame (here, the image data of the image 5121), which is stored in the data storage means, so that a region where the image data is similar to each other is searched. FIG. 30A illustrates an example in which the image 5121 is searched for a region where data is similar to that of a region 5124 in the image 5122, and a region 5126 is found. Note that a search range is preferably limited when the image 5121 is searched. In the example of FIG. 30A, a region 5125 which is approximately four times as large as the region 5124 is set as the search range. By making the search range larger than this, detection accuracy can be increased even in a moving image with high-speed motion. Note that search in an excessively wide range needs an enormous amount of time, which makes it difficult to realize detection of motion. Thus, the region 5125 is preferably approximately two to six times as large as the area of the region 5124. After that, a difference of the position between the searched region 5126 and the region 5124 in the image 5122 is obtained as a motion vector 5127. The motion vector 5127 represents motion of image data in the region 5124 in one frame period. Then, in order to generate an image showing the intermediate state of motion, an image generation vector 5128 obtained by changing the size of the motion vector without change in the direction thereof is generated, and image data included in the region 5126 of the image 5121 is moved in accordance with the image generation vector 5128, so that image data in a region 5129 of the image 5123 is generated. By performing a series of processings on the entire region of the image 5122, the image 5123 can be generated. Then, by sequentially displaying the input image 5121, the generation image 5123, and the input image 5122, moving images can be interpolated. Note that the position of an object 5130 in the image is different (i.e., the object is moved) between the images 5121 and 5122. In the generated image 5123, the object is located at the midpoint between the object in the image 5121 and the object in the image 5122. By displaying such images, motion of moving images can be made smooth, and blur of moving images due to afterimages or the like can be reduced.

Note that the size of the image generation vector 5128 can be determined in accordance with the display timing of the image 5123. In the example of FIG. 30A, since the display timing of the image 5123 is the midpoint (½) between the display timings of the images 5121 and 5122, the size of the image generation vector 5128 is half of that of the motion vector 5127. Alternatively, for example, when the display timing is ⅓ between the display timings of the images 5121 and 5122, the size of the image generation vector 5128 can be ⅓; when the display timing is ⅔ between the display timings of the images 5121 and 5122, the size of the image generation vector 5128 can be ⅔.

Note that in the case where a new image is generated by moving a plurality of regions having different motion vectors in this manner, a portion where one region has already been moved to a region that is a destination for another region or a portion to which any region is not moved is generated in some cases (i.e., overlap or blank occurs in some cases). For such portions, data can be compensated. As a method for compensating an overlap portion, a method by which overlap data is averaged; a method by which data are arranged in order of priority according to the direction of motion vectors or the like, and high-priority data is used as data in a generation image; or a method by which one of color and brightness is arranged in order of priority and the other thereof is averaged can be used, for example. As a method for compensating a blank portion, a method by which image data of the portion of the image 5121 or the image 5122 is used as data in a generation image without modification, a method by which image data of the portion of the image 5121 or the image 5122 is averaged, or the like can be used. Then, the generated image 5123 is displayed at the timing in accordance with the size of the image generation vector 5128, so that motion of moving images can be made smooth, and the decrease in quality of moving images because of afterimages or the like due to hold driving can be suppressed.

In another example of the method for interpolating moving images in this embodiment, as illustrated in FIG. 30B, when a generation image which is generated on the basis of two input images that are temporally adjacent is displayed in a period after one image is displayed until the other image is displayed, each display image is divided into a plurality of subimages to be displayed. Thus, moving images can be interpolated. This case can have advantages of displaying a dark image at regular intervals (advantages of making a display method closer to impulsive display) in addition to advantages of a shorter image display cycle. In other words, blur of moving images due to afterimages or the like can be further reduced as compared to the case where the length of the image display cycle is just made to half of that of the image input cycle. In the example of FIG. 30B, "input" and "generation" can be similar to the processing in the example of FIG. 30A; therefore, the description thereof is not repeated. For "display" in the example of FIG. 30B, one input image and/or one generation image can be divided into a plurality of subimages to be displayed. Specifically, as illustrated in FIG. 30B, the image 5121 is divided into subimages 5121a and 5121b and the subimages 5121a and 5121b are sequentially displayed so as to make human eyes perceive that the image 5121 is displayed; the image 5123 is divided into subimages 5123a and 5123b and the subimages 5123a and 51236 are sequentially displayed so as to make human eyes perceive that the image 5123 is displayed; and the image 5122 is divided into subimages 5122a and 5122b and the subimages 5122a and 51226 are sequentially displayed so as to make human eyes perceive that the image 5122 is displayed. That is, the display method can be made closer to impulsive display while the images perceived by human eyes are similar to those in the example of FIG. 30A, so that blur of moving images due to afterimages or the like can be further reduced. Note that the number of division of subimages is two in FIG. 30B; however, the number of division of subimages is not limited to this and can be other numbers. Note that subimages are displayed at regular intervals (½) in FIG. 30B; however, timing of displaying subimages is not limited to this and can be a variety of timings. For example, when timing of displaying dark subimages (5121*b*, 5122*b*, and 5123*b*) is made earlier (specifically, timing at ¼ to ½), the display method can be made much closer to impulsive display, so that blur of moving images due to afterimages or the like can be further reduced. Alternatively, when the timing of displaying the dark subimages is delayed (specifically, timing at ½ to ¾), the length of a period for displaying a bright image can be increased, so that the display efficiency can be increased and power consumption can be reduced.

Figure 30C:
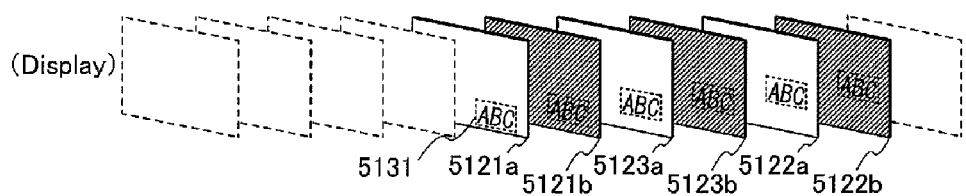

Another example of the method for interpolating moving images in this embodiment is an example in which the shape of an object which is moved in an image is detected and different processings are performed depending on the shape of the moving object. FIG. 30C shows display timing as in the example of FIG. 30B and illustrates the case where moving letters (also referred to as scrolling texts, subtitles, captions, or the like) are displayed. Note that since "input" and "generation" may be similar to those in FIG. 30B, they are not illustrated in FIG. 30C. The amount of blur of moving images by hold driving varies depending on properties of a moving object in some cases. In particular, blur is often recognized remarkably when letters are moved. This is because eyes track moving letters to read the letters, so that hold blur is likely to occur. Further, since letters often have clear outlines, blur due to hold blur is further emphasized in some cases. That is, determining whether an object which is moved in an image is a letter and performing special processing when the object is the letter are effective in reducing hold blur. Specifically, when edge detection, pattern detection, and/or the like are/is performed on an object which is moved in an image and the object is determined to be a letter, motion compensation is performed even on subimages generated by division of one image so that an intermediate state of motion is displayed. Thus, motion can be made smooth. In the case where the object is determined not to be a letter, when subimages are generated by division of one image as illustrated in FIG. 30B, the subimages can be displayed without change in the position of the moving object. FIG. 30C illustrates the example in which a region 5131 which is determined to be letters is moved upward, and the position of the region 5131 is different between the images 5121*a* and 5121*b*. Similarly, the position of the region 5131 is different between the images 5123*a* and 5123*b*, and between the images 5122*a* and 5122*b*. Accordingly, motion of letters for which hold blur is particularly easily recognized can be made smoother than that by normal motion compensation frame rate doubling, so that blur of moving images due to afterimages or the like can be further reduced.

EMBODIMENT 11

The semiconductor device can be applied to a variety of electronic devices (including amusement machines). Examples of electronic devices are television sets (also referred to as televisions or television receivers), monitors for computers and the like, cameras such as digital cameras and digital video cameras, digital photo frames, mobile phone devices (also referred to as mobile phones or cellular phones), portable game machines, portable information terminals, sound reproducing devices, and large game machines such as pachinko machines.

Figure 24A:
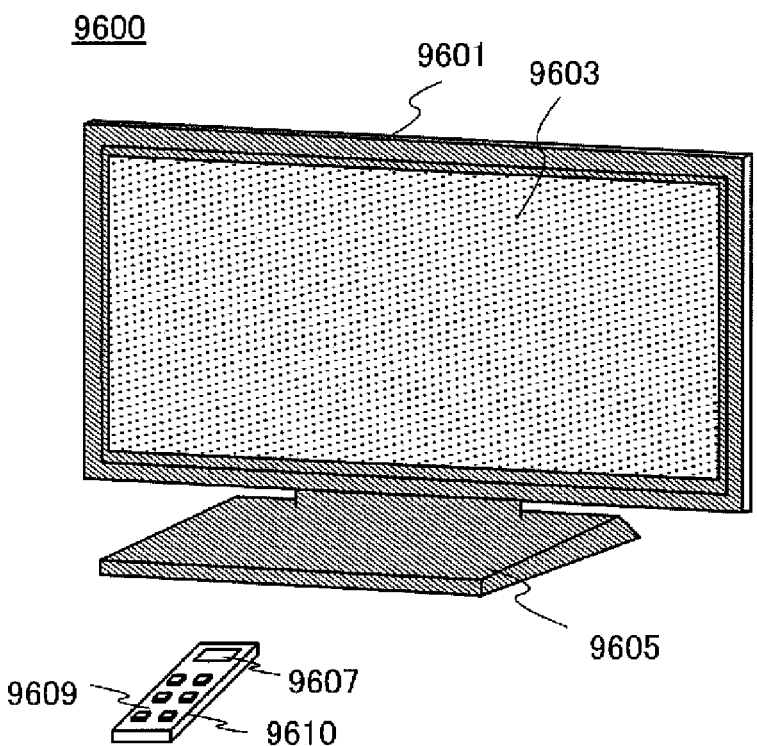
FIGS. 24A and 24B are external views illustrating examples of a television set and a digital photo frame, respectively.

FIG. 24A illustrates a television set 9600. In the television set 9600, a display portion 9603 is incorporated into a housing 9601. The display portion 9603 can display an image. Further, the housing 9601 is supported by a stand 9605 here.

The television set 9600 can be operated with an operation switch of the housing 9601 or a separate remote controller 9610. With an operation key 9609 of the remote controller 9610, channels and volume can be controlled and an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, general TV broadcasts can be received. Further, when the television set 9600 is connected to a communication network with or without wires via the modem, one-way (from a transmitter to a receiver) or two-way (between a transmitter and a receiver or between receivers) data communication can be performed.

Figure 24B:
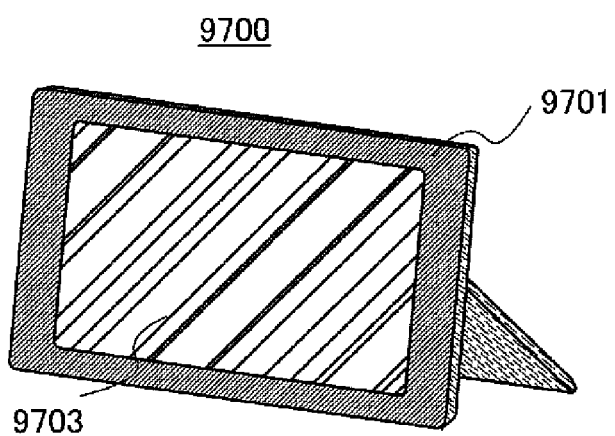

FIG. 24B illustrates a digital photo frame 9700. For example, in the digital photo frame 9700, a display portion 9703 is incorporated into a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection terminal (e.g., a USB terminal or a terminal connectable to a variety of cables such as a USB cable), a recording medium insertion portion, and the like. Although these components may be provided on the surface on which the display portion is provided, it is preferable to provide them on the side surface or the rear surface for the design of the digital photo frame 9700. For example, a memory that stores data of an image taken with a digital camera is inserted in the recording medium insertion portion of the digital photo frame, and the image data is loaded, whereby the image can be displayed on the display portion 9703.

The digital photo frame 9700 may be configured to transmit and receive data wirelessly. Through wireless communication, desired image data can be loaded to be displayed.

Figure 25A:
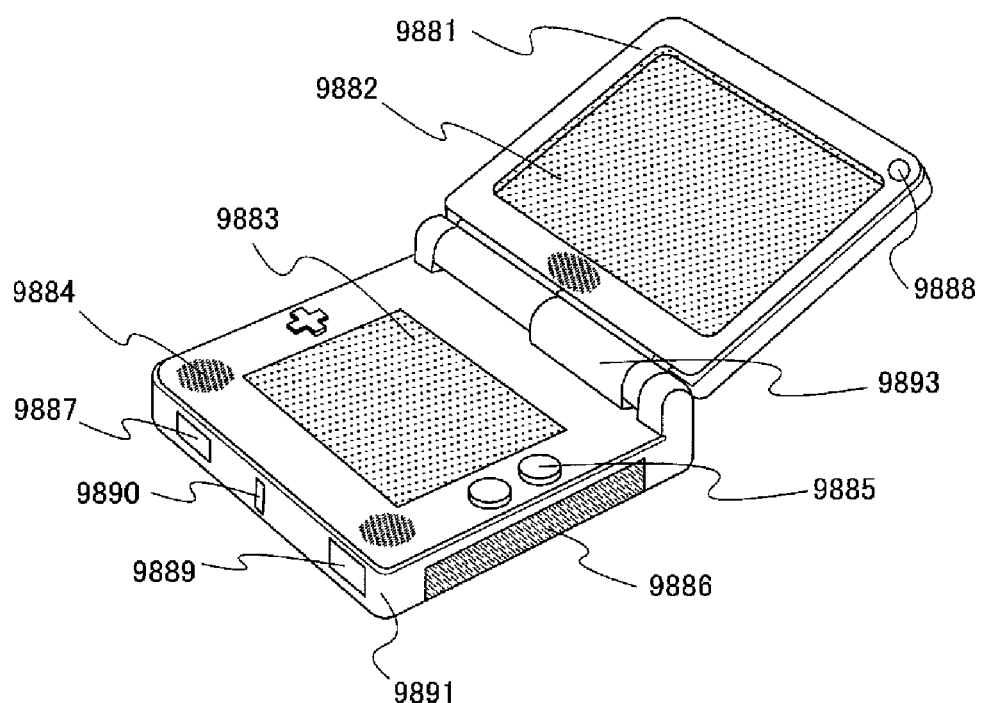
FIGS. 25A and 25B are external views each illustrating an example of an amusement machine.

FIG. 25A illustrates a portable game machine including two housings of a housing 9881 and a housing 9891. The housings 9881 and 9891 are connected with a joint portion 9893 so that the portable game machine can be opened or folded. A display portion 9882 is incorporated into the housing 9881, and a display portion 9883 is incorporated into the housing 9891. Moreover, the portable game machine illustrated in FIG. 25A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable game machine is not limited to that described above. The portable game machine can include an additional accessory as appropriate as long as it includes at least the semiconductor device. The portable game machine in FIG. 25A has a function of reading a program or data stored in a recording medium to display it on the display portion, and a function of sharing information with another portable game machine by wireless communication. Note that a function of the portable game machine in FIG. 25A is not limited to those described above, and the portable game machine can have a variety of functions.

Figure 25B:
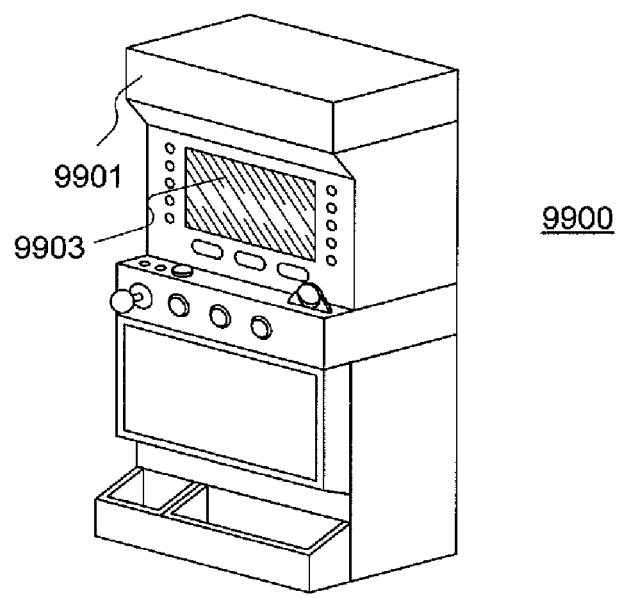

FIG. 25B illustrates a slot machine 9900, which is a large amusement machine. In the slot machine 9900, a display portion 9903 is incorporated into a housing 9901. Moreover, the slot machine 9900 is provided with operation means such as a start lever and a stop switch, a coin slot, a speaker, and the like. Needless to say, the structure of the slot machine 9900 is not limited to the above structure. The slot machine can include additional accessory equipment as appropriate as long as at least the semiconductor device is provided.

Figure 26A:
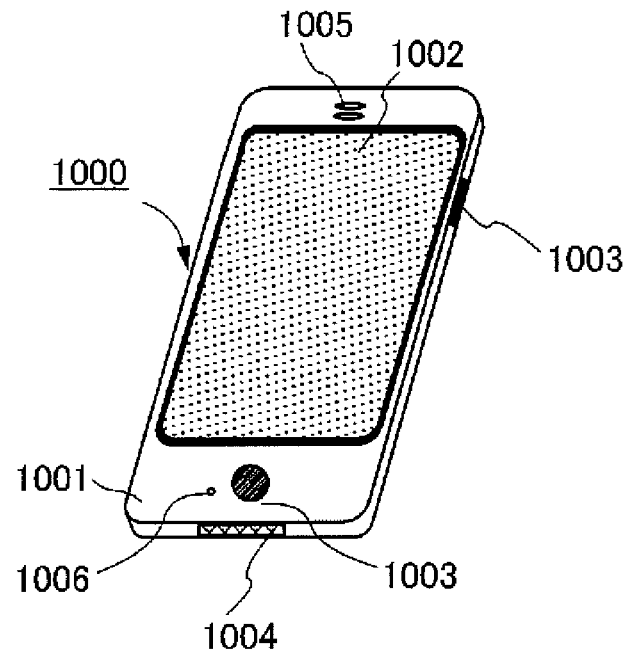
FIGS. 26A and 26B are external views each illustrating an example of a mobile phone.

FIG. 26A illustrates a mobile phone 1000. The mobile phone 1000 is provided with a display portion 1002 incorporated into a housing 1001, an operation button 1003, an external connection port 1004, a speaker 1005, a microphone 1006, and the like.

When the display portion 1002 of the mobile phone 1000 in FIG. 26A is touched with a finger or the like, data can be input into the mobile phone 1000. Further, operation such as making calls and texting can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode, which is a combination of the two modes, that is, a combination of the display mode and the input mode.

For example, in the case of making a call or texting, a text input mode mainly for inputting text is selected for the display portion 1002 so that letters displayed on a screen can be input. In that case, it is preferable to display a keyboard or number buttons on most of the screen of the display portion 1002.

When a detection device including a sensor for detecting inclination, such as a gyroscope or an acceleration sensor, is provided inside the mobile phone 1000, display on the screen of the display portion 1002 can be automatically changed by determining the orientation of the mobile phone 1000 (whether the mobile phone 1000 stands upright or is laid down on its side).

The screen modes are changed by touching the display portion 1002 or using the operation buttons 1003 of the housing 1001. Alternatively, the screen modes may be changed depending on the kind of image displayed on the display portion 1002. For example, when a signal of an image displayed on the display portion is data of moving images, the screen mode is changed to the display mode. When the signal is text data, the screen mode is changed to the input mode.

Further, in the input mode, when input by touching the display portion 1002 is not performed for a certain period while a signal detected by an optical sensor in the display portion 1002 is detected, the screen mode may be controlled so as to be changed from the input mode to the display mode.

The display portion 1002 can also function as an image sensor. For example, an image of a palm print, a fingerprint, or the like is taken when the display portion 1002 is touched with a palm or a finger, whereby personal identification can be performed. Further, when a backlight which emits near-infrared light or a sensing light source which emits near-infrared light is provided in the display portion, an image of a finger vein, a palm vein, or the like can be taken.

Figure 26B:
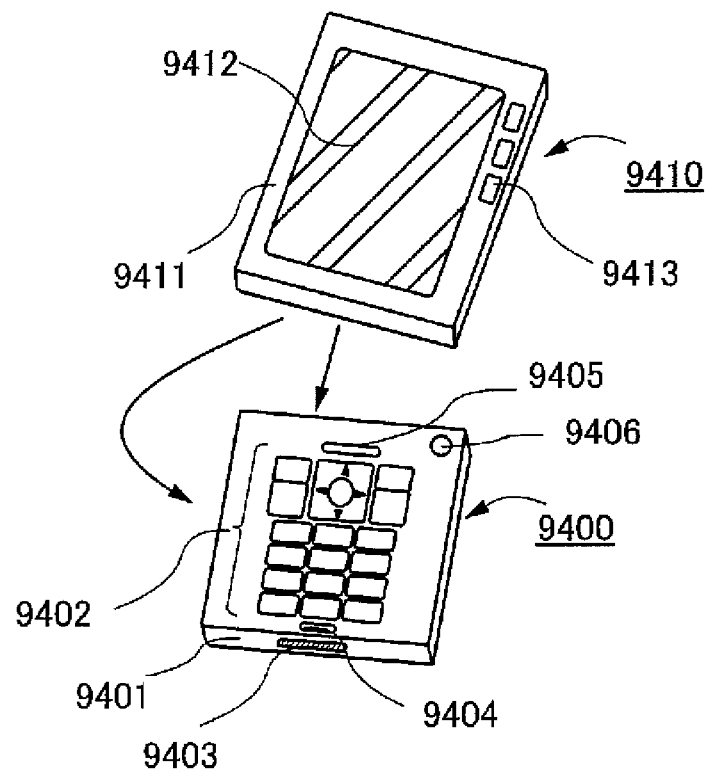

FIG. 26B illustrates another example of a mobile phone. The mobile phone in FIG. 26B includes a display device 9410 in a housing 9411, which includes a display portion 9412 and operation buttons 9413; and a communication device 9400 in a housing 9401, which includes manual operation buttons 9402, an external input terminal 9403, a microphone 9404, a speaker 9405, and a light-emitting portion 9406 that emits light when receiving a call. The display device 9410 having a display function can be detached from and attached to the communication device 9400 having a telephone function in two directions shown by arrows. Thus, short axes of the display device 9410 and the communication device 9400 can be attached to each other, or long axes of the display device 9410 and the communication device 9400 can be attached to each other. Further, when only a display function is necessary, the display device 9410 may be detached from the communication device 9400 so that the semiconductor device 9410 can be used by itself. The communication device 9400 and the display device 9410 can transmit and receive images or input information to/from each other by wireless communication or wired communication, and each of the communication device 9400 and the display device 9410 has a rechargeable battery.

Note that this embodiment can be implemented in combination with any of the other embodiments as appropriate.

EMBODIMENT 12

This embodiment shows a display device in which a light-transmitting transistor and a back gate are placed in a driver circuit portion and a light-transmitting transistor is used in a pixel. Note that a semiconductor device according to this embodiment has a lot in common with those in Embodiments 1 and 2. Therefore, in the following description, the description of the same structures, the same reference numerals, and the like are not repeated.

Figure 31A:
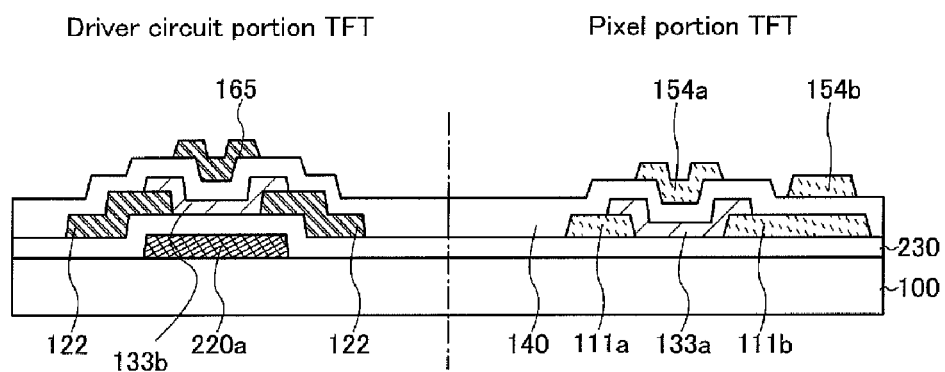
FIGS. 31A to 31C each illustrate a semiconductor device.

FIG. 31A is a cross-sectional view of a transistor in a driver circuit portion and a transistor in a pixel portion.

In FIG. 31A, first, a conductive layer 220a is formed over the substrate 100 having an insulating surface. The conductive layer 220a functions as a back gate electrode of the transistor in the driver circuit portion. By inputting a predetermined voltage to the back gate electrode, the threshold voltage of the transistor can be controlled to some extent.

When the conductive layer 220a is formed using the same material as the conductive layers 122 and 165 to be formed later, the conductive layers can easily share the material and a manufacturing apparatus, which contributes to reduction in cost, increase in throughput, and the like. Needless to say, it is not essential that the conductive layers 122, 165, and 220a be formed using the same material.

Next, an insulating layer 230 is formed so as to cover the substrate 100 and the conductive layer 220a. The insulating layer 230 is formed thin so that the distance between the conductive layer 220a and the semiconductor layer 133b to be formed later is reduced, whereby an electric field applied from the back gate to a channel of the transistor can be increased. As a result, the threshold voltage of the transistor can be easily controlled by using the back gate electrode.

Then, the transistors are formed over the insulating layer 230 as in Embodiment 1. Note that the conductive layers 111a and 111b, the conductive layers 154a and 154b, and the semiconductor layer 133a are formed using light-transmitting materials; the conductive layer 122 and the conductive layer 165 are formed using a low resistance material.

In such a manner, the transistor in the driver circuit portion is provided with the back gate electrode and the transistor in the pixel portion is formed using only light-transmitting materials, whereby the threshold voltage of the transistor in the driver circuit portion can be controlled while the aperture ratio is increased.

Figure 31B:
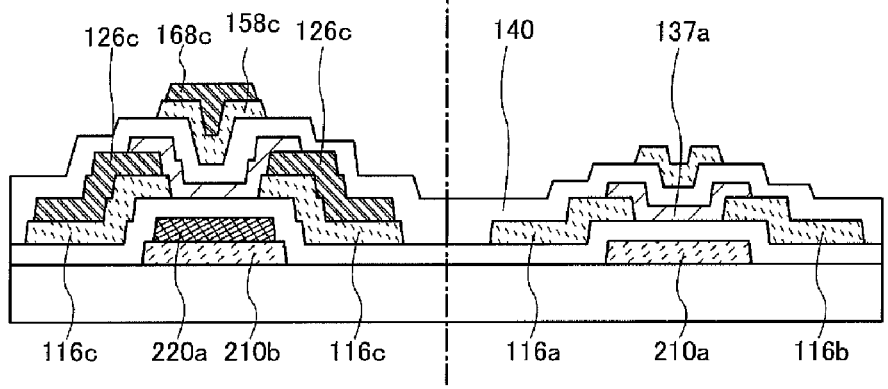

Note that also in this embodiment, a multi-tone mask can be used (see FIG. 31B). The formation method using a multi-tone mask is described in Embodiment 2.

In a structure where a multi-tone mask is used, a back gate electrode formed using a light-transmitting material can be provided for the transistor in the pixel portion. By controlling the threshold voltage of the transistor in the pixel portion with the back gate electrode, advantageous effects such as reduction in power consumption due to reduction in leakage current and improvement in display quality can be expected.

In FIGS. 31A and 31B, a capacitor can be formed using a conductive layer 210*a*, the conductive layer 220*a*, or a conductive layer 210*b*. Thus, the area of the capacitor formed in the pixel portion or the driver circuit portion can be reduced, so that the degree of freedom for the layout can be improved.

Figure 31C:
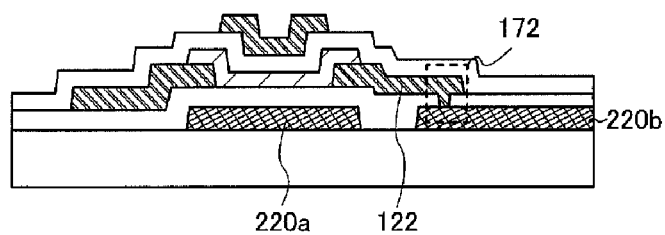

Note that as illustrated in FIG. 31C, the back gate electrode can be used as part of a wiring. In FIG. 31C, the conductive layer 122 functioning as a source electrode (or a drain electrode) of a transistor is electrically connected to a conductive layer 220*b* functioning as a wiring through a contact hole 172. Consequently, the resistance of a leading wiring in the driver circuit portion can be reduced.

Note that in the pixel portion, a gate electrode of the transistor in the driver circuit portion (i.e., the conductive layer 220*a* functioning as a wiring) can be led to be used as a light-shielding film (a black matrix). Thus, the number of steps can be reduced.

Note that the display device in the invention can be applied to a liquid crystal display device, a light-emitting display device, electronic paper, and the like.

This application is based on Japanese Patent Application serial no. 2009-184343 filed with Japan Patent Office on Aug. 7, 2009, the entire contents of which are hereby incorporated by reference.

What is claimed is:
1. A semiconductor device comprising:
a pixel portion including a first thin film transistor; and
a driver circuit portion including a second thin film transistor,
wherein the pixel portion and the driver circuit portion are formed over a substrate,
wherein the first thin film transistor includes, over the substrate:
a first source electrode layer,
a first drain electrode layer,
an oxide semiconductor layer formed so as to be electrically connected to the first source electrode layer and the first drain electrode layer,
a gate insulating layer formed so as to cover the oxide semiconductor layer,
a first gate electrode layer provided over a region of the gate insulating layer, which overlaps with the oxide semiconductor layer,
a protective insulating layer formed so as to cover the first gate electrode layer, and
a pixel electrode layer over the protective insulating layer,
wherein the first source electrode layer, the first drain electrode layer, the oxide semiconductor layer, the gate insulating layer, the first gate electrode layer, the protective insulating layer, and the pixel electrode layer of the first thin film transistor have a light-transmitting property,
wherein a second gate electrode layer of the second thin film transistor is covered with the protective insulating layer, and
wherein a material of a second source electrode layer, a second drain electrode layer, and the second gate electrode layer of the second thin film transistor is different from a material of the first source electrode layer, the first drain electrode layer, and the first gate electrode layer of the first thin film transistor, and is a conductive material with lower resistance than the first source electrode layer, the first drain electrode layer, and the first gate electrode layer of the first thin film transistor.

2. The semiconductor device according to claim 1, wherein the second gate electrode layer, the second source electrode layer, and the second drain electrode layer of the second thin film transistor are formed using a film containing an element selected from Al, Cr, Cu, Ta, Ti, Mo, and W as a main component or a stack including an alloy film containing any of these elements.

3. The semiconductor device according to claim 1, wherein the second thin film transistor includes, over the substrate, the second source electrode layer; the second drain electrode layer; the oxide semiconductor layer formed so as to be electrically connected to the second source electrode layer and the second drain electrode layer; the gate insulating layer formed so as to cover the oxide semiconductor layer; and the second gate electrode layer provided over a region of the gate insulating layer, which overlaps with the oxide semiconductor layer.

4. The semiconductor device according to claim 1, wherein each of the first source electrode layer, the first drain electrode layer, the first gate electrode layer, and the pixel electrode layer of the first thin film transistor is formed using a film formed using any of indium oxide, an alloy of indium oxide and tin oxide, an alloy of indium oxide and zinc oxide, and zinc oxide; or a stack including any of the films in combination.

5. The semiconductor device according to claim 1, further comprising a capacitor portion over the substrate,
wherein the capacitor portion includes a capacitor wiring and a capacitor electrode overlapping with the capacitor wiring, and
wherein the capacitor wiring and the capacitor electrode have a light-transmitting property.

6. The semiconductor device according to claim 1, wherein the second thin film transistor has a back gate.

7. A semiconductor device comprising:
a pixel portion including a first thin film transistor; and
a driver circuit portion including a second thin film transistor,
wherein the pixel portion and the driver circuit portion are formed over a substrate,
wherein the first thin film transistor includes, over the substrate:
a first source electrode layer,
a first drain electrode layer,
an oxide semiconductor layer formed so as to be electrically connected to the first source electrode layer and the first drain electrode layer,
a gate insulating layer formed so as to cover the oxide semiconductor layer,
a first gate electrode layer provided over a region of the gate insulating layer, which overlaps with the oxide semiconductor layer,
a protective insulating layer formed so as to cover the first gate electrode layer, and a pixel electrode layer over the protective insulating layer, wherein the first source electrode layer, the first drain electrode layer, the oxide semiconductor layer, the gate insulating layer, the first gate electrode layer, the protective insulating layer, and the pixel electrode layer of the first thin film transistor have a light-transmitting property, wherein a second gate electrode layer of the second thin film transistor is covered with the protective insulating layer, and wherein a second source electrode layer, a second drain electrode layer, and the second gate electrode layer of the second thin film transistor are formed using a stack of a film containing the same material as the first source electrode layer, the first drain electrode layer, and the first gate electrode layer of the first thin film transistor; and a film containing a conductive material with lower resistance than the first source electrode layer, the first drain electrode layer, and the first gate electrode layer of the first thin film transistor.

8. The semiconductor device according to claim 7, wherein the film containing the conductive material with the lower resistance than the first source electrode layer, the first drain electrode layer, and the first gate electrode layer of the first thin film transistor is a film containing an element selected from Al, Cr, Cu, Ta, Ti, Mo, and W as a main component or a stack including an alloy film containing any of these elements.

9. The semiconductor device according to claim 7, wherein the second thin film transistor includes, over the substrate, the second source electrode layer; the second drain electrode layer; the oxide semiconductor layer formed so as to be electrically connected to the second source electrode layer and the second drain electrode layer; the gate insulating layer formed so as to cover the oxide semiconductor layer; and the second gate electrode layer provided over a region of the gate insulating layer, which overlaps with the oxide semiconductor layer.

10. The semiconductor device according to claim 7, wherein each of the first source electrode layer, the first drain electrode layer, the first gate electrode layer, and the pixel electrode layer of the first thin film transistor is formed using a film formed using any of indium oxide, an alloy of indium oxide and tin oxide, an alloy of indium oxide and zinc oxide, and zinc oxide; or a stack including any of the films in combination.

11. The semiconductor device according to claim 7, further comprising a capacitor portion over the substrate, wherein the capacitor portion includes a capacitor wiring and a capacitor electrode overlapping with the capacitor wiring, and wherein the capacitor wiring and the capacitor electrode have a light-transmitting property.

12. The semiconductor device according to claim 7, wherein the second thin film transistor has a back gate.

* * * * *

UNITED STATES PATENT AND TRADEMARK OFFICE
CERTIFICATE OF CORRECTION

PATENT NO. : 8,384,085 B2
APPLICATION NO. : 12/851097
DATED : February 26, 2013
INVENTOR(S) : Hajime Kimura et al.

Page 1 of 1

It is certified that error appears in the above-identified patent and that said Letters Patent is hereby corrected as shown below:

In the Specification

Column 20, line 10, replace "1046" with --104b--;

Column 24, line 61, replace "tight-shielding" with --light-shielding--;

Column 25, line 17, replace "1266" with --126b--;

Column 27, line 34, replace "1166" with --116b--;

Column 32, line 61, replace "n-electron" with --π-electron--;

Column 45, line 11, replace "manlier" with --manner--;

Column 54, line 63, replace "51236" with --5123b--;

Column 54, line 66, replace "51226" with --5122b--;

Column 55, line 54, replace "51236" with --5123b--.

Signed and Sealed this
Fifteenth Day of October, 2013

Teresa Stanek Rea
*Deputy Director of the United States Patent and Trademark Office*